US012672506B2

(12) United States Patent
Sekiya

(10) Patent No.: US 12,672,506 B2
(45) Date of Patent: Jun. 30, 2026

(54) CUTTING APPARATUS, TRAY, AND TRANSPORT SYSTEM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 1027 days.

(21) Appl. No.: 17/218,593

(22) Filed: Mar. 31, 2021

(65) Prior Publication Data

US 2021/0316411 A1 Oct. 14, 2021

(30) Foreign Application Priority Data

Apr. 8, 2020 (JP) ................................. 2020-069936

(51) Int. Cl.
| | |
|---|---|
| *B28D 5/02* | (2006.01) |
| *B23Q 5/22* | (2006.01) |
| *B28D 5/00* | (2006.01) |
| *H10P 72/00* | (2026.01) |
| *H10P 72/30* | (2026.01) |
| *H10P 72/78* | (2026.01) |

(52) U.S. Cl.
CPC ............ *H10P 72/0428* (2026.01); *B23Q 5/22* (2013.01); *B28D 5/0082* (2013.01); *B28D 5/0094* (2013.01); *B28D 5/022* (2013.01); *H10P 72/3402* (2026.01); *H10P 72/78* (2026.01)

(58) Field of Classification Search
CPC ......... H01L 21/67092; H01L 21/67715; H01L 21/67736; B28D 5/0082; B28D 5/022; B28D 5/0094; B28D 5/0064; B23Q 5/22
See application file for complete search history.

(56) References Cited

U.S. PATENT DOCUMENTS

| | | | | |
|---|---|---|---|---|
| 11,285,578 B2 * | 3/2022 | Genozono | ............... | B24B 49/04 |
| 11,318,573 B2 * | 5/2022 | Terada | ............... | B23Q 3/15773 |
| 2014/0243176 A1 * | 8/2014 | Kosonen | .............. | B23Q 3/1554 |
| | | | | 483/1 |

FOREIGN PATENT DOCUMENTS

| | | | |
|---|---|---|---|
| JP | 2011016175 A | 1/2011 | |
| JP | 2013120794 A | 6/2013 | |
| JP | 2017103274 A * | 6/2017 | ........... B28D 5/0076 |
| JP | 2019201145 A | 11/2019 | |
| JP | 2019204929 A | 11/2019 | |
| JP | 2020013892 A | 1/2020 | |

OTHER PUBLICATIONS

JP2013120794A English translation; Arai, Yisuke; Dec. 6, 2011.*

* cited by examiner

*Primary Examiner* — Laura M Lee
(74) *Attorney, Agent, or Firm* — GREER BURNS & CRAIN, LTD.

(57) ABSTRACT

A cutting apparatus includes a chuck table having a holding surface used for holding either a workpiece unit that includes a plate-shaped workpiece supported on an annular frame by a tape or a tray shaped similarly to the annular frame, a rest area used for placing a receptacle that houses the workpiece unit or the tray, a transport unit configured to transport the workpiece unit or the tray between the rest area and the chuck table, the transport unit having a holding pad that holds the workpiece unit or the tray, a sub-chuck table that is disposed sideways of the chuck table and has a holding surface used for holding a board for use in adjusting a cutting unit, and a board transport unit configured to transport the board between the tray held on the chuck table and the sub-chuck table.

9 Claims, 35 Drawing Sheets

CUTTING APPARATUS, TRAY, AND TRANSPORT SYSTEM

BACKGROUND OF THE INVENTION

Field of the Invention

The present invention relates to a cutting apparatus for use in processing a plate-shaped workpiece, a tray for use in the cutting apparatus, and a transport system for use in transporting a workpiece to the cutting apparatus.

Description of the Related Art

For dividing a plate-shaped workpiece typified by a semiconductor wafer into a plurality of chips, there is used a cutting apparatus having an annular cutting blade installed thereon for cutting the workpiece held on a chuck table, for example. The cutting apparatus operates by moving the cutting blade and the workpiece relatively to each other along a path while causing the cutting blade that is being rotated at a high speed to cut into the workpiece, thereby cutting the workpiece along the path.

Immediately after the cutting blade has been mounted on a spindle as a rotational shaft, there is a high possibility that the cutting blade is positioned off-center with respect to the spindle or is not sharp enough to cut the workpiece. For this reason, before cutting the workpiece, it is customary to perform a dressing step on the cutting blade by rotating the cutting blade and causing it to cut into a board for use in adjusting the cutting blade, which is also known as a dressing board, thus making the cutting blade ready for cutting operation.

In recent years, there has been put to practical use a cutting apparatus having a sub-chuck table that holds an adjustment board, in addition to a chuck table that holds a workpiece (see, for example, JP 2011-16175A). The cutting apparatus allows its cutting blade to be dressed on the adjustment board held on the sub-chuck table while the workpiece is being held on the chuck table.

SUMMARY OF THE INVENTION

The cutting apparatus with the sub-chuck table has a high degree of freedom with respect to the timing to dress the cutting blade. On the other hand, the adjustment board is mounted on and dismounted from the sub-chuck table manually by the operator. Consequently, it is highly likely for the cutting apparatus to cause a loss of time when the adjustment board is mounted on and dismounted from the sub-chuck table.

It is therefore an object of the present invention to provide a cutting apparatus that is capable of efficiently mounting an adjustment board on and dismounting the adjustment board from a sub-chuck table, a tray for use in the cutting apparatus, and a transport system for use in transporting a workpiece to the cutting apparatus.

In accordance with an aspect of the present invention, there is provided a cutting apparatus including a cutting unit having a spindle with a cutting blade mounted thereon, a chuck table having a holding surface used for holding thereon either a workpiece unit that includes a plate-shaped workpiece supported on an annular frame by a tape or a tray shaped similarly to the annular frame, a processing feed unit that has a drive source and moves the chuck table along a processing feed direction, an indexing feed unit that has a drive source and moves the cutting unit along an indexing feed direction perpendicular to the processing feed direction, a rest area used for placing thereon a receptacle that houses the workpiece unit or the tray therein, a transport unit configured to transport the workpiece unit or the tray between the rest area and the chuck table, the transport unit having a first holding pad that holds the workpiece unit or the tray thereon, a sub-chuck table that is disposed sideways of the chuck table and has a holding surface used for holding thereon a board for use in adjusting the cutting unit, and a board transport unit configured to transport the board between the tray held on the chuck table and the sub-chuck table. The board transport unit includes a second holding pad that holds the board thereon, and an actuator that is supported, together with the cutting unit, on the indexing feed unit and moves the second holding pad along a direction perpendicular to the processing feed direction and the indexing feed direction.

In accordance with another aspect of the present invention, there is provided a tray for use in the cutting apparatus described above. The tray includes a plate-shaped main body having an outer edge that is identical in shape to an outer edge of the annular frame, a first board rest area disposed on a surface of the main body and used for placing thereon the board before the board is loaded onto the sub-chuck table, and a second board rest area disposed on the surface of the main body and used for placing thereon the board after the board has been unloaded from the sub-chuck table.

In accordance with a further aspect of the present invention, there is provided a transport system for transporting a workpiece unit or a tray to each of a plurality of apparatuses including the cutting apparatus described above. The transport system includes a transport path disposed above the apparatus; a transport carriage configured to travel on the transport path, the transport carriage including a carriage frame on which wheels used for traveling on the transport path are mounted, a drive source that drives the wheels, a receptacle that stores the workpiece unit or the tray therein, a lifting and lowering unit disposed on the carriage frame and configured to lift and lower the receptacle by suspending the receptacle, a controller configured to control the drive source and the lifting and lowering unit, and a receiver configured to receive a control signal; a loader/unloader having a first rest area used for placing thereon a cassette storing the workpiece unit or the tray therein, a second rest area used for placing thereon the receptacle lowered from the transport carriage, and a receiver configured to receive a control signal, the loader/unloader being operable to transport the workpiece unit or the tray between the cassette placed on the first rest area and the receptacle placed on the second rest area; and a control unit having a transmitter configured to transmit control signals to the apparatus, the transport carriage, and the loader/unloader and a signal generator configured to generate the control signals to be transmitted from the transmitter. The transport carriage transports the workpiece unit or the tray transferred from the loader/unloader, to the apparatus on the basis of a signal from the control unit.

By using the cutting apparatus, the tray, and the transport system according to the present invention, it is possible to efficiently mount the board, i.e., a dressing board, on and dismount the board from the sub-chuck table.

The above and other objects, features and advantages of the present invention and the manner of realizing them will become more apparent, and the invention itself will best be understood from a study of the following description and appended claims with reference to the attached drawings showing preferred embodiments of the invention.

BRIEF DESCRIPTION OF THE DRAWINGS

FIG. 32 is a plan view illustrating a transport path that includes a plurality of floor panels;

DETAILED DESCRIPTION OF THE PREFERRED EMBODIMENTS

Preferred embodiments of the present invention will hereinafter be described with reference to the accompanying drawings.

First Embodiment

Figure 1:
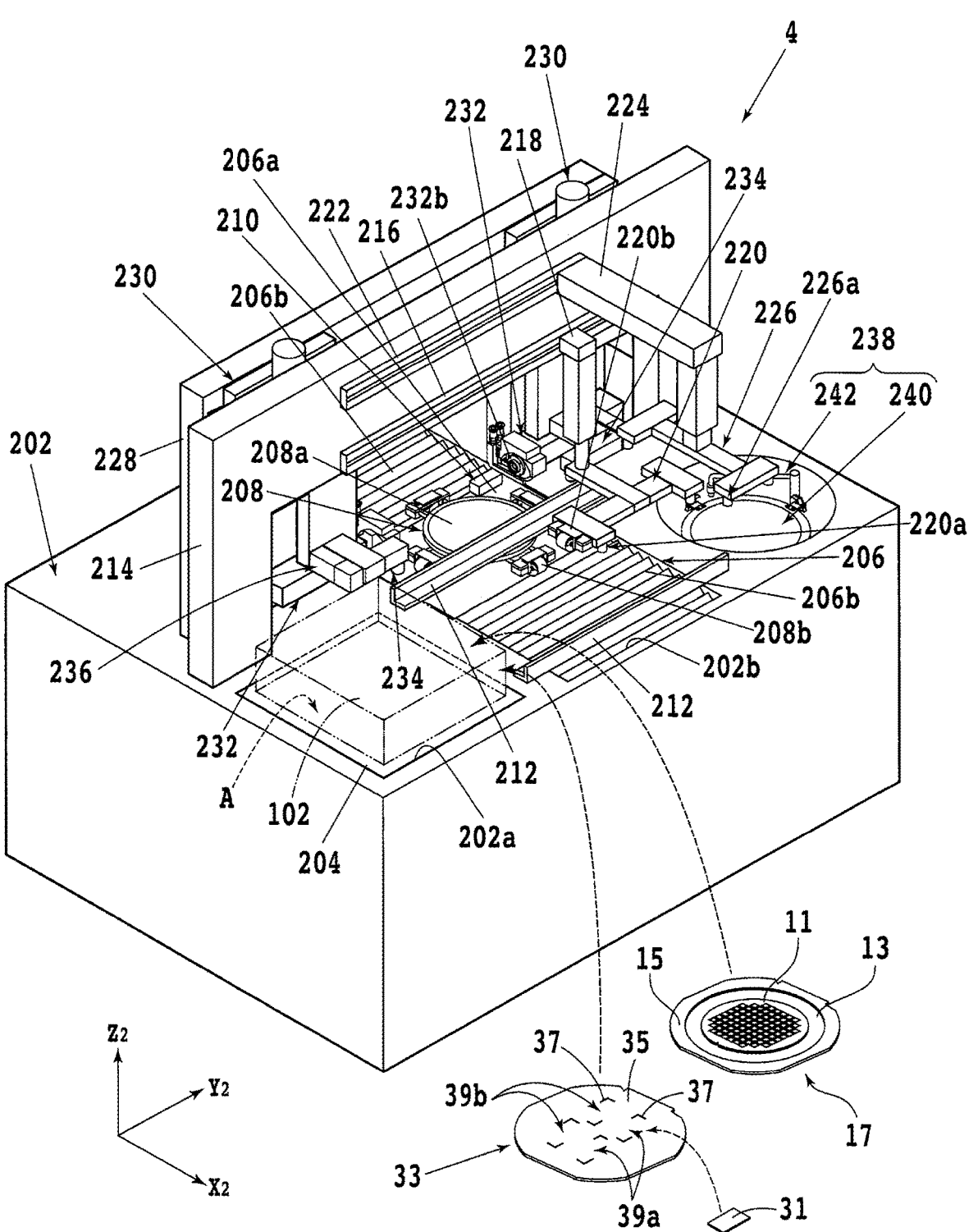
FIG. 1 is a perspective view of the internal structure of a processing apparatus (cutting apparatus) according to a first embodiment of the present invention.

FIG. 1 illustrates, in perspective, the internal structure of a processing apparatus (cutting apparatus) 4 according to a first embodiment of the present invention, for use in processing (cutting) a plate-shaped workpiece 11. $X_2$-axis directions, $Y_2$-axis directions, and $Z_2$-axis directions illustrated in FIG. 1 with respect to the processing apparatus 4 extend perpendicularly to each other. As illustrated in FIG.

1, the processing apparatus 4 includes a base 202 on which components of the processing apparatus 4 are supported.

The base 202 has an upwardly open recess 202a defined in an upper surface thereof at a corner thereof and housing therein a lifting and lowering table 204 that can be lifted and lowered by a lifting and lowering mechanism (not illustrated). The lifting and lowering table 204 has a rest area A on an upper surface thereof for placing thereon a receptacle (cassette) 102 of a transport carriage 10 to be described later that accommodates a workpiece 11, a board 31, and so on. The lifting and lowering table 204 also has on its upper surface a plurality of positioning members (not illustrated) that horizontally position the receptacle 102 in the rest area A. When the transport carriage 10 has stopped above the processing apparatus 4, the receptacle 102 is lowered from the transport carriage 10 onto the lifting and lowering table 204 and positioned in the rest area A by the positioning members.

The positioning members have respective curved guide surfaces for guiding the receptacle 102 as it is lowered from the transport carriage 10 toward the rest area A. The positioning members are fixed to the lifting and lowering table 204 at respective positions aligned with respective side surfaces of the receptacle 102 on the lifting and lowering table 204. When the receptacle 102 is lowered toward the lifting and lowering table 204, the side surfaces of the receptacle 102 are guided by the curved guide surfaces of the positioning members. Therefore, even if the receptacle 102 swings or sways horizontally upon downward movement toward the lifting and lowering table 204, the receptacle 102 is stably guided and placed in the rest area A on the lifting and lowering table 204.

The workpiece 11 is, for example, a disk-shaped wafer made of a semiconductor material such as silicon. The workpiece 11 has a face side including a plurality of small areas demarcated by a plurality of intersecting projected dicing lines (streets), with devices such as integrated circuits (ICs), micro-electro-mechanical systems (MEMSs), etc., formed in the respective areas.

The workpiece 11 has a reverse side opposite to the face side, and a tape (dicing tape) 13 that is larger in diameter than the workpiece 11 is affixed to the reverse side of the workpiece 11. The tape 13 has an outer circumferential portion fixed to an annular frame 15 that surrounds the workpiece 11. The processing apparatus 4 according to the present embodiment is loaded with the workpiece 11 in the form of a workpiece unit 17 where the workpiece 11 is supported on the frame 15 by the tape 13.

According to the present embodiment, the workpiece 11 is a disk-shaped wafer made of a semiconductor material such as silicon, as described above. According to the present invention, however, the workpiece is not limited to any particular materials, shapes, structures, sizes, and so on. For example, the workpiece 11 may be a substrate or the like made of another semiconductor material, ceramic, resin, metal, or the like. Similarly, the devices on the workpiece 11 are not limited to any particular kinds, quantities, shapes, structures, sizes, layouts, and so on. The workpiece 11 may even be free of devices on its face side.

The size of the frame 15 depends on the size of the workpiece 11 (the diameter of the workpiece 11). For example, the outside diameter of a frame 15 that supports a workpiece 11 having a diameter of approximately 300 mm is larger than the outside diameter of a frame 15 that supports a workpiece 11 having a diameter of approximately 200 mm. In other words, the larger the workpiece 11 is, the larger the outside diameter of the workpiece unit 17 is.

The board 31 is, for example, a dressing board shaped as a flat plate made of abrasive grains of white alundum (WA), green carborundum (GC), or the like that are bound together by a binding agent of resin, ceramic, or the like. The board 31 is able to adjust the state of a cutting blade 232b to be described later, when the rotating cutting blade 232b cuts into the board 31. The board 31 may alternatively be of such a nature that it is used to adjust a processing unit 232 including the cutting blade 232b.

Consequently, the board 31 may be of a shape, a material, a structure, and so on that are suitably selected depending on the application in which it is used. For example, in an application in which the cutting blade 232b cuts into the board 31 from above to form a groove in the board 31 and in which the height of the cutting blade 232b is then adjusted (measured) on the basis of the groove, a plate or the like made of the same material as the workpiece 11 may be used as the board 31.

The processing apparatus 4 according to the present embodiment is loaded with a plurality of boards 31 as they are supported on a tray 33 that is similar in shape to the frame 15. The tray 33 has a plate-shaped main body 35 having an outer edge that is identical in shape to the outer edge of the frame 15. The main body 35 has a face side (surface) on which there are disposed a plurality of positioning members 37 each L-shaped when viewed in plan, for example. The positioning members 37 define two first board rest areas 39a and two second board rest areas 39b on the main body 35 where the board 31 is to be placed. Details of the first board rest areas 39a and the second board rest areas 39b will be described later.

The base 202 includes, for example, a workpiece storage area defined below the rest area A of the lifting and lowering table 204. The workpiece storage area temporarily stores a workpiece unit 17 that has been processed by the processing apparatus 4, until the workpiece unit 17 is ready to be sent to the receptacle 102 of the transport carriage 10.

In addition to the workpiece storage area, a radiation unit configured to radiate ultraviolet rays, a detecting unit configured to detect the position of a notch in the workpiece 11, a reading unit configured to read an identification code applied to the workpiece 11 or the like, and other units may be disposed in the base 202 below the rest area A of the lifting and lowering table 204. A tray storage area for storing the tray 33 with the board 31 supported thereon may also be disposed in the base 202 below the rest area A of the lifting and lowering table 204. The workpiece storage area may double as the tray storage area, or the tray storage area may be separate from the workpiece storage area.

The base 202 also has an upwardly open elongate recess 202b defined therein alongside of the recess 202a and extending in the $X_2$-axis directions (forward/rearward directions or processing feed directions). The recess 202b houses therein a ball-screw-type X-axis moving mechanism (processing feed unit) 206. The X-axis moving mechanism 206 includes a drive source such as an electric motor (stepping motor) connected to an end of a ball screw. The X-axis moving mechanism 206 moves an X-axis movable table (not illustrated) along the $X_2$-axis directions. A table cover 206a is disposed over the X-axis movable table. Bellows-like dust-proof drip-proof covers 206b are disposed in the recess 202b and attached to front and rear ends of the table cover 206a.

Figure 2:
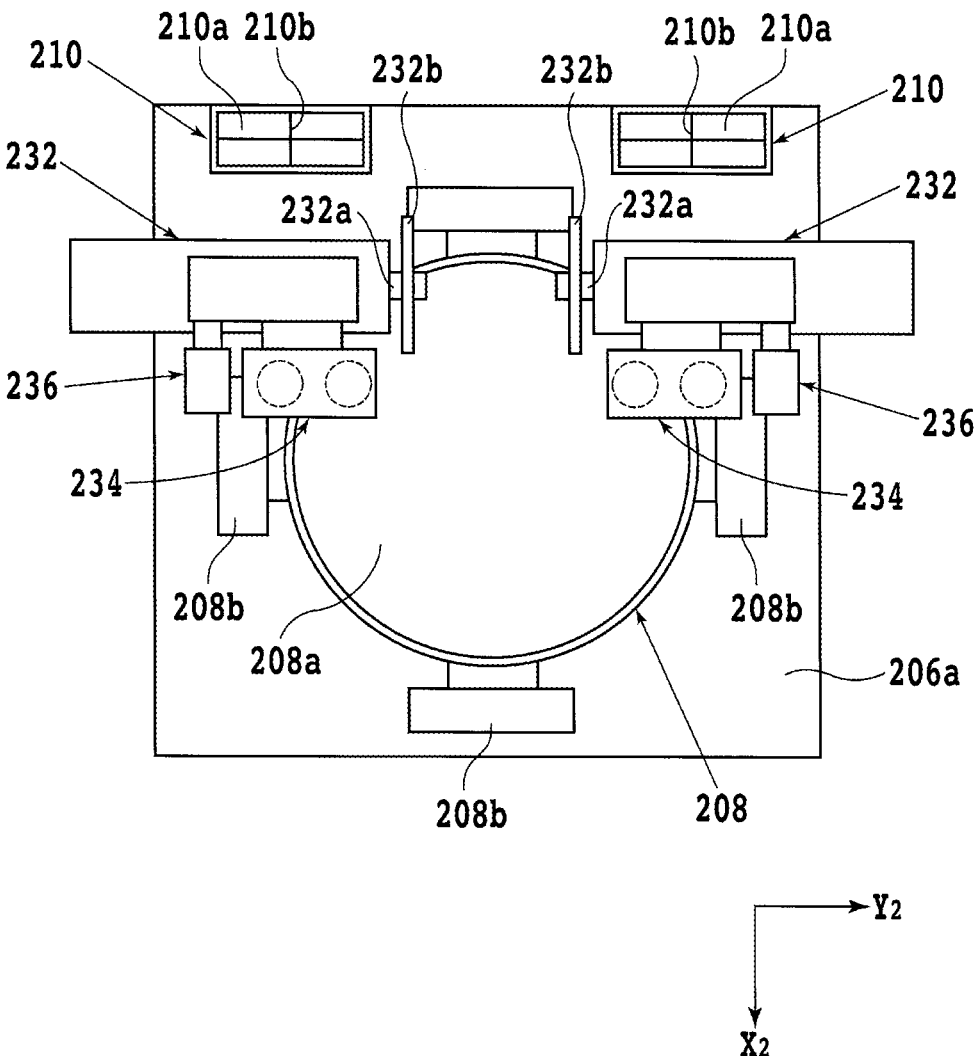
FIG. 2 is a plan view schematically illustrating a chuck table and structures around the chuck table.

A chuck table 208 that holds the workpiece unit 17 and the tray 33 thereon is mounted on the X-axis movable table and exposed above the table cover 206a. FIG. 2 schematically illustrates, in plan, the chuck table 208 and other components disposed therearound. The chuck table 208 is coupled to a drive source (not illustrated) such as an electric motor and is rotatable about a rotational axis generally parallel to the $Z_2$-axis directions (vertical directions or incising feed directions). The X-axis moving mechanism 206 described above moves (processing-feeds) the chuck table 208 along the $X_2$-axis directions.

The chuck table 208 has an upper surface acting as a holding surface 208a used for holding the workpiece unit 17 and the tray 33 thereon. The holding surface 208a is connected to a suction source (not illustrated) such as a vacuum pump through a suction channel (not illustrated) defined in the chuck table 208. The chuck table 208 is surrounded by four clamps 208b disposed therearound to secure the frame 15 of the workpiece unit 17 at four positions spaced apart at circumferentially equally spaced intervals.

Two sub-chuck tables 210 that hold boards 31 unloaded from the tray 33 are disposed obliquely and rearwardly (sideways) of the chuck table 208 and exposed above the table cover 206a. The sub-chuck tables 210 are also movable along the $X_2$-axis directions by the X-axis moving mechanism 206.

Each of the sub-chuck tables 210 has an upper surface acting as a holding surface 210a that holds a board 31. The holding surface 210a has a groove 210b that is defined therein and is connected to a suction source (not illustrated) such as a vacuum pump through a suction channel (not illustrated) defined in the sub-chuck table 210.

As illustrated in FIG. 1, a pair of guide rails 212 that are movable toward and away from each other while remaining generally parallel to the $Y_2$-axis directions (leftward/rightward directions or indexing-feed directions) are disposed on the base 202 over a front portion of the recess 202b. Each of the guide rails 212 includes a support surface used for supporting the frame 15 from below and a side surface extending substantially perpendicularly to the support surface. The guide rails 212 sandwich, therebetween in the $X_2$-axis directions, a workpiece unit 17 (frame 15) and a tray 33 that are pulled out of the receptacle 102 in the rest area A, thereby aligning the workpiece unit 17 (frame 15) and the tray 33 at a predetermined position.

A portal-shaped first support structure 214 is mounted on the base 202 in overhanging relation to the recess 202b. The first support structure 214 has a front surface facing the guide rails 212 and supporting a first rail 216 fixed thereto that extends along the $Y_2$-axis directions. A first holding unit (transport unit) 220 is movably coupled to the first rail 216 by a first moving mechanism 218, etc.

The first holding unit 220 includes, in a lower portion thereof, a holding pad (first holding pad) 220a that holds a workpiece unit 17 (frame 15) and a tray 33 thereon from above. The first holding unit 220 is vertically movable and is also movable in the $Y_2$-axis directions along the first rail 216 by the first moving mechanism 218. The first holding unit 220 includes a gripping mechanism 220b on a side thereof closer to the lifting and lowering table 204. The gripping mechanism 220b grips a frame 15 and a tray 33 from the side. The holding pad 220a of the first holding unit 220 may be, for example, a holding pad of the vacuum suction type that is connected to a suction source such as a vacuum pump, a holding pad of the Bernoulli type that uses a negative pressure generated by air flowing at a high speed, or the like.

When a frame 15 and a tray 33 are gripped by the gripping mechanism 220b and the first holding unit 220 is then moved in one of the $Y_2$-axis directions, the workpiece unit 17 and the tray 33 are pulled out of the receptacle 102 in the rest area A onto the guide rails 212, or the workpiece unit 17 and the tray 33 on the guide rails 212 are inserted into the receptacle 102 in the rest area A.

Similarly, when a frame 15 is gripped by the gripping mechanism 220b and the first holding unit 220 is then moved in one of the $Y_2$-axis directions, the workpiece unit 17 is pulled out of the workpiece storage area disposed below the rest area A, onto the guide rails 212, or the workpiece unit 17 on the guide rails 212 is inserted into the workpiece storage area.

In a case where the tray storage area is disposed below the rest area A, when a tray 33 is griped by the gripping mechanism 220b and the first holding unit 220 is then moved in one of the $Y_2$-axis directions, the tray 33 is pulled out of the tray storage area disposed below the rest area A, onto the guide rails 212, or the tray 33 on the guide rails 212 is inserted into the tray storage area.

After the workpiece unit 17 and the tray 33 have been aligned in position by the guide rails 212, the workpiece unit 17 and the tray 33 are held by the holding pad 220a and loaded onto the chuck table 208. In this manner, the first holding unit 220 is able to transport the workpiece unit 17 and the tray 33 among three areas including the rest area A, the chuck table 208, and the workpiece storage area (among four areas including the rest area A, the chuck table 208, the workpiece storage area, and the tray storage area in a case where the tray storage area is provided).

The first support structure 214 also supports, on its front surface, a second rail 222 fixed thereto above the first rail 216 and extending along the $Y_2$-axis directions. A second holding unit 226 is movably coupled to the second rail 222 by a second moving mechanism 224, etc. The second holding unit 226 includes a holding pad 226a in a lower portion thereof that holds a workpiece unit 17 (frame 15) and a tray 33 thereon. The second holding unit 226 is vertically movable and is also movable in the $Y_2$-axis directions along the second rail 222 by the second moving mechanism 224. The holding pad 226a of the second holding unit 226 may be, for example, a holding pad of the vacuum suction type, a holding pad of the Bernoulli type, or the like.

A portal-shaped second support structure 228 is mounted on the base 202 behind the first support structure 214. The second support structure 228 has a front surface facing the first support structure 214 and supporting two processing units (cutting units) 232 that are mounted on the second support structure 228 by respective ball-screw-type Y-axis and Z-axis moving mechanisms (indexing feed units or incising feed units) 230.

Each of the Y-axis and Z-axis moving mechanisms 230 includes a drive source such as an electric motor (stepping motor) connected to an end of a Y-axis driving ball screw, and moves (indexing-feeds) the corresponding processing unit 232 along the $Y_2$-axis directions. Each of the Y-axis and Z-axis moving mechanisms 230 also includes a drive source such as an electric motor (stepping motor) connected to an end of a Z-axis driving ball screw, and moves (incising-feeds) the corresponding processing unit 232 along the $Z_2$-axis directions.

As illustrated in FIG. 2, each of the processing units 232 includes a spindle 232a acting as a rotational shaft generally parallel to the $Y_2$-axis directions. The spindle 232a supports an annular cutting blade 232b mounted on an end of the spindle 232a. A drive source (not illustrated) such as an electric motor is coupled to the other end of the spindle 232a.

Nozzles (not illustrated) that supply a cutting fluid such as pure water to a workpiece 11 held on the chuck table 208 and the cutting blades 232b are disposed near the cutting blades 232b. While the cutting fluid is being supplied from the nozzles to the workpiece 11 and the cutting blades 232b, the rotating cutting blades 232b cut into the workpiece 11 that is held on the chuck table 208, thereby processing (cutting) the workpieces 11.

Image capturing units (cameras) 234 that capture images of the workpiece 11 held on the chuck table 208 and other parts are disposed forwardly of the processing units 232. Two board transport units 236 that transport boards 31 between a tray 33 held on the chuck table 208 and the sub-chuck tables 210 are also disposed forwardly of the processing units 232.

Each of the board transport units 236 includes, for example, an air-driven actuator 236a (see FIG. 5B, etc.,) having an air cylinder and a piston rod inserted in the air cylinder and slidable in the $Z_2$-axis directions. The actuator 236a has a lower end to which there is fixed a holding pad, i.e., a second holding pad, 236b connected to a suction source (not illustrated) such as a vacuum pump.

When the actuator 236a is operated, the holding pad 236b is moved in one of the $Z_2$-axis directions. Further, after the holding pad 236b has been moved in one of the $Z_2$-axis directions by the actuator 236a and brought into contact with the board 31, a vacuum generated by the suction source is applied to the holding pad 236b, enabling the holding pad 236b to hold the board 31 under suction.

The image capturing units 234 and the board transport units 236 are supported, together with the processing units 232, by the Y-axis and Z-axis moving mechanisms 230. In other words, the image capturing units 234 and the board transport units 236 are movable together with the processing units 232, in $Y_2$-axis directions, and are also movable together with the processing units 232, in $Z_2$-axis directions.

As illustrated in FIG. 1, a cleaning unit 238 is disposed in the base 202 at a position that is opposite to the lifting and lowering table 204 across the recess 202b. The cleaning unit 238 includes a spinner table 240 that holds a workpiece unit 17 thereon in a tubular cleaning space defined in the base 202. The spinner table 240 has a lower portion coupled to a drive source (not illustrated) that is disposed in the base 202 and that rotates the spinner table 240 about its central axis at a predetermined speed.

The cleaning unit 238 also includes an ejector nozzle 242 that is disposed above the spinner table 240 and that ejects a cleaning fluid (typically a mixture of water and air) toward the workpiece unit 17 held on the spinner table 240. While the spinner table 240 with the workpiece unit 17 held thereon is rotating about its central axis, the cleaning fluid is ejected from the ejector nozzle 242 toward the workpiece unit 17 to clean the workpiece 11.

For example, after the workpiece 11 of a workpiece unit 17 has been processed by the processing units 232, the second holding unit 226 holds the frame 15 of the workpiece unit 17 and loads the workpiece unit 17 into the cleaning unit 238, and then, the workpiece 11 is cleaned. After the workpiece 11 has been cleaned by the cleaning unit 238, the first holding unit 220 holds the frame 15 and places the workpiece unit 17 onto the guide rails 212, for example. Thereafter, the gripping mechanism 220b grips the frame 15 and stores the workpiece unit 17 into the receptacle 102 in the rest area A.

Figure 3:
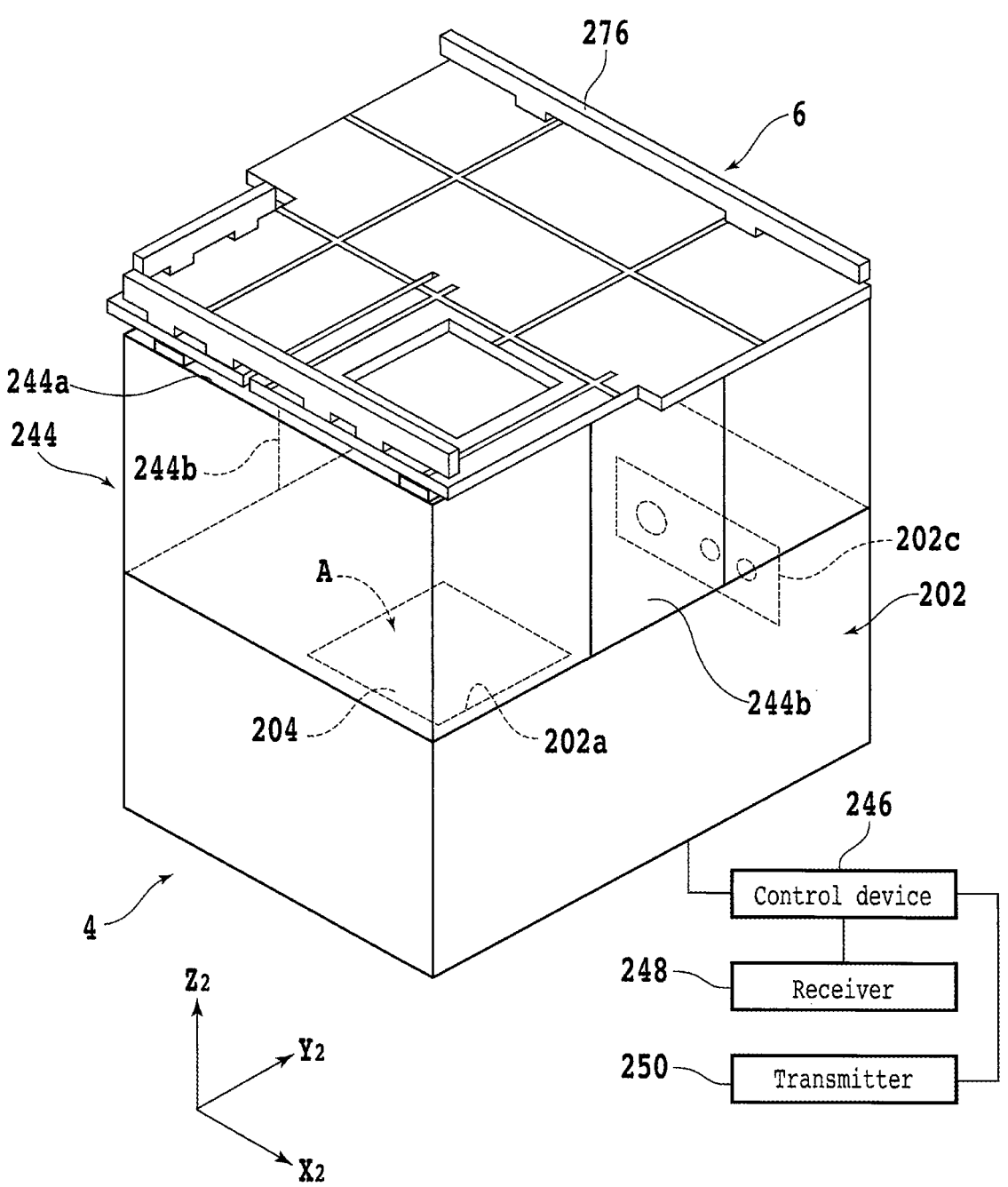
FIG. 3 is a perspective view illustrating the appearance of the processing apparatus (cutting apparatus)

FIG. 3 illustrates, in perspective, the appearance of the processing apparatus 4. In FIG. 3, some components are illustrated in functional block form. As illustrated in FIG. 3, the upper surface of the base 202 is covered with a cover 244 that houses therein the components of the processing apparatus 4 described above. The cover 244 has a ceiling 244a with an opening (not illustrated) defined vertically therethrough, directly above the recess 202a.

The receptacle 102 of the transport carriage 10 is movable into the cover 244 from outside thereof through the opening in the ceiling 244a, and is also movable out of the cover 244 from inside thereof through the opening in the ceiling 244a. The opening is not limited to any particular shapes and sizes as long as it allows at least the receptacle 102 to move therethrough.

The components of the processing apparatus 4 described above are electrically connected to a control device 246. The control device 246 is configured as a computer including, for example, a processor such as a central processing unit (CPU), a main storage unit such as a dynamic random access memory (DRAM), and an auxiliary storage unit such as a flash memory. The processor, etc., is operated according to software stored in the auxiliary storage unit, to realize functions of the control device 246.

To the control device 246, there are electrically connected a receiver 248 that receives signals (information) from external devices and sends the received signals to the control device 246 and a transmitter 250 that receives signals (information) from the control device 246 and sends the received signals to the external devices. For example, the receiver 248 receives signals (control signals) sent from a control unit 12 of a transport system 2 (see FIG. 8) to be described later, and sends the received signals to the control device 246.

The control device 246 controls operation of the components of the processing apparatus 4 on the basis of the signals received from the receiver 248, for example. Further, the control device 246 generates signals such as notification signals and sends the generated signals to the transmitter 250. The transmitter 250 transmits the signals received from the control device 246, to the control unit 12 of the transport system 2, for example.

The base 202 has a side wall including a pipe connection panel 202c to which various pipes 21 (see FIG. 7) are connected. The cover 244 has a side wall having a door 244b that can be opened and closed for the maintenance of the processing apparatus 4. A control panel (not illustrated) used for entering instructions for the control device 246, a display (not illustrated) that displays various items of information regarding the processing apparatus 4, and other devices may be mounted on a side wall or side walls of the cover 244.

Figure 4:
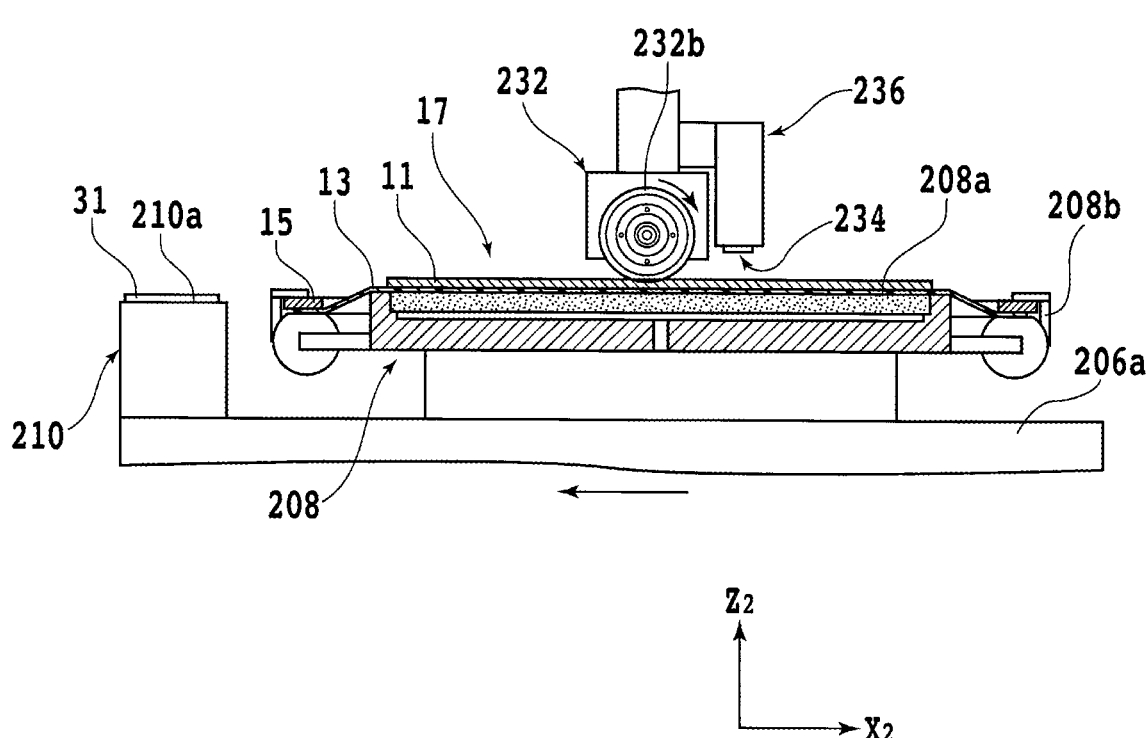
FIG. 4 is a side elevational view, partly in cross section, illustrating a manner in which a workpiece is processed by the processing apparatus.

FIG. 4 illustrates, in side elevation and partly in cross section, a manner in which the workpiece 11 is processed by the processing apparatus 4. Though the processing apparatus 4 has the two processing units 232 as described above, only one of the processing units 232 will be described below with respect to the processing of the workpiece 11 on the processing apparatus 4. In FIG. 4, some of the components are illustrated in cross section. For processing the workpiece 11, the workpiece unit 17 is placed on the holding surface 208a of the chuck table 208 by the first holding unit 220, etc., such that the face side of the workpiece 11 faces upwardly, and the suction source connected to the holding surface 208a is actuated to apply a negative pressure to the holding surface 208a. At the same time, the frame 15 of the workpiece unit 17 is secured by the clamps 208b. The workpiece unit 17 is thus held by the chuck table 208.

Next, the chuck table 208 is adjusted in orientation, i.e., rotated about its central axis, to make any parallel ones of the projected dicing lines on the workpiece 11 generally parallel to the X₂-axis directions, and then, the cutting blade 232*b* of the processing unit 232 is positioned above an extension of one of the projected dicing lines that is parallel to the X₂-axis directions. Thereafter, the processing unit 232 is lowered to place the lower end of the cutting blade 232*b* at a position lower than the face side (upper surface) of the workpiece 11.

Then, as illustrated in FIG. 4, the cutting blade 232*b* is rotated, and the chuck table 208 is moved in one of the X₂-axis directions while the cutting fluid is being supplied to the workpiece 11 and the cutting blade 232*b*, enabling the cutting blade 232*b* to cut into the workpiece 11 to process (cut) the workpiece 11. Conditions of the height of the lower end of the cutting blade 232*b* and the like are adjusted as desired depending on the purpose for which the workpiece 11 is processed.

Figure 5A:
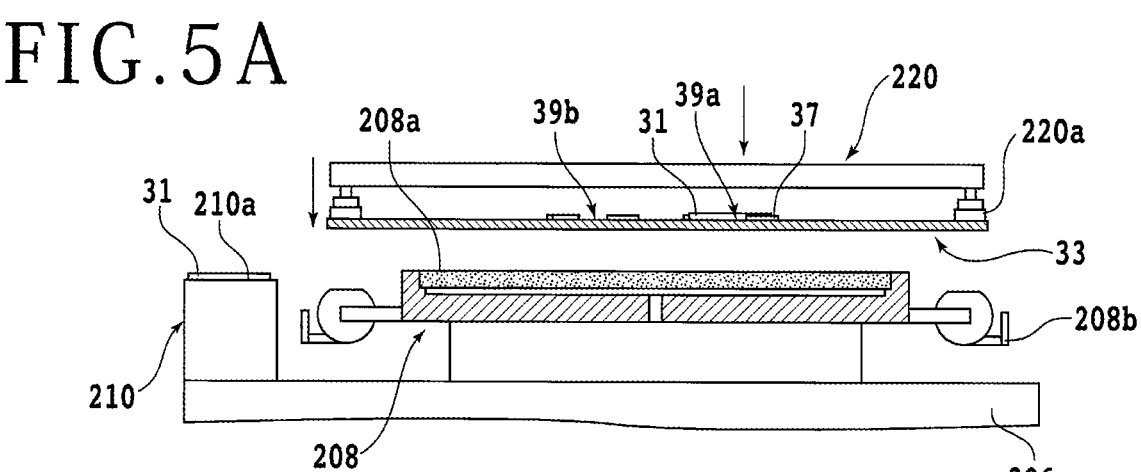
FIGS. 5A, 5B, and 5C are side elevational views, partly in cross section, illustrating a manner in which a board on a sub-chuck table is replaced.

FIGS. 5A, 5B, 5C, 6A, and 6B illustrate, in side elevation, a manner in which a board 31 on the sub-chuck table 210 is replaced. Though the processing apparatus 4 has the two processing units 232, the two sub-chuck tables 210, and the two board transport units 236 as described above, only one of the processing units 232, only one of the sub-chuck tables 210, and only one of the board transport units 236 will be described below with respect to the replacement of the board 31 on the sub-chuck table 210. In FIGS. 5A, 5B, 5C, 6A, and 6B, some of the components are illustrated in cross section. For replacing a board 31 on the sub-chuck table 210, as illustrated in FIG. 5A, the tray 33 with boards 31 supported thereon is placed on the holding surface 208*a* of the chuck table 208 by the first holding unit 220, etc., and the suction source connected to the holding surface 208*a* is actuated to apply a negative pressure to the holding surface 208*a*. The tray 33 is thus held on the chuck table 208.

Figure 5B:
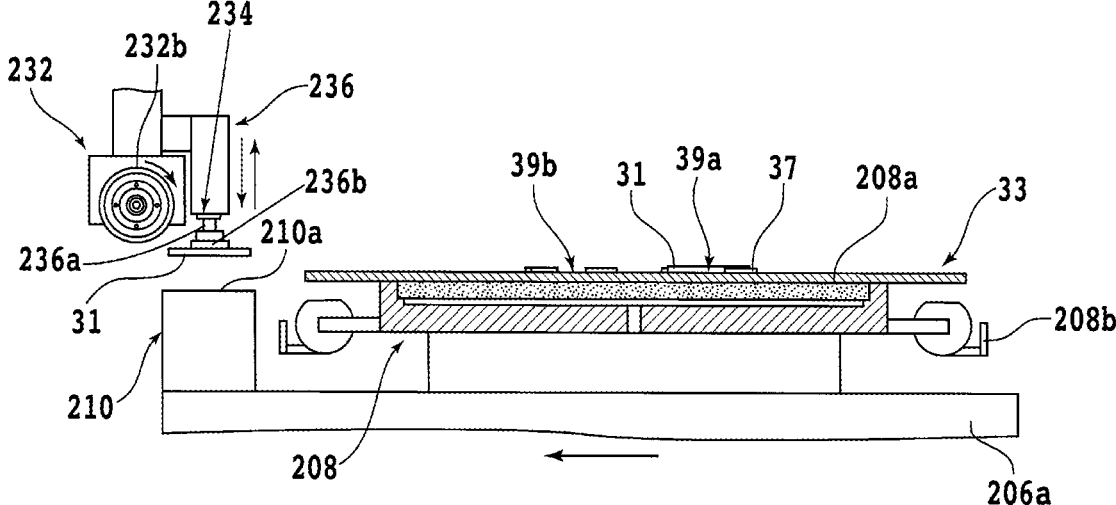
Figure 5C:
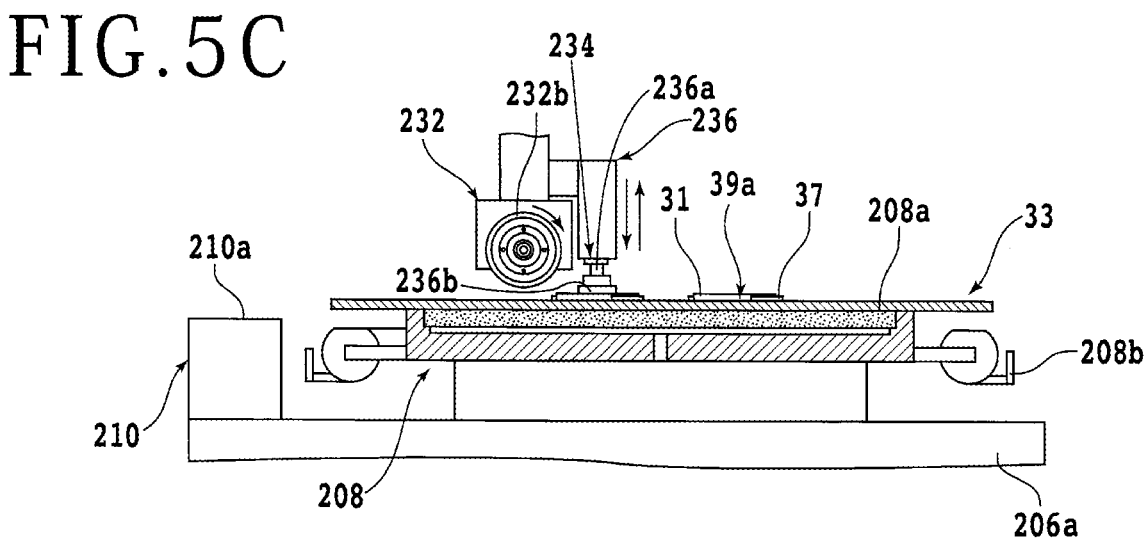

As illustrated in FIGS. 5A to 5C, boards 31 to be loaded onto the sub-chuck table 210 are placed in the respective first board rest areas 39*a*. As illustrated in FIG. 5A, no board 31 is placed in the second board rest areas 39*b*. Boards 31 to be unloaded from the sub-chuck table 210 will be placed in the respective second board rest areas 39*b*.

After the tray 33 has been held on the chuck table 208, a board 31 held on the sub-chuck table 210 is unloaded therefrom and placed in one of the second board rest areas 39*b*. Specifically, the sub-chuck table 210 and the board transport unit 236 are moved relatively to each other to position the board transport unit 236 above the sub-chuck table 210, as illustrated in FIG. 5B.

Next, the actuator 236*a* of the board transport unit 236 lowers the holding pad 236*b* into contact with the board 31 on the sub-chuck table 210. The suction source connected to the holding pad 236*b* applies a negative pressure to the holding pad 236*b*. The board 31 is thus held on the holding pad 236*b*.

Thereafter, the negative pressure applied to the holding surface 210*a* of the sub-chuck table 210 is removed, and the actuator 236*a* lifts the holding pad 236*b* away from the sub-chuck table 210, as illustrated in FIG. 5B. Further, the chuck table 208 and the board transport unit 236 are moved relatively to each other to position the board transport unit 236 above one of the second board rest areas 39*b* of the tray 33 held on the chuck table 208, as illustrated in FIG. 5C.

Then, the actuator 236*a* lowers the holding pad 236*b* to position the board 31 in the second board rest area 39*b* of the tray 33. The negative pressure applied to the holding pad 236*b* is removed, placing the board 31 unloaded from the sub-chuck table 210, in the second board rest area 39*b*. After the board 31 has been placed in the second board rest area 39*b*, the actuator 236*a* lifts the holding pad 236*b* away from the tray 33.

After the board 31 has been unloaded from the sub-chuck table 210 and placed in the second board rest area 39*b* of the tray 33, another board 31 placed in one of the first board rest areas 39*a* of the tray 33 is loaded onto the sub-chuck table 210. Specifically, as illustrated in FIG. 6A, the chuck table 208 and the board transport unit 236 are moved relatively to each other to position the board transport unit 236 above the one of the first board rest areas 39*a* of the tray 33 held on the chuck table 208.

Then, the actuator 236*a* lowers the holding pad 236*b* into contact with the board 31 in the one of the first board rest areas 39*a* of the tray 33. The suction source connected to the holding pad 236*b* applies a negative pressure to the holding pad 236*b*. The board 31 is thus held by the holding pad 236*b*.

Figure 6A:
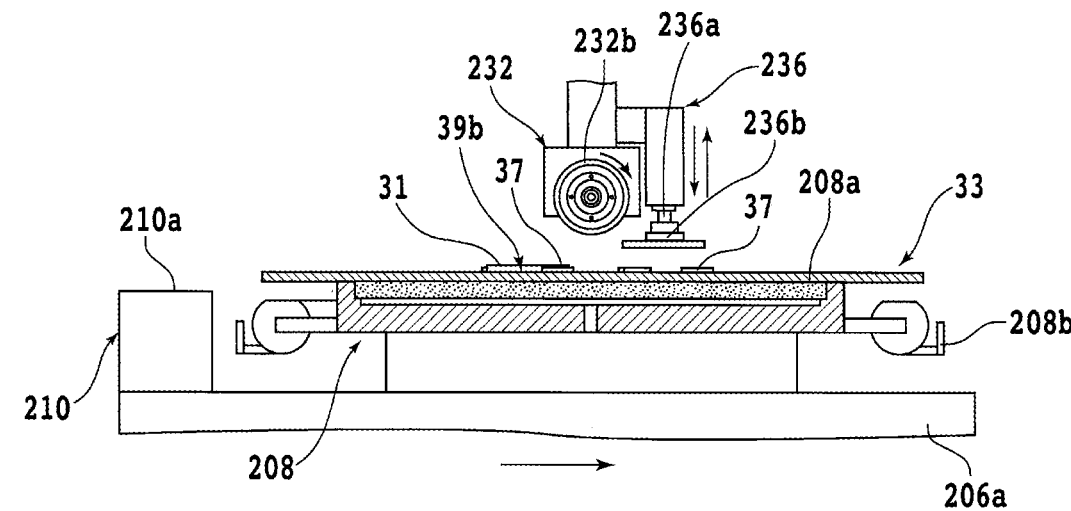
FIGS. 6A and 6B are side elevational views, partly in cross section, illustrating a manner in which the board on the sub-chuck table is replaced.
Figure 6B:
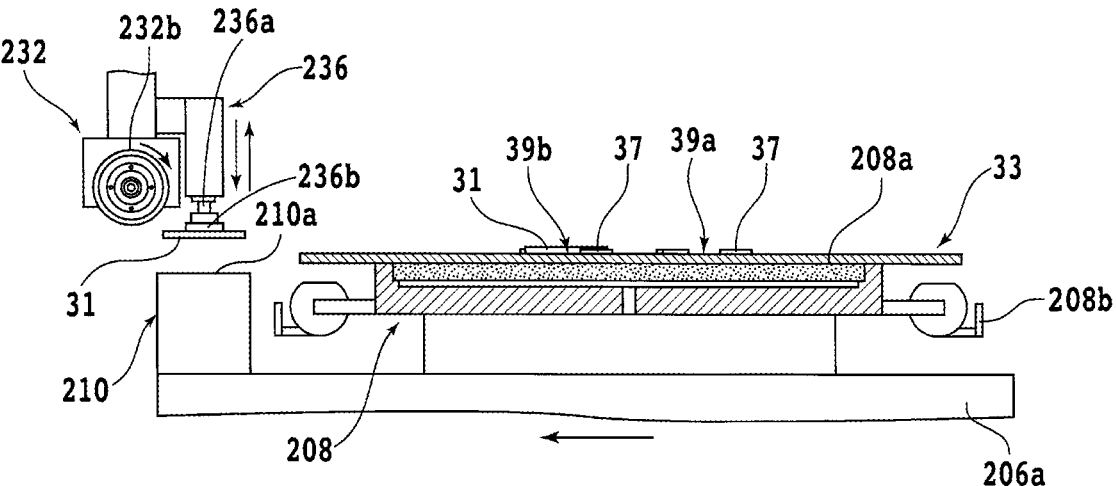

Thereafter, as illustrated in FIG. 6A, the actuator 236*a* lifts the holding pad 236*b* away from the chuck table 208. The chuck table 208 and the board transport unit 236 are moved relatively to each other to position the board transport unit 236 above the sub-chuck table 210, as illustrated in FIG. 6B.

Then, the actuator 236*a* lowers the holding pad 236*b* to place the board 31 on the holding surface 210*a* of the sub-chuck table 210. Thereafter, a negative pressure from the suction source connected to the holding surface 210*a* is applied to the holding surface 210*a* to enable the sub-chuck table 210 to hold the board 31. After the sub-chuck table 210 has held the board 31 thereon, the negative pressure applied to the holding pad 236*b* is removed, and the actuator 236*a* lifts the holding pad 236*b* away from the sub-chuck table 210.

As described above, the processing apparatus (cutting apparatus) 4 according to the present embodiment includes the board transport units 236 that transports boards 31 between the tray 33 held on the chuck table 208 and the sub-chuck table 210. Each of the board transport units 236 includes the holding pad 236*b* that holds the board 31 and the actuator 236*a* that is supported together with the processing unit (cutting unit) 232 by the Y-axis and Z-axis moving mechanisms (indexing feed units) 230 and that moves the holding pad 236*b* along the incising feed directions (Z₂-axis directions) perpendicular to the processing feed directions (X₂-axis directions) and the indexing feed directions (Y₂-axis directions).

Therefore, in a case where the processing apparatus 4 is in use, the processing apparatus 4 does not require the operator to manually place boards 31 on and remove boards 31 from the sub-chuck table 210. As a result, boards 31 can efficiently be placed on and removed from the sub-chuck table 210.

Next, a transport system arranged to transport workpieces 11 (workpiece units 17) and boards 31 (trays 33) to a plurality of apparatuses including the processing apparatus (cutting apparatus) 4 will be described below. Each of the apparatuses as destinations to which workpieces 11 and boards 31 are to be transported will hereinafter be described as the processing apparatus (cutting apparatus) 4. However, the transport system may be arranged so as to be able to transport workpieces 11, etc., to apparatuses of any type. In other words, the destinations to which workpieces 11, etc., are to be transported may be apparatuses other than the processing apparatus (cutting apparatus) 4.

For example, the transport system may be arranged so as to be able to transport workpieces 11 successively to a plurality of types of apparatuses that are used in a processing sequence. Further, the transport system may also be arranged so as to be able to transport workpieces 11 to various apparatuses used in any step ancillary to the processing of the workpieces 11. Stated otherwise, the destinations to which the workpieces 11, etc., are to be transported may include a tape affixing apparatus, an ultraviolet radiation applying apparatus, a cleaning apparatus, etc., that are not aimed at processing the workpieces 11.

Figure 7:
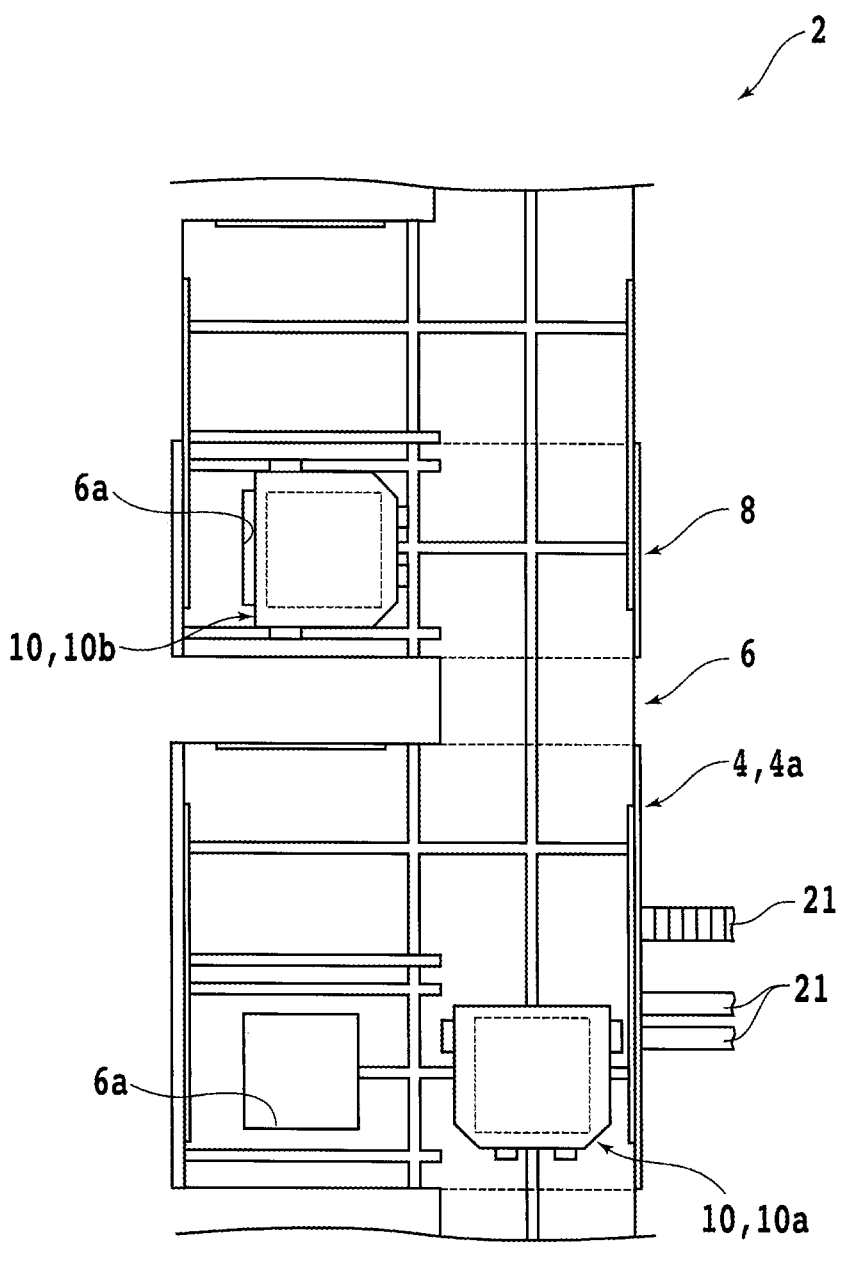
FIG. 7 is a plan view illustrating a structural example of a transport system.
Figure 8:
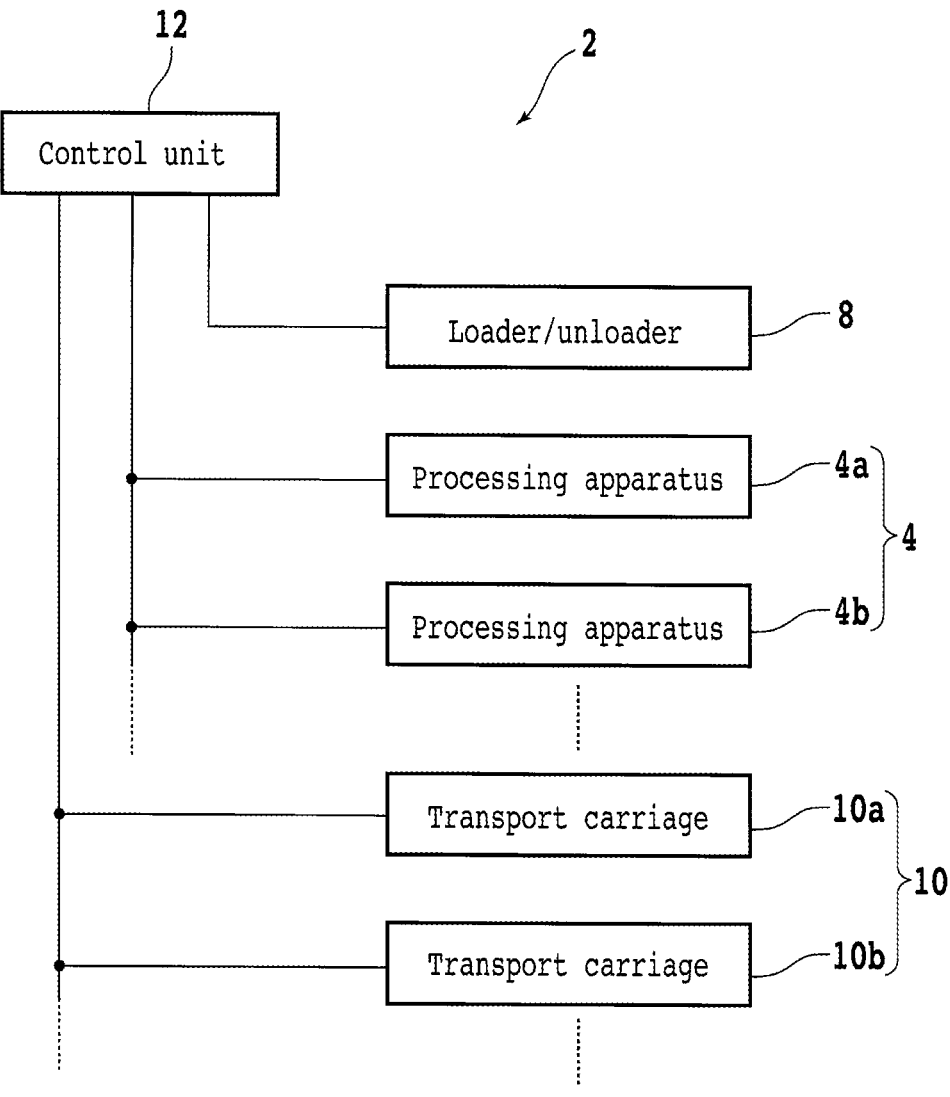
FIG. 8 is a functional block diagram illustrating an example of how components of the transport system are connected.

FIG. 7 illustrates, in plan, a structural example of the transport system, denoted by 2, according to the present embodiment. FIG. 8 illustrates, in functional block form, an example of how components of the transport system 2 are connected. As illustrated in FIG. 7, the transport system 2 according to the present embodiment includes a transport path 6 used for transporting workpieces 11, etc., to be processed by the processing apparatus (cutting apparatus) 4.

The processing apparatus 4 described above is connected to the transport system 2 as a destination to which workpieces 11, etc., are to be transported. However, the processing apparatus 4 is not necessarily a component of the transport system 2. Further, for illustrative purposes, only one processing apparatus (one cutting apparatus) 4a is illustrated in FIG. 7, and two processing apparatuses (two cutting apparatuses) 4a and 4b are illustrated in FIG. 8. According to the present embodiment, two or more processing apparatuses 4 are required as destinations for workpieces 11, etc. In other words, the number of processing apparatuses 4 connected to the transport system 2 is two or more.

The transport path 6 is installed above each of the processing apparatuses 4 in such a manner as to interconnect the plural processing apparatuses 4. Workpieces 11 and boards 31 are transported through the transport path 6 to each of the processing apparatuses 4. Since the transport path 6 is installed above the processing apparatus 4, the transport path 6 is kept out of physical interference with the pipes 21, etc., connected to side surfaces of the processing apparatus 4.

Below the transport path 6, there is disposed, other than the processing apparatus 4, a loader/unloader (transport apparatus) 8 that accommodates workpieces 11 to be processed, workpieces 11 that have been processed, boards 31 to be used, boards 31 that have been used, etc. Workpieces 11 to be processed and boards 31 to be used that are accommodated in the loader/unloader 8 are loaded into transport carriages 10 at any timing.

The transport carriages 10 travel on the transport path 6 to transport the workpieces 11 to be processed and the boards 31 to be used which have been received from the loader/unloader 8, to the processing apparatus 4. Further, when the transport carriages 10 have received processed workpieces 11 and used boards 31 from the processing apparatus 4, the transport carriages 10 travel on the transport path 6 to transport the processed workpieces 11 to the loader/unloader 8.

In a case where a plurality of types of apparatuses (processing apparatus 4, etc.,) are connected to the transport system 2, a transport carriage 10 may receive a processed workpiece 11 from one of the processing apparatuses 4 and travel on the transport path 6 to transport the processed workpiece 11 to an apparatus that is used in the next step. In FIGS. 7 and 8, two transport carriages 10a and 10b are illustrated. However, there is no limitation on the number of transport carriages 10.

As illustrated in FIG. 8, the control unit 12 is connected through wireless links to the processing apparatus 4, the loader/unloader 8, and the transport carriages 10 for controlling their operation. The control unit 12 may be arranged so as to be able to control the operation of the processing apparatus 4, the loader/unloader 8, and the transport carriages 10, and may be connected to them through wired links.

Figure 9:
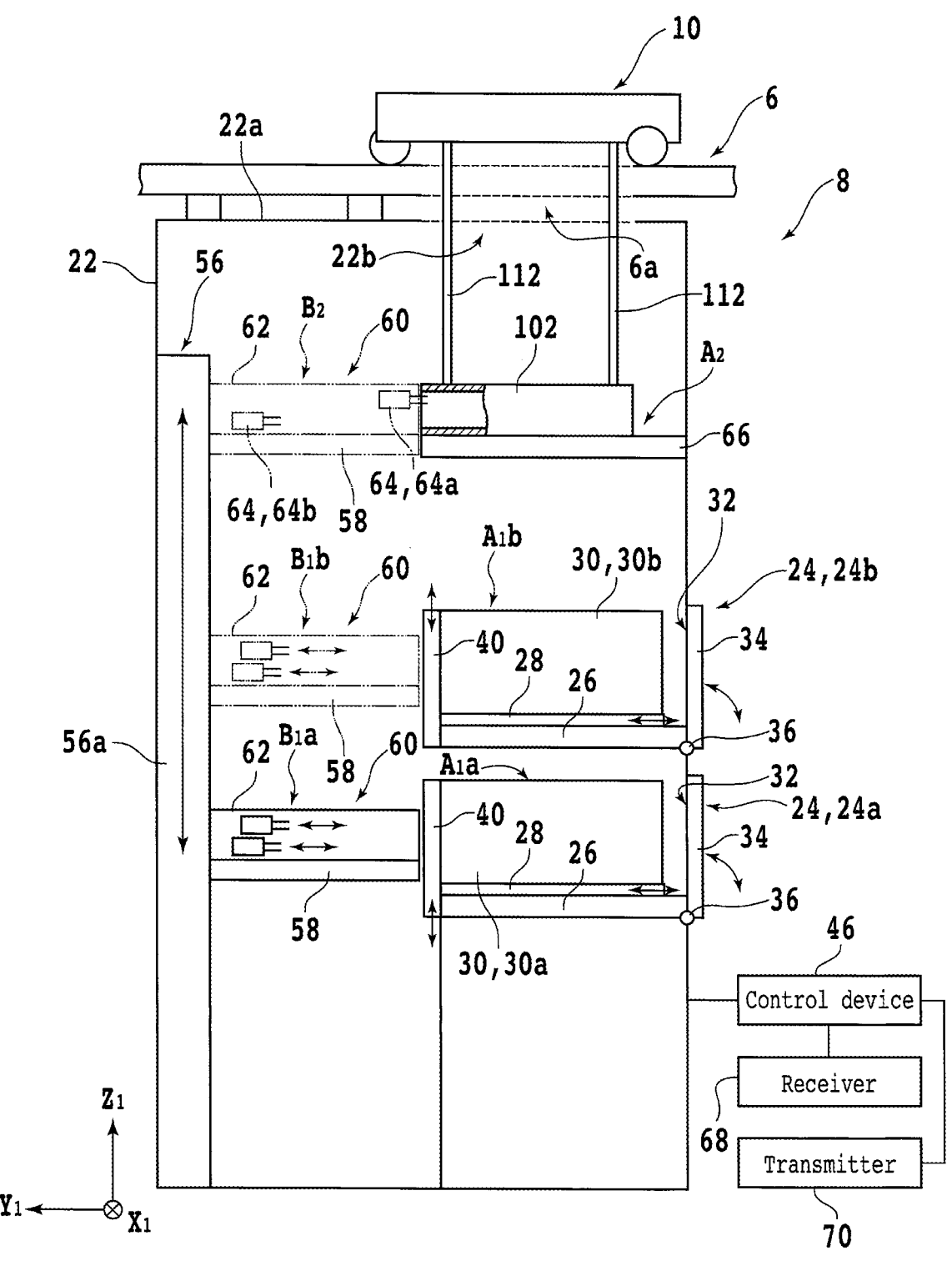
FIG. 9 is a side elevational view schematically illustrating a structural example of a loader/unloader.

FIG. 9 schematically illustrates, in side elevation, a structural example of the loader/unloader 8. In FIG. 9, some components are illustrated in functional block form. As illustrated in FIG. 9, the loader/unloader 8 includes a housing 22 that houses various components of the loader/unloader 8 therein. In FIG. 9, only the profile of the housing 22 is illustrated for illustrative purposes.

Respective cassette storing mechanisms 24 are disposed in two positions at different heights along heightwise directions ($Z_1$-axis directions) in the housing 22. In other words, the loader/unloader 8 according to the present embodiment includes a first cassette storing mechanism 24a and a second cassette storing mechanism 24b disposed above the first cassette storing mechanism 24a. However, there is no limitation on the number of cassette storing mechanisms 24 included in the loader/unloader 8. The loader/unloader 8 may include one or more cassette storing mechanisms 24.

Each of the cassette storing mechanisms 24 has a support base 26 shaped as a flat plate. The support base 26 has an upper surface with a guide mechanism (not illustrated) disposed thereon. A cassette rest base 28 that is shaped as a flat plate is mounted on the guide mechanism for sliding movement along depthwise directions ($Y_1$-axis directions) of the housing 22.

A cassette 30 that houses a plurality of (e.g., 10 or more) workpieces 11, etc., therein is placed on the upper surface of the cassette rest base 28. The cassette 30 is used to transport a plurality of workpiece units 17 and trays 33 together. By using the cassette 30, the operator is able to load a plurality of workpiece units 17 and trays 33 together into the loader/unloader 8.

The housing 22 has loading/unloading ports 32 defined in a side wall thereof at positions aligned with the respective cassette storing mechanisms 24, for allowing the cassette rest bases 28 with the cassettes 30 placed thereon to pass through the loading/unloading ports 32. When the cassettes 30 are to be loaded or unloaded, the cassettes 30 pass through the loading/unloading ports 32 upon sliding movement of the cassette rest bases 28 with the cassettes 30 placed thereon.

Outer doors (second doors) 34 that close the respective loading/unloading ports 32 are disposed on the housing 22 at respective positions aligned with the loading/unloading ports 32. The outer doors 34 have lower portions coupled to outer ends of the support bases 26 by rotary joint members 36 such as hinges that have horizontal rotational axes. The outer doors 34 are opened and closed by being turned about the rotational axes of the rotary joint members 36.

When the outer doors 34 are opened, the cassette rest bases 28 can be pulled out of the housing 22 into outer loading/unloading areas (outer areas) 38a (see FIG. 12A, etc.,) that are positioned outside of the loading/unloading ports 32. Air-actuated lock mechanisms (not illustrated) that keep the outer doors 34 closed are disposed on the housing 22 at respective positions aligned with the loading/unloading ports 32.

For example, the operator places a cassette 30 that the operator has carried, on the cassette rest base 28 pulled out into one of the outer loading/unloading areas 38a. Thereafter, the operator pushes the cassette rest base 28 into the housing 22 through the loading/unloading port 32. The cassette rest base 28 and the cassette 30 disposed thereon are moved into an inner storing area (inner area) 38*b* (see FIG. 12A, etc.,) that is positioned inside of the loading/unloading port 32.

In the present description, the inner storing area 38*b* may also be referred to as a first rest area where a cassette 30 is placed. For unloading a cassette 30 from one of the cassette storing mechanisms 24, the outer door 34 may be opened, and then, the cassette rest base 28 may be pulled out from the inner storing area 38*b* through the loading/unloading port 32 into the outer loading/unloading area 38*a*.

Two inner doors (first doors) 40 that are vertically movable are disposed at respective positions that are opposite to the loading/unloading ports 32 across the inner storing areas 38*b* of the cassette storing mechanisms 24. The inner door 40 of the first cassette storing mechanism 24*a* is movable between an upper closed position adjacent to the inner storing area 38*b* of the first cassette storing mechanism 24*a* and a lower open position, whereas the inner door 40 of the second cassette storing mechanism 24*b* is movable between an upper open position adjacent to the inner storing area 38*b* of the second cassette storing mechanism 24*b* and a lower closed position. Therefore, the two inner doors 40 stay out of physical interference with each other.

Figure 10A:
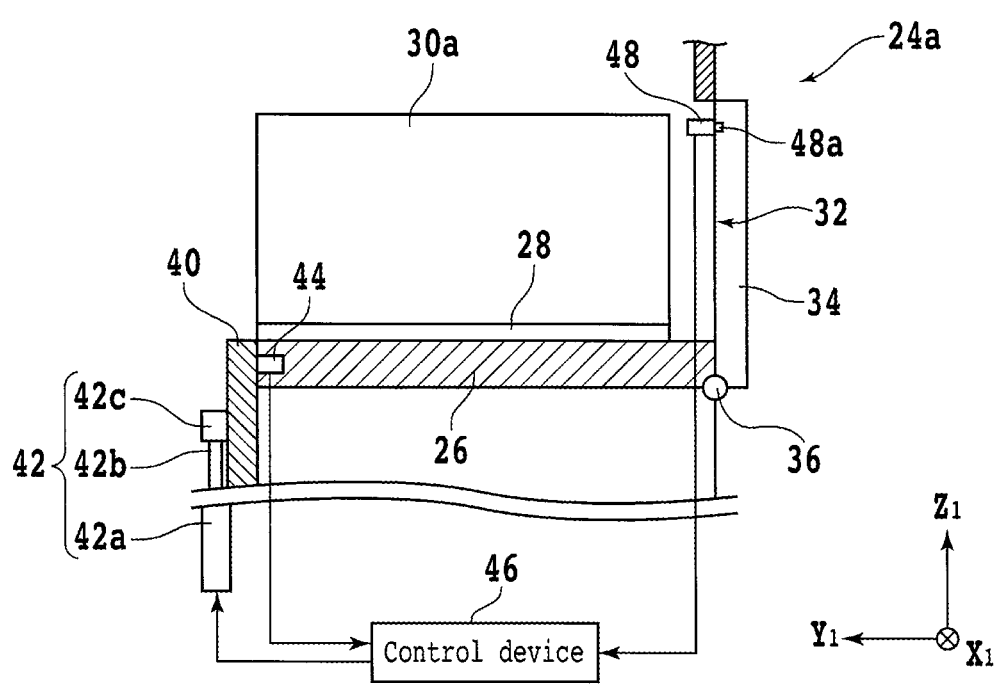
FIG. 10A is a side elevational view, partly in cross section, illustrating a manner in which an outer door is closed and an inner door is open.

FIG. 10A illustrates, in side elevation and partly in cross section, the first cassette storing mechanism 24*a* with the outer door 34 closed and with the inner door 40 open. In FIG. 10A, a component of the loader/unloader 8 is illustrated in functional block form. Structural and operational details of the second cassette storing mechanism 24*b* are similar to those of the first cassette storing mechanism 24*a* except for movement of the inner door 40.

As illustrated in FIG. 10A, a lifting and lowering mechanism 42 is coupled to the inner door 40. The lifting and lowering mechanism 42 is, for example, an air actuator (air cylinder) that moves a target under pneumatic pressure, and includes a cylinder tube 42*a* and a piston rod 42*b* movable with respect to the cylinder tube 42*a*.

The piston rod 42*b* has a proximal end portion housed in the cylinder tube 42*a* and coupled to a piston (not illustrated). The piston rod 42*b* also has a distal end portion exposed out of the cylinder tube 42*a* and coupled to a joint member 42*c* that is fixed to a surface of the inner door 40 that is opposite to the inner storing area 38*b*.

When the piston and the piston rod 42*b* are moved downwardly by controlling air introduced into and discharged out of the cylinder tube 42*a*, the inner door 40 of the first cassette storing mechanism 24*a* is moved from a closed position to an open position. When the piston and the piston rod 42*b* are moved upwardly, the inner door 40 of the first cassette storing mechanism 24*a* is moved from the open position to the closed position. The lifting and lowering mechanism 42 may be realized by another mechanism such as a rodless air cylinder.

A first sensor 44 used for detecting whether or not the inner door 40 is open is disposed on the support base 26 at a position facing the inner door 40. The first sensor 44 is, for example, a magnet sensor that detects the intensity of a magnetic field produced by a magnet 44*a* (see FIG. 10B) attached to the inner door 40 on a surface thereof that faces the support base 26.

For example, when the inner door 40 is opened and the magnet 44*a* is then moved away from the first sensor 44 as illustrated in FIG. 10A, the intensity of the magnetic field produced by the magnet 44*a* becomes weaker at the position of the first sensor 44. Therefore, it is possible to determine whether or not the inner door 40 is open, on the basis of the intensity of the magnetic field detected by the first sensor 44.

A control device 46 configured to control the components of the loader/unloader 8 is electrically connected to the first sensor 44. The first sensor 44 sends information regarding the detected intensity of the magnetic field, to the control device 46. If the intensity of the magnetic field detected by the first sensor 44 becomes weaker than a reference value, then the control device 46 determines that the inner door 40 is opened. If the intensity of the magnetic field detected by the first sensor 44 becomes stronger than the reference value, then the control device 46 determines that the inner door 40 is closed. The first sensor 44 may electrically be connected to the control device 46 through a wireless link.

The control device 46 is configured as a computer including, for example, a processor such as a CPU, a main storage unit such as a DRAM, and an auxiliary storage unit such as a flash memory. The functions of the control device 46 are realized when the processor is operated according to software stored in the auxiliary storage unit.

A second sensor 48 used for detecting whether or not the outer door 34 is open is disposed on the housing 22 at a position corresponding to the loading/unloading port 32. The second sensor 48 is, for example, a magnet sensor that detects the intensity of a magnetic field produced by a magnet 48*a* attached to the outer door 34 on a surface thereof that faces the loading/unloading port 32. The second sensor 48 is electrically connected to the control device 46. The second sensor 48 may electrically be connected to the control device 46 through a wireless link.

Figure 10B:
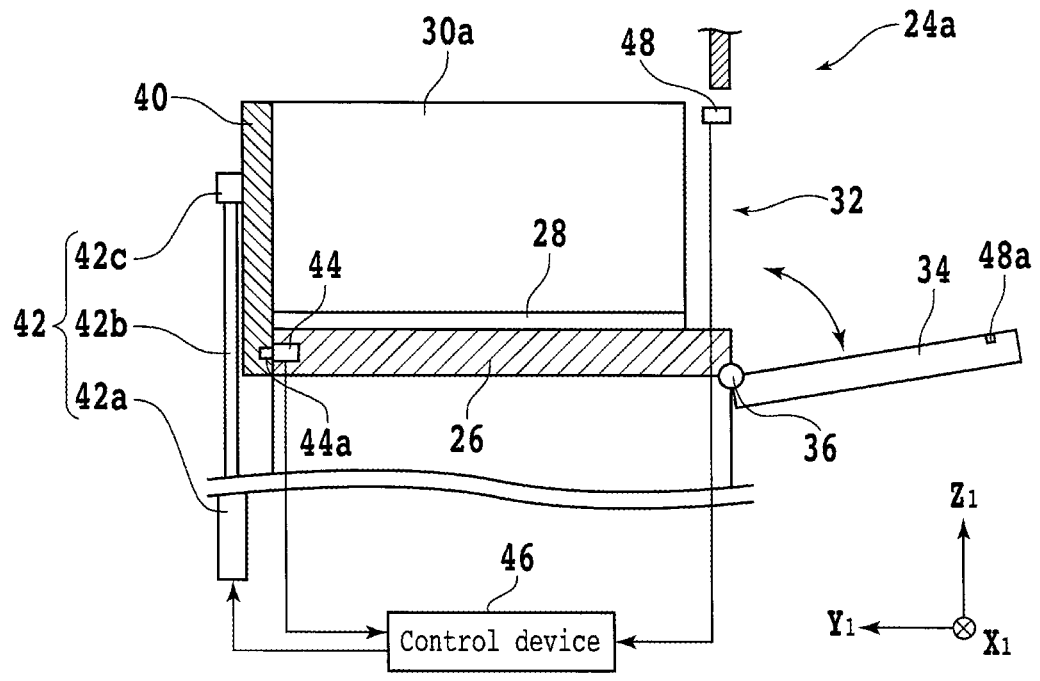
FIG. 10B is a side elevational view, partly in cross section, illustrating a manner in which the outer door is open and an inner door is closed.

FIG. 10B illustrates, in side elevation and partly in cross section, a manner in which the outer door 34 is open and in which the inner door 40 is closed. In FIG. 10B, the control device 46 is illustrated in functional block form. When the outer door 34 is opened and the magnet 48*a* is then moved away from the second sensor 48 as illustrated in FIG. 10B, the intensity of the magnetic field produced by the magnet 48*a* becomes weaker at the position of the second sensor 48.

Therefore, it is possible to determine whether or not the outer door 34 is open, on the basis of the intensity of the magnetic field detected by the second sensor 48. Specifically, the second sensor 48 sends information regarding the detected intensity of the magnetic field, to the control device 46. If the intensity of the magnetic field detected by the second sensor 48 becomes weaker than a reference value, then the control device 46 determines that the outer door 34 is opened. If the intensity of the magnetic field detected by the second sensor 48 becomes stronger than the reference value, then the control device 46 determines that the outer door 34 is closed.

The control device 46 has a function as a first safety mechanism that limits access into the loader/unloader 8 from outside thereof. The first safety mechanism is realized when the control device 46 appropriately controls the air-actuated lock mechanism that keeps the outer door 34 closed.

Specifically, if the control device 46 determines that the outer door 34 is closed and that the inner door 40 is open, then the control device 46 controls the lock mechanism to keep the outer door 34 closed. Since the control device 46 determines whether or not the outer door 34 is to be opened, the operator is prevented from erroneously accessing movable components positioned in the loader/unloader 8 while those movable components are in operation.

Further, the control device 46 has a function as a second safety mechanism that limits access into the loader/unloader 8 from outside thereof. The second safety mechanism is realized when the control device 46 appropriately controls a power supply of the loader/unloader 8. Specifically, if the control device 46 determines that the outer door 34 is open and that the inner door 40 is closed, then when the inner door 40 is opened for some reason, the control device 46 turns off the power supply of the loader/unloader 8.

The second safety mechanism shuts off the loader/unloader 8 in situations where both the outer door 34 and the inner door 40 are simultaneously opened. As the control device 46 thus appropriately manages the power supply of the loader/unloader 8, the operator is prevented from erroneously accessing movable components positioned in the loader/unloader 8 while those movable components are in operation.

Figure 11A:
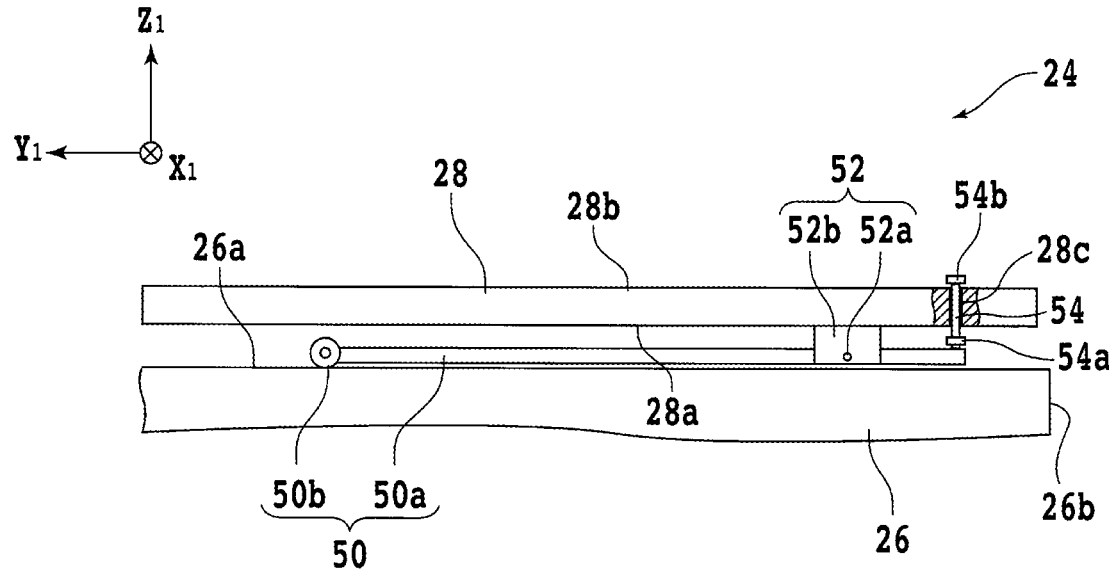
FIG. 11A is a side elevational view, partly in cross section, illustrating a cassette rest base, etc.
Figure 11B:
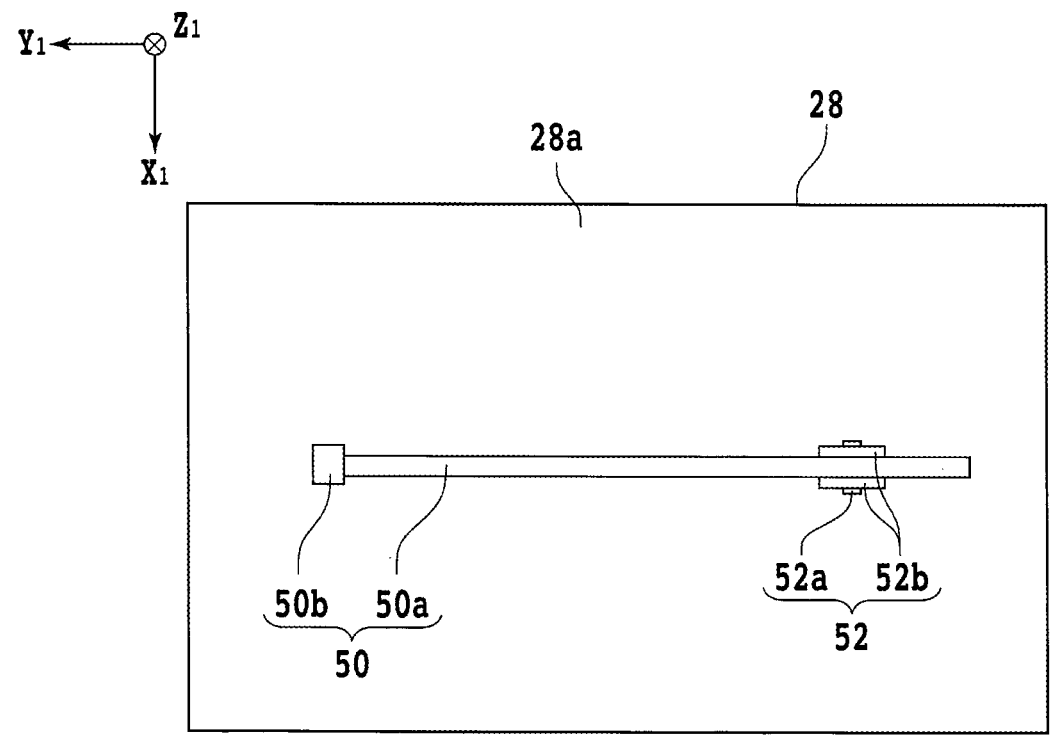
FIG. 11B is a bottom view illustrating the cassette rest base.

FIG. 11A illustrates, in side elevation and partly in cross section, the cassette rest base 28, etc., and FIG. 11B illustrates, in bottom view, the cassette rest base 28. A stopper 50 is disposed on a lower surface 28*a* of the cassette rest base 28. The stopper 50 includes a square bar 50*a* that is elongate in depthwise directions of the housing 22, for example. However, the length of the square bar 50*a* in the depthwise directions is smaller than the length of the cassette rest base 28 in the depthwise directions. The square bar 50*a* is made of metal such as stainless steel, for example. However, the square bar 50*a* is not essentially limited to any materials, shapes, etc.

A rotational shaft (not illustrated) that extends along widthwise directions (X₁-axis directions) substantially perpendicular to the heightwise directions and the depthwise directions is mounted on an end of the square bar 50*a* that is positioned inside in the depthwise directions (i.e., an inner end of the square bar 50*a* closer to the inner door 40). A roller 50*b* is rotatably supported on the rotational shaft. The roller 50*b* has a diameter smaller than the distance between the lower surface 28*a* of the cassette rest base 28 and an upper surface 26*a* of the support base 26.

A shaft mechanism 52 by which the square bar 50*a* is rotatably supported is disposed at a position between the inner end of the square bar 50*a* and an outer other end thereof. The shaft mechanism 52 includes a rotational shaft 52*a* extending along widthwise directions of the housing 22. The rotational shaft 52*a* is coupled to the square bar 50*a* at a position closer to the other end (outer end) of the square bar 50*a* than the center thereof in longitudinal directions (depthwise directions).

The rotational shaft 52*a* has both ends that are spaced apart in the widthwise directions and that are inserted in respective bearing holes defined in a pair of bearings 52*b* fixed to the lower surface 28*a* of the cassette rest base 28. The square bar 50*a* is thus supported by the bearings 52*b* so as to be rotatable about the rotational shaft 52*a* in a plane parallel to the heightwise directions and the depthwise directions (i.e., in a plane perpendicular to the widthwise directions).

As described above, the rotational shaft 52*a* is coupled to the square bar 50*a* at the position closer to the other end of the square bar 50*a* than the center thereof in the longitudinal directions. Therefore, the moment acting on the stopper 50 about the rotational shaft 52*a* due to gravity is oriented so as to move the inner end of the square bar 50*a* downwardly. In other words, unless sufficient forces are applied to the square bar 50*a*, the inner end of the square bar 50*a* is lower in position than the other end thereof due to gravity.

Therefore, when the cassette rest base 28 in its entirety is positioned in the inner storing area 38*b*, the roller 50*b* is held in contact with the upper surface 26*a* of the support base 26. When the cassette rest base 28 is moved over the support base 26, the roller 50*b* rolls on the upper surface 26*a* of the support base 26.

A pin (presser) 54 that is elongate in the heightwise directions has a lower end coupled to the other end of the square bar 50*a*. The pin 54 is inserted in a through hole 28*c* defined in the cassette rest base 28 at a position aligned with the pin 54 and extending in the heightwise directions. The through hole 28*c* is of a size that is large enough to allow the pin 54 inserted therein to move in the heightwise directions.

The length of the pin 54 in the heightwise directions is larger than the thickness of the cassette rest base 28. When the roller 50*b* is held in contact with the upper surface 26*a* of the support base 26, the pin 54 has an upper portion thereof exposed on an upper surface 28*b* of the cassette rest base 28. A disk-shaped button 54*b* that is larger in diameter than the pin 54 is fixed to the exposed upper portion of the pin 54.

When the button 54*b* fixed to the pin 54 is pressed downwardly, the other end of the square bar 50*a* is moved downwardly, moving the inner end of the square bar 50*a* upwardly, i.e., moving the roller 50*b* upwardly. A ring 54*a* having an outside diameter larger than the diameter of the through hole 28*c* is fixed to a lower end portion of the pin 54.

Figure 12A:
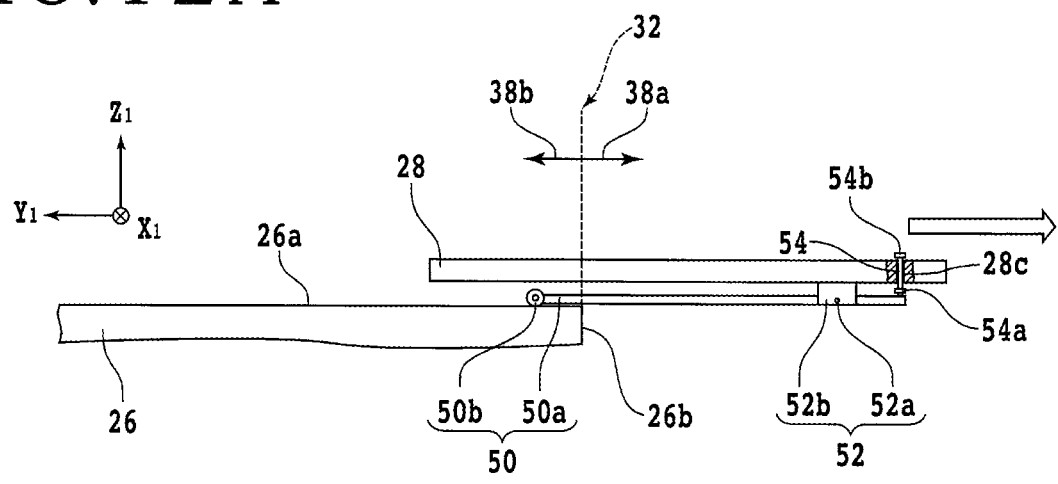
FIG. 12A is a side elevational view, partly in cross section, illustrating a manner in which the cassette rest base is pulled out of an inner storing region.

FIG. 12A illustrates, in side elevation and partly in cross section, a manner in which the cassette rest base 28 is pulled out of the inner storing area 38*b*. The cassette rest base 28 that is mounted on the abovementioned guide mechanism (not illustrated) for sliding movement with respect to the support base 26 can be pulled out of the inner storing area 38*b* through the loading/unloading port 32.

When the cassette rest base 28 is slid outwardly until the roller 50*b* that has rolled on the upper surface 26*a* of the support base 26 is positioned outside of an outer end of the upper surface 26*a*, the inner end of the square bar 50*a* moves downwardly on account of the moment acting on the stopper 50 about the rotational shaft 52*a* due to gravity. Therefore, the roller 50*b* drops off the support base 26.

Figure 12B:
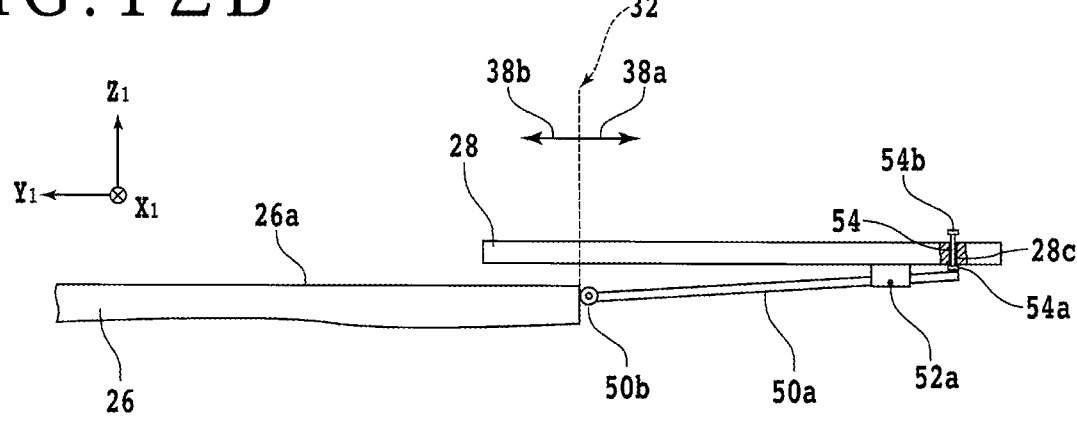
FIG. 12B is a side elevational view, partly in cross section, illustrating a manner in which a roller drops off a support base.

FIG. 12B illustrates, in side elevation and partly in cross section, a manner in which the roller 50*b* drops off the support base 26. When the roller 50*b* drops off the support base 26, the roller 50*b* is located at a position lower than the upper surface 26*a* of the support base 26. As a result, the cassette rest base 28 is prevented from moving back into the inner storing area 38*b* by the stopper 50 contacting an outer side surface 26*b* of the support base 26. As the roller 50*b* drops off the support base 26, the pin 54 ascends, bringing the ring 54*a* into contact with the lower surface 28*a* of the cassette rest base 28.

The stopper 50 and the shaft mechanism 52 thus function as a movement limiting mechanism that limits the movement of the cassette rest base 28 back into the inner storing area 38*b* when the cassette rest base 28 has been pulled out of the inner storing area 38*b*. The movement limiting mechanism thus makes it easy to load and unload the cassette 30 that is relatively heavy, for example, thereby reducing the risk of damage to the workpiece 11, etc., stored in the cassette 30, as the cassette 30 is loaded and unloaded.

Specifically, when the operator attempts to place the cassette 30 on the cassette rest base 28 (i.e., to load the cassette 30 onto the cassette rest base 28) that has been pulled out of the inner storing area 38*b*, if the cassette rest base 28 is accidentally moved back into the inner storing area 38*b*, the risks of the operator dropping the cassette 30 and causing the cassette 30 to hit the outer door 34 are likely to increase. However, according to the present embodiment, inasmuch as the movement limiting mechanism limits the movement of the cassette rest base 28 back into the inner storing area 38*b*, these risks are sufficiently reduced.

In addition, when the operator attempts to unload the cassette 30 from the cassette rest base 28, if the cassette rest base 28 is accidentally moved back into the inner storing area 38b, the risks of the operator causing the cassette 30 that is to be unloaded, to hit a portion of the housing 22 that is positioned above the loading/unloading port 32 are likely to increase. However, according to the present embodiment, inasmuch as the movement limiting mechanism limits the movement of the cassette rest base 28 back into the inner storing area 38b, the risk is sufficiently reduced.

Inasmuch as the movement limiting mechanism according to the present embodiment is realized by the rotation of the square bar 50a in the plane parallel to the heightwise directions and the depthwise directions, the cassette storing mechanisms 24 do not have an increased size in the widthwise directions which would otherwise result from a movement limiting mechanism positioned outwardly of the cassette rest base 28 in the widthwise directions. Accordingly, the cassette storing mechanisms 24 are made compact in the widthwise directions compared with a case where a movement limiting mechanism is positioned outwardly of the cassette rest base 28 in the widthwise directions.

Conditions of the length of the square bar 50a, the position of the shaft mechanism 52, etc., are established such that, when the square bar 50a drops off the support base 26, the area in which the cassette 30 on the cassette rest base 28 is placed is completely exposed out of the housing 22. Consequently, the operator can place the cassette 30 on the cassette rest base 28 (i.e., load the cassette 30 onto the cassette rest base 28) while the cassette 30 is completely exposed out of the housing 22.

Figure 12C:
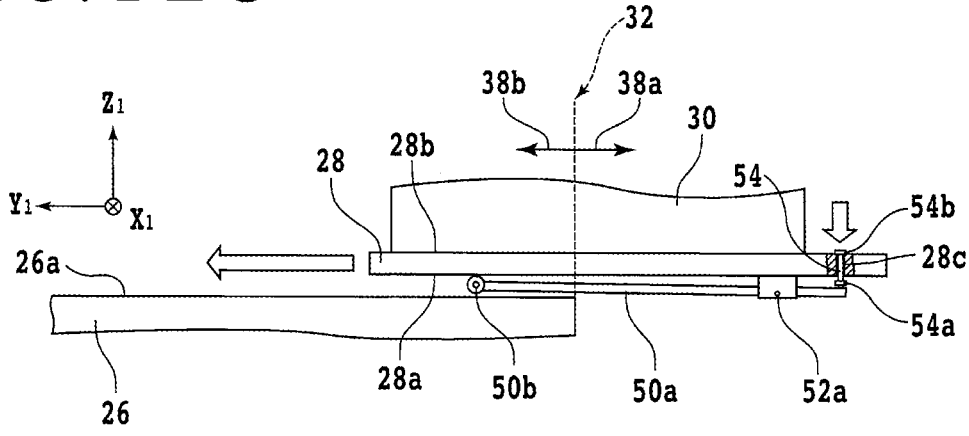
FIG. 12C is a side elevational view, partly in cross section, illustrating a manner in which the cassette rest base is returned into the inner storing region.

FIG. 12C illustrates, in side elevation and partly in cross section, a manner in which the cassette rest base 28 is returned into the inner storing area 38b. For returning the cassette rest base 28 into the inner storing area 38b, the operator presses the button 58b downwardly. The operator continuously presses the button 54b downwardly until a lower surface of the button 54b is brought into contact with the upper surface 28b of the cassette rest base 28. At the same time, the pin 54 is lowered, moving the roller 50b upwardly from the upper surface 26a of the support base 26.

The roller 50b ascends until it contacts the lower surface 28a of the cassette rest base 28, for example. As a result, the cassette rest base 28 is no longer limited with respect to its movement back into the inner storing area 38b and can thus be returned into the inner storing area 38b. The operator then manually pushes the cassette rest base 28 into the inner storing area 38b while depressing the button 54b.

The cassette storing mechanisms 24 are not limited to the illustrated structural details. According to a modification, two stoppers 50 are disposed in respective two different positions in the widthwise directions of the cassette rest base 28, for example. According to the modification, two through holes 28c are defined in the cassette rest base 28 at respective positions corresponding to two pins 54 that are spaced apart in the widthwise directions. The two stoppers 50 include two respective square bars 50a that may be coupled to each other at any positions. With the two square bars 50a coupled to each other, one of the pins 54 may be dispensed with.

Further alternatively, the through hole 28c may be defined in an area of the cassette rest base 28 where the cassette 30 is placed. With the through hole 28c thus defined, when the cassette 30 is placed on the cassette rest base 28, the pin 54 is depressed by the weight of the cassette 30. In other words, the operator is not required to depress the pin 54 to release the cassette rest base 28 from the stopper 50.

As illustrated in FIG. 9, the loader/unloader 8 includes a lifting and lowering mechanism 56 disposed opposite the inner storing areas 38b across the inner doors 40. The lifting and lowering mechanism 56 has a support post 56a that is elongate in the heightwise directions. A pair of guide rails (not illustrated) that extend in the longitudinal directions of the support post 56a (i.e., in the heightwise directions) are disposed on a side surface of the support post 56a that faces the inner doors 40.

A lifting and lowering base 58, which is shaped as a flat plate, is mounted on the guide rails on the support post 56a, for sliding movement in the heightwise directions. The lifting and lowering base 58 has an upper surfaces that is generally flat. The lifting and lowering base 58 slides in the heightwise directions along the guide rails while keeping its upper surface generally perpendicular to the heightwise directions.

An electric motor (not illustrated) and a drive pulley (not illustrated) coupled to the rotational shaft of the electric motor are disposed on a lower portion of the support post 56a. A driven pulley (not illustrated) is disposed on an upper portion of the support post 56a. A toothed endless belt (not illustrated) is trained around the drive pulley and the driven pulley. The toothed endless belt has a portion fixed to the lifting and lowering base 58. When the electric motor is energized to rotate the rotational shaft thereof in one direction, the lifting and lowering base 58 is lifted. When the electric motor is reversed to rotate the rotational shaft thereof in the opposite direction, the lifting and lowering base 58 is lowered.

The lifting and lowering base 58 supports, on its upper surface, a temporary rest unit 60 that temporarily places therein workpiece units 17 unloaded from the cassettes 30 in the cassette storing mechanisms 24, workpiece units 17 to be loaded into the cassettes 30 in the cassette storing mechanisms 24, and trays 33 with boards 31 placed thereon. The temporary rest unit 60 has a casing 62, which is shaped as a rectangular tube, having a opening facing the cassette storing mechanisms 24. The casing 62 houses therein a plurality of transport units (transport mechanisms) 64 that are movable in the depthwise directions while individually gripping workpiece units 17 and trays 33.

For transferring workpiece units 17 and trays 33 between the temporary rest unit 60 and a first cassette 30a of the first cassette storing mechanism 24a, the height of the temporary rest unit 60 is adjusted to match the height of the first cassette storing mechanism 24a. In other words, the temporary rest unit 60 is placed in a first transport area $B_{1a}$ that is positioned adjacent to a first rest area $A_{1a}$ where the first cassette storing mechanism 24a is placed, across the inner door 40 in the depthwise directions.

When the temporary rest unit 60 is placed in the first transport area $B_{1a}$ and the inner door 40 of the first cassette storing mechanism 24a is then opened, the transport units 64 are able to access the first cassette 30a in the first rest area $A_{1a}$. The transport units 64 then grip and pull out workpiece units 17 and trays 33 stored in the first cassette 30a into the temporary rest unit 60, for example.

The transport units 64 also grip workpiece units 17 and trays 33 temporarily placed in the temporary rest unit 60 and store them into the first cassette 30a. The transport units 64 are thus able to transport workpieces 11 and boards 31 between the temporary rest unit 60 in the first transport area $B_{1a}$ and the first cassette 30a in the first rest area $A_{1a}$.

For transferring workpiece units 17 and trays 33 between the temporary rest unit 60 and a second cassette 30b of the second cassette storing mechanism 24b, the height of the temporary rest unit 60 is adjusted to match the height of the second cassette storing mechanism 24b. In other words, the temporary rest unit 60 is placed in a first transport area $B_{1b}$ that is positioned adjacent to a first rest area $A_{1b}$ where the second cassette storing mechanism 24b is placed, across the inner door 40 in the depthwise directions.

When the temporary rest unit 60 is placed in the first transport area $B_{1b}$ and the inner door 40 of the second cassette storing mechanism 24b is then opened, the transport units 64 are able to access the second cassette 30b in the first rest area $A_{1b}$. The transport units 64 then grip and pull out workpiece units 17 and trays 33 stored in the second cassette 30b, into the temporary rest unit 60.

The transport units 64 also grip workpiece units 17 and trays 33 temporarily placed in the temporary rest unit 60 and store them into the second cassette 30b. The transport units 64 are thus able to transport workpieces 11 and boards 31 between the temporary rest unit 60 in the first transport area $B_{1b}$ and the second cassette 30b in the first rest area $A_m$.

A rest base 66 is disposed in the housing 22 upwardly of the second cassette storing mechanism 24b. The housing 22 has a vertically through opening 22b defined in a ceiling 22a thereof, directly above the rest base 66. Another vertically through opening 6a is defined in the transport path 6 directly above the rest base 66 and the opening 22b.

For transporting workpiece units 17 and trays 33 between the transport carriage 10 and the temporary rest unit 60, the transport carriage 10 that includes a receptacle (cassette) 102 capable of housing workpiece units 17 and trays 33 is first moved to a position over the opening 6a. Then, the transport carriage 10 lowers the receptacle 102 suspended by suspending members 112 and places the receptacle 102 on an upper surface of the rest base 66 (second rest area $A_2$) thereon.

Further, the height of the temporary rest unit 60 is adjusted to match the height of the receptacle 102 placed on the rest base 66. In other words, the temporary rest unit 60 is placed in a second transport area $B_2$ that is positioned adjacent to the rest base 66 in the depthwise directions. The transport units 64 are now able to access the receptacle 102 placed in the second rest area $A_2$. The transport units 64 then grip and pull out workpiece units 17 and trays 33 stored in the receptacle 102, into the temporary rest unit 60, for example.

The transport units 64 also grip workpiece units 17 and trays 33 temporarily placed in the temporary rest unit 60 and store them into the receptacle 102. The transport units 64 are thus able to transport workpieces 11 and boards 31 between the temporary rest unit 60 in the second transport area $B_2$ and the receptacle 102 placed on the rest base 66. The lifting and lowering mechanism 56 that lifts and lowers the temporary rest unit 60 and the transport units 64 in the temporary rest unit 60 are electrically connected to the abovementioned control device 46. The lifting and lowering mechanism 56 and the transport units 64 are controlled in their operation by the control device 46.

To the control device 46, there are electrically connected a receiver 68 that receives signals (information) from an external apparatus and sends the received signals to the control device 46, and a transmitter 70 that transmits signals (information) received from the control device 46, to the external apparatus. For example, the receiver 68 receives signals transmitted from the control unit 12 of the transport system 2 and sends the received signals to the control device 46.

The control device 46 controls operation of various components of the loader/unloader 8 on the basis of signals received from the receiver 68, for example. Further, the control device 46 generates notification signals, for example, and sends the generated signals to the transmitter 70. The transmitter 70 transmits the signals received from the control device 46, to the control unit 12 of the transport system 2, for example.

The loader/unloader 8 according to the present embodiment can transport workpiece units 17 and trays 33 between cassettes 30 each storing a plurality of workpiece units 17 and trays 33 and receptacles 102 of transport carriages 10. Accordingly, workpiece units 17 and trays 33 can be transported to the processing apparatus 4 at suitable times, and workpieces 11 that have been processed by the processing apparatus 4 and boards 31 that have been used can be retrieved at suitable times.

Figure 13A:
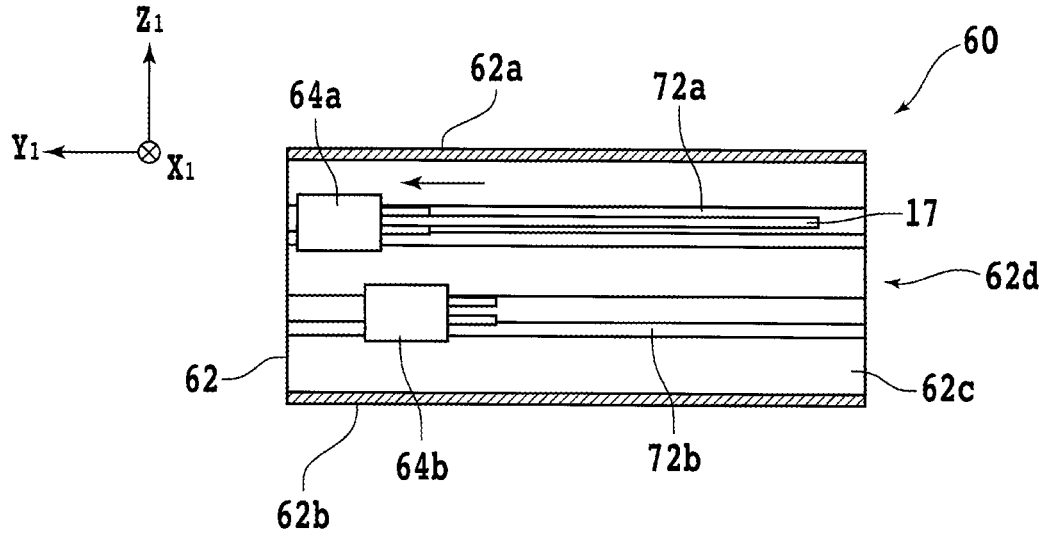
FIG. 13A is a side elevational view, partly in cross section, illustrating a manner in which a workpiece unit is temporarily placed on two upper guide rails.
Figure 13B:
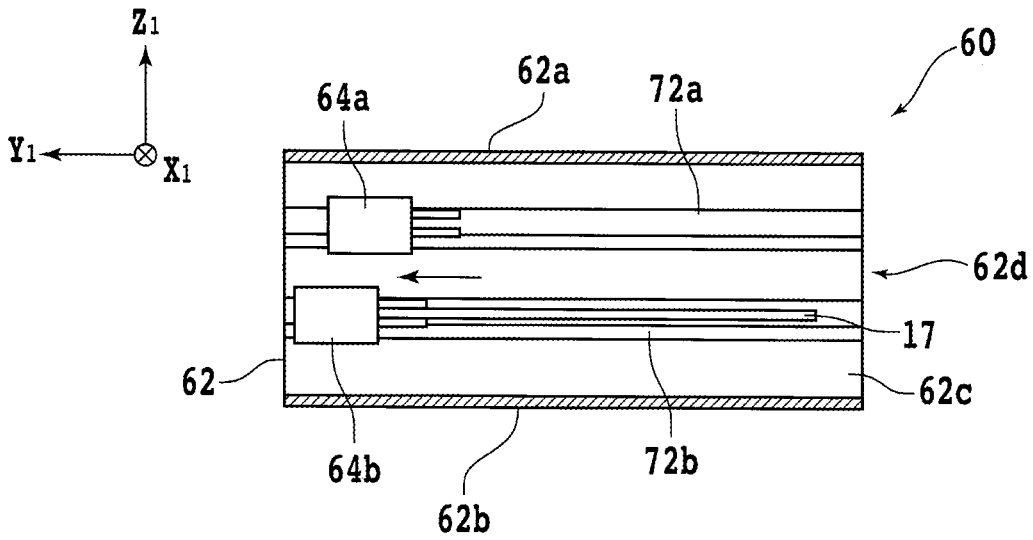
FIG. 13B is a side elevational view, partly in cross section, illustrating a manner in which a workpiece unit is temporarily placed on two lower guide rails.

FIG. 13A illustrates, in side elevation and partly in cross section, a manner in which a workpiece unit 17 is temporarily placed on an upper stage in the temporary rest unit 60, and FIG. 13B illustrates, in side elevation and partly in cross section, a manner in which a workpiece unit 17 is temporarily placed on a lower stage in the temporary rest unit 60. Trays 33 are temporarily placed in the temporary rest unit 60 in a similar manner as workpiece units 17. The temporary rest unit 60 has a casing 62 including an upper panel 62a disposed in an upper portion thereof and a lower panel 62b disposed in a lower portion thereof, for example.

The upper panel 62a has two ends in the widthwise directions that are connected to respective upper ends of two posts (not illustrated). The lower panel 62b has two ends in the widthwise directions that are connected to respective lower ends of the posts. In other words, the upper panel 62a and the lower panel 62b are connected to each other by the two posts. The casing 62 includes a pair of side panels 62c that are disposed in a space defined between the upper panel 62a and the lower panel 62b and that are spaced from each other in the widthwise directions. The casing 62 also has an opening 62d defined in an end thereof that faces the cassette storing mechanism 24.

Two upper guide rails (first temporary rest members) 72a are disposed at equal heights as the upper stage on inner sides of the side panels 62c and elongate in the depthwise directions. Each of the upper guide rails 72a has a support surface used for supporting a workpiece unit 17 (frame 15) etc., from below and a side surface defining the position of a workpiece unit 17 (frame 15) etc., in the widthwise directions.

Two lower guide rails (second temporary rest members) 72b are disposed at equal heights as the lower stage on the inner sides of the side panels 62c and elongate in the depthwise directions. The lower guide rails 72b are positioned below the upper guide rails 72a. Each of the lower guide rails 72b has a support surface used for supporting a workpiece unit 17 (frame 15) etc., from below and a side surface defining the position of a workpiece unit 17 (frame 15) etc., in the widthwise directions.

Since the upper guide rails 72a and the lower guide rails 72b are disposed at different heights or vertical positions within the casing 62, the temporary rest unit 60 can simultaneously house two workpiece units 17, etc., therein. Therefore, workpiece units 17, etc., can be transported efficiently between receptacles 102 of transport carriages 10 or cassettes 30 and the temporary rest unit 60, compared with a case where a temporary rest unit houses only one workpiece unit 17, etc.

For example, the upper guide rails 72a are used to house a workpiece unit 17, etc., to be processed in the casing 62, whereas the lower guide rails 72b are used to house a processed workpiece unit 17, etc., in the casing 62. However, there is no limitation on a manner in which workpiece units 17, etc., are housed in the casing 62. The upper guide rails 72*a* may be used to house a processed workpiece unit 17, etc., in the casing 62, whereas the lower guide rails 72*b* may be used to house a workpiece unit 17, etc., to be processed in the casing 62.

A first transport unit 64*a* is disposed in the casing 62 at a height or vertical position aligned with the upper guide rails 72*a*, and a second transport unit 64*b* is disposed in the casing 62 at a height or vertical position aligned with the lower guide rails 72*b*. Each of the transport units 64*a* and 64*b*, i.e., the transport units 64, includes a gripper including two plates disposed in upper and lower positions. The two plates are disposed such that the lower surface of the upper plate and the upper surface of the lower plate lie substantially parallel to each other.

The gripper of each of the transport units 64 further includes an actuator (not illustrated) that adjusts the distance between the two plates. The gripper grips the frame 15 of a workpiece unit 17, etc., when the actuator reduces the distance between the two plates. The gripper releases the frame 15 of a workpiece unit 17, etc., when the actuator increases the distance between the two plates.

Each of the transport units 64 further includes a horizontal moving mechanism (not illustrated) that moves the gripper in the depthwise directions. The horizontal moving mechanism has a linear guide (not illustrated) extending along the depthwise directions. The transport unit 64 is slidably coupled to the linear guide.

For example, a driven pulley (not illustrated) having a rotational shaft substantially parallel to the widthwise directions is mounted on an end of the linear guide. A drive pulley (not illustrated) having a rotational shaft substantially parallel to the widthwise directions and an electric motor (not illustrated) whose rotational shaft is coupled to the drive pulley are mounted on the other end of the linear guide.

A toothed endless belt (not illustrated) is trained around the drive pulley and the driven pulley. The toothed endless belt has a portion fixed to the gripper. Consequently, when the electric motor is energized to rotate the rotational shaft thereof in one direction, the gripper is moved in one of the depthwise directions, and when the electric motor is reversed to rotate the rotational shaft thereof in the opposite direction, the gripper is moved in the other of the depthwise directions.

For temporarily placing a workpiece unit 17, etc., on the upper guide rails 72*a*, as illustrated in FIG. 13A, the lifting and lowering mechanism 56 adjusts the height of the temporary rest unit 60 to cause the height of the upper guide rails 72*a* to match the height of the receptacle 102 or the cassette 30 where the workpiece unit 17, etc., is housed.

Next, the gripper of the first transport unit 64*a* is moved into the receptacle 102 or the cassette 30. Then, the gripper of the first transport unit 64*a* grips the frame 15 of the workpiece unit 17, etc., housed in the receptacle 102 or the cassette 30. Thereafter, the gripper of the first transport unit 64*a* is moved away from the receptacle 102 or the cassette 30. The workpiece unit 17, etc., is now placed on the upper guide rails 72*a*.

The gripper of the first transport unit 64*a* operates similarly to house a workpiece unit 17, etc., temporarily placed on the upper guide rails 72*a*, into the receptacle 102 or the cassette 30. In this case, the gripper of the first transport unit 64*a* grips the workpiece unit 17, etc., temporarily placed on the upper guide rails 72*a*, and is thereafter moved into the receptacle 102 or the cassette 30.

For temporarily placing a workpiece unit 17, etc., on the lower guide rails 72*b*, as illustrated in FIG. 13B, the lifting and lowering mechanism 56 first adjusts the height of the temporary rest unit 60 to cause the height of the lower guide rails 72*b* to match the height of the receptacle 102 or the cassette 30 where the workpiece unit 17, etc., is housed.

Next, the gripper of the second transport unit 64*b* is moved into the receptacle 102 or the cassette 30. Then, the gripper of the second transport unit 64*b* grips the frame 15 of the workpiece unit 17, etc., housed in the receptacle 102 or the cassette 30. Thereafter, the gripper of the second transport unit 64*b* is moved away from the receptacle 102 or the cassette 30. The workpiece unit 17, etc., is now placed on the lower guide rails 72*b*.

The gripper of the second transport unit 64*b* operates similarly to house a workpiece unit 17, etc., temporarily placed on the lower guide rails 72*b*, into the receptacle 102 or the cassette 30. In this case, the gripper of the second transport unit 64*b* grips the workpiece unit 17, etc., temporarily placed on the lower guide rails 72*b*, and is thereafter moved into the receptacle 102 or the cassette 30.

For transporting workpiece units 17, etc., between a cassette 30 and a receptacle 102, the loader/unloader 8 operates, for example, as follows. First, the height of the temporary rest unit 60 is adjusted by the lifting and lowering mechanism 56, and a workpiece unit 17, etc., to be processed that is housed in the cassette 30 is pulled out onto the upper guide rails 72*a* in the temporary rest unit 60. Next, the temporary rest unit 60 is lifted by the lifting and lowering mechanism 56, and a processed workpiece unit 17, etc., housed in the receptacle 102 on the rest base 66 is pulled out onto the lower guide rails 72*b* in the temporary rest unit 60.

Then, the height of the temporary rest unit 60 is adjusted by the lifting and lowering mechanism 56, and the workpiece unit 17, etc., to be processed that is temporarily placed on the upper guide rails 72*a* is housed into the receptacle 102 on the rest base 66. In this manner, the processed workpiece unit 17, etc., is efficiently unloaded (retrieved) from the receptacle 102, and the workpiece unit 17, etc., to be processed is efficiently loaded (distributed) into the receptacle 102. However, the loader/unloader 8 may operate otherwise to transport workpiece units 17, etc. The upper guide rails 72*a* and the lower guide rails 72*b* may be functionally switched around, if necessary.

Figure 14A:
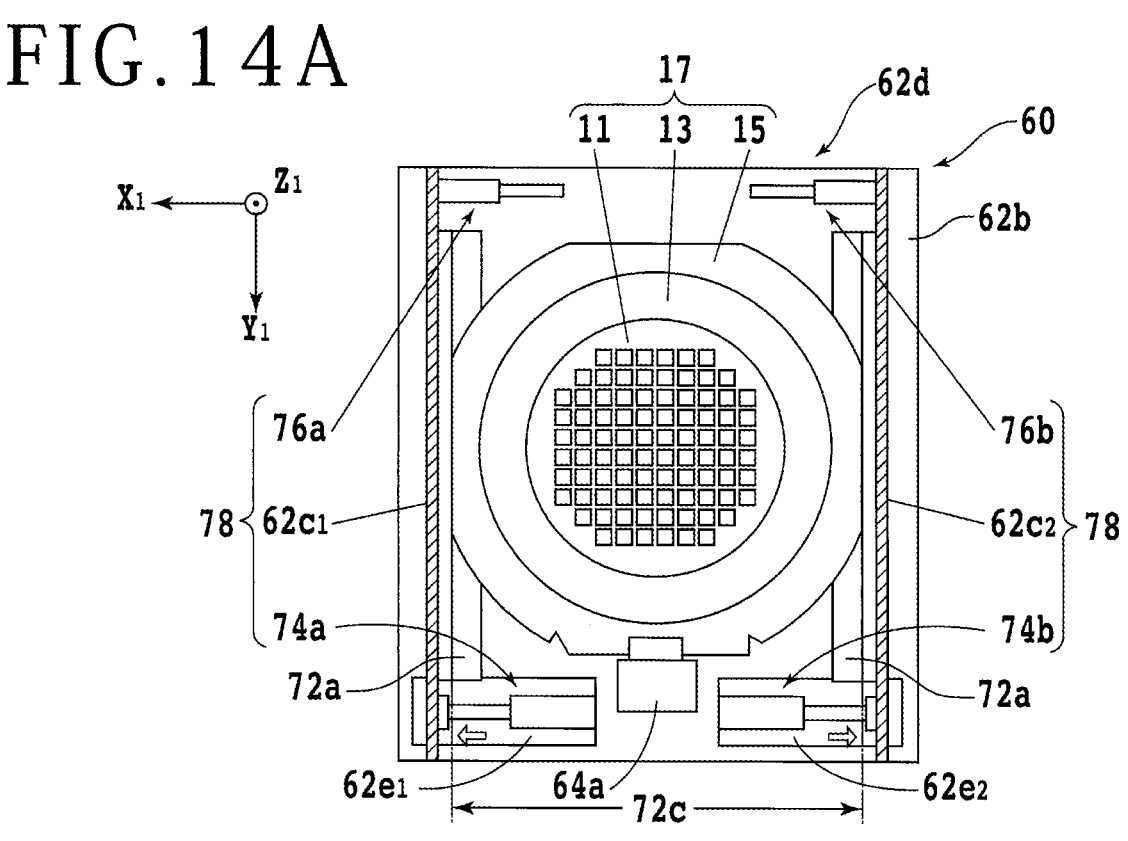
FIG. 14A is a plan view illustrating the two upper guide rails, etc.

FIG. 14A illustrates, in plan, the two upper guide rails 72*a*, etc. The upper guide rail 72*a* and the lower guide rail 72*b* that are positioned on one side in the widthwise directions are fixed to one of the side panels 62*c*, i.e., a first side panel 62*c*₁. The upper guide rail 72*a* and the lower guide rail 72*b* that are positioned on the other side in the widthwise directions are fixed to the other of the side panels 62*c*, i.e., a second side panel 62*c*₂.

The lower panel 62*b* has, in one end portion thereof in the depthwise directions, a first opening 62*e*₁ extending vertically through one side of the lower panel 62*b* in the widthwise directions and a second opening 62*e*₂ extending vertically through the other side of the lower panel 62*b* in the widthwise directions. The first side panel 62*c*₁ has an end portion in the depthwise directions that is inserted in the first opening 62*e*₁, and the second side panel 62*c*₂ has an end portion in the depthwise directions that is inserted in the second opening 62*e*₂.

A first air actuator 74*a* and a second air actuator 74*b* have respective proximal portions fixed to a lower surface of the lower panel 62*b* adjacent to the first opening 62*e*₁ and the second opening 62*e*₂. The first air actuator 74*a* has a movable member (e.g., a piston rod) connected to the end portion of the first side panel $62c_1$ that is inserted in the first opening $62e_1$. The second air actuator $74b$ has a movable member (e.g., a piston rod) connected to the end portion of the second side panel $62c_2$ that is inserted in the second opening $62e_2$.

A first guide mechanism $76a$ and a second guide mechanism $76b$ are disposed on the other end portion of the lower panel $62b$ in the depthwise directions. The first guide mechanism $76a$ includes a guide rail fixed to an upper surface of the lower panel $62b$ and extending in the widthwise directions and a slider fixed to a lower portion of the first side panel $62c_1$ and mounted on the guide rail for sliding movement in the widthwise directions. The second guide mechanism $76b$ includes a guide rail fixed to the upper surface of the lower panel $62b$ and a slider fixed to a lower portion of the second side panel $62c_2$ and mounted on the guide rail for sliding movement in the widthwise directions.

Therefore, when the first air actuator $74a$ and the second air actuator $74b$ operate to change the distance between the first side panel $62c_1$ and the second side panel $62c_2$, the distance between the two upper guide rails $72a$ is changed while the two upper guide rails $72a$ remain parallel to each other, and the distance between the two lower guide rails $72b$ is changed while the two lower guide rails $72b$ remain parallel to each other.

In other words, the first side panel $62c_1$, the first air actuator $74a$, the first guide mechanism $76a$, the second side panel $62c_2$, the second air actuator $74b$, and the second guide mechanism $76b$ function as a distance adjusting mechanism $78$ that adjusts the distance between the two upper guide rails $72a$ and the distance between the two lower guide rails $72b$.

The first air actuator $74a$ and the second air actuator $74b$ are controlled in their operation by the control device $46$. Specifically, the control device $46$ controls operation of the first air actuator $74a$ and the second air actuator $74b$ depending on the size of a workpiece unit $17$ (workpiece $11$) etc., to adjust the distance between the two upper guide rails $72a$ and the distance between the two lower guide rails $72b$.

For example, if the workpiece $11$ has a diameter of $300$ mm, then a frame $15$ having a width of approximately $400$ mm is used with the workpiece $11$. In this case, the control device $46$ operates the first air actuator $74a$ and the second air actuator $74b$ to make the distance $72c$ between side surfaces of the two upper guide rails $72a$ (i.e., the distance $72c$ between side surfaces of the two lower guide rails $72b$) slightly (e.g., a few mm) larger than $400$ mm.

Further, for example, if the workpiece $11$ has a diameter of $200$ mm, then a frame $15$ having a width of approximately $300$ mm is used with the workpiece $11$. In this case, the control device $46$ operates the first air actuator $74a$ and the second air actuator $74b$ to make the distance $72c$ between side surfaces of the two upper guide rails $72a$ (i.e., the distance $72c$ between side surfaces of the two lower guide rails $72b$) slightly (e.g., a few mm) larger than $300$ mm.

Figure 14B:
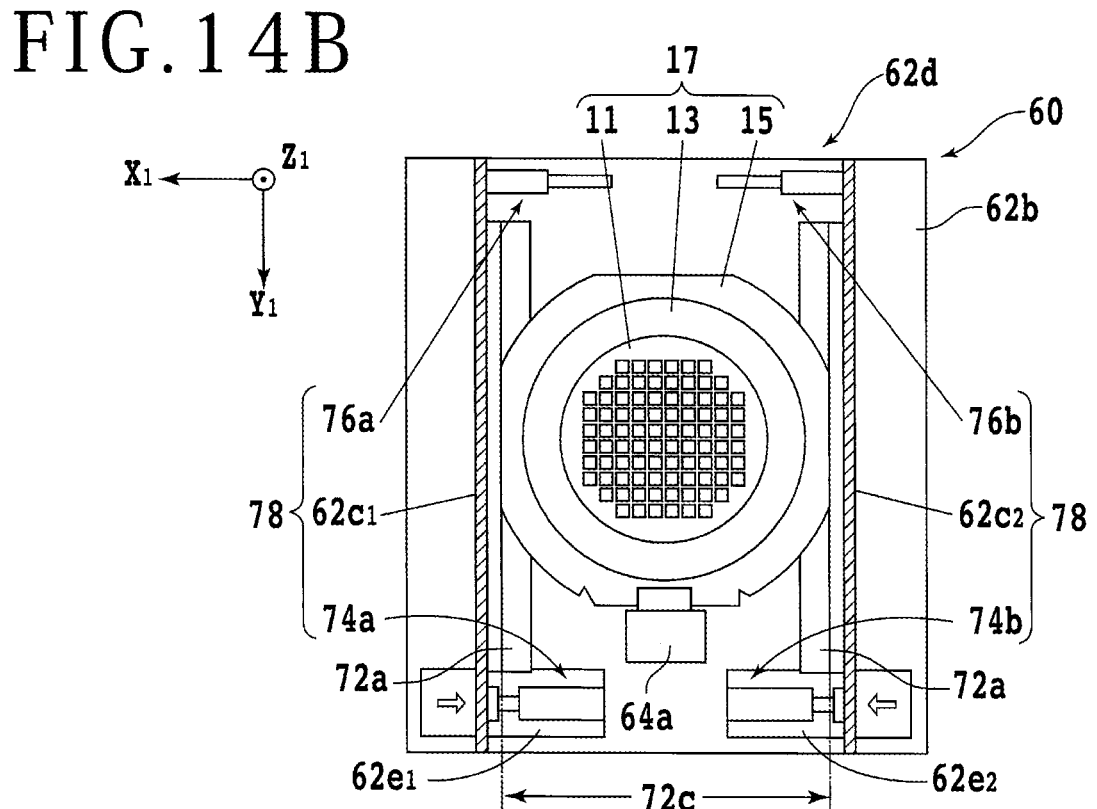
FIG. 14B is a plan view illustrating a manner in which the distance between the two upper guide rails is reduced.

FIG. 14B illustrates, in plan, a manner in which the distance between the two upper guide rails $72a$ is reduced. When the distance between the two upper guide rails $72a$ is reduced, the distance between the two lower guide rails $72b$ is also reduced. By thus adjusting the distance between the two upper guide rails $72a$ and the distance between the two lower guide rails $72b$ according to the diameter of the workpiece $11$, it is possible to temporarily place workpieces $11$ having different sizes, in the temporary rest unit $60$. In other words, a single temporary rest unit $60$ can deal with a plurality of types of workpiece units $17$, etc., having different sizes, as they are transported.

Figure 15A:
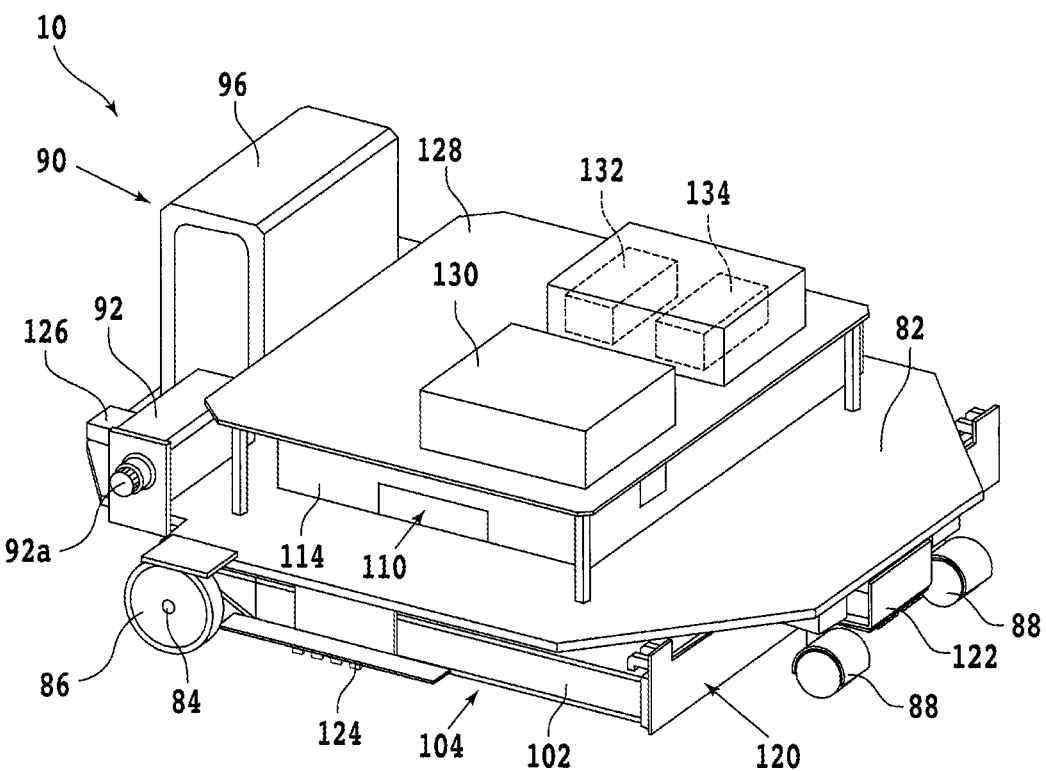
FIG. 15A is a perspective view illustrating an upper side of a transport carriage.
Figure 15B:
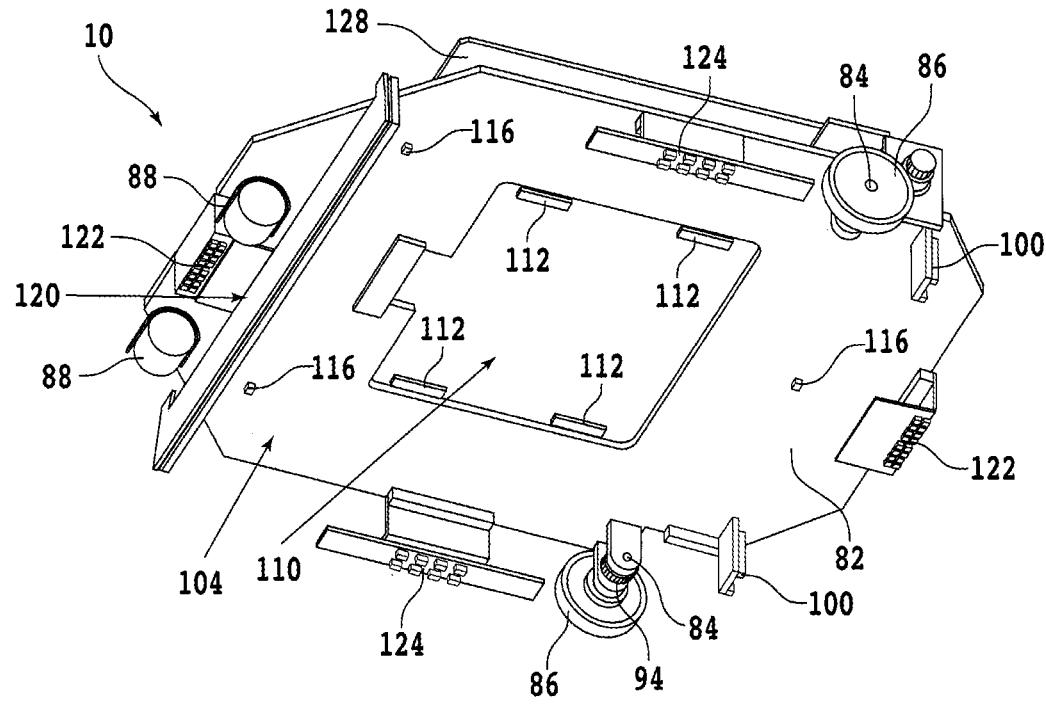
FIG. 15B is a perspective view illustrating a bottom side of the transport carriage.

FIG. 15A illustrates, in perspective, an upper side of each of the transport carriages $10$ that travel on the transport path $6$ to transport workpiece units $17$ and trays $33$. FIG. 15B illustrates, in perspective, a bottom side of the transport carriage $10$. As illustrated in FIGS. 15A and 15B, the transport carriage $10$ includes a plate-shaped carriage frame $82$ on which various components are mounted. A pair of wheel shafts $84$ are disposed on respective sides of a front end portion of the carriage frame $82$. The wheel shafts $84$ are mounted on a lower surface of the carriage frame $82$ so as to protrude outwardly from side edges of the carriage frame $82$.

Wheels (front wheels) $86$ are fixed to respective outer ends of the wheel shafts $84$. The wheels $86$ are thus disposed in a pair at respective positions that are spaced from each other in widthwise directions of the carriage frame $82$ (in carriage widthwise directions). Another pair of wheels (rear wheels) $88$ are disposed at respective positions on a rear end portion of the carriage frame $82$ that are spaced from each other in the widthwise directions of the carriage frame $82$. The wheels $88$ are, for example, casters that are rotatable $360°$ about rotational shafts extending in heightwise directions, and are mounted on the lower surface of the carriage frame $82$. The wheels $86$ and the wheels $88$ roll on the transport path $6$ to allow the transport carriage $10$ to travel on the transport path $6$.

A drive unit $90$ that drives the wheels $86$ is mounted on the front end portion of the carriage frame $82$. The drive unit $90$ includes a pair of electric motors (drive sources) $92$ coupled to the respective wheels $86$ through the wheel shafts $84$, etc. The electric motors $92$ have respective rotational shafts (output shafts) $92a$ and generate power for rotating the wheels $86$.

As illustrated in FIG. 15B, pulleys $94$ are mounted on respective inner ends of the wheel shafts $84$. Endless connecting members (not illustrated) such as belts or chains are trained around the rotational shafts $92a$ of the electric motors $92$ and the pulleys $94$. The rotational shafts $92a$ of the electric motors $92$, the pulleys $94$, and the endless connecting members are included in power transmitting mechanisms that interconnect the wheel shafts $84$ and the electric motors $92$. Power (rotational power) generated by the electric motors $92$ is transmitted through the power transmitting mechanisms to the wheel shafts $84$, rotating the wheels $86$.

The drive unit $90$ independently controls the directions in which the wheels $86$ rotate with the pair of electric motors $92$. The drive unit $90$ moves the transport carriage $10$ forward or backward by rotating the wheels $86$ in the same direction. The drive unit $90$ turns the transport carriage $10$ about a rotational axis along the heightwise directions to control the direction in which the transport carriage $10$ travels, by rotating the wheels $86$ in directions opposite to each other. The wheels $86$ and the wheels $88$ are not limited to any particular structures. For example, Mecanum wheels each having a plurality of inclined barrel-shaped (tube-shaped) rotors mounted on an outer circumferential surface used for contact with the transport path $6$ may be used as the wheels $86$ and the wheels $88$.

A battery (secondary battery) $96$ that supplies electric power to the electric motors $92$, etc., is electrically connected to the drive unit $90$ through feeder wires (not illustrated). The battery $96$ is mounted on the front end portion of the carriage frame $82$, for example, and supplies electric power for rotating the wheels $86$, to the electric motors $92$. The battery $96$ includes a lithium ion battery or the like.

Figure 16:
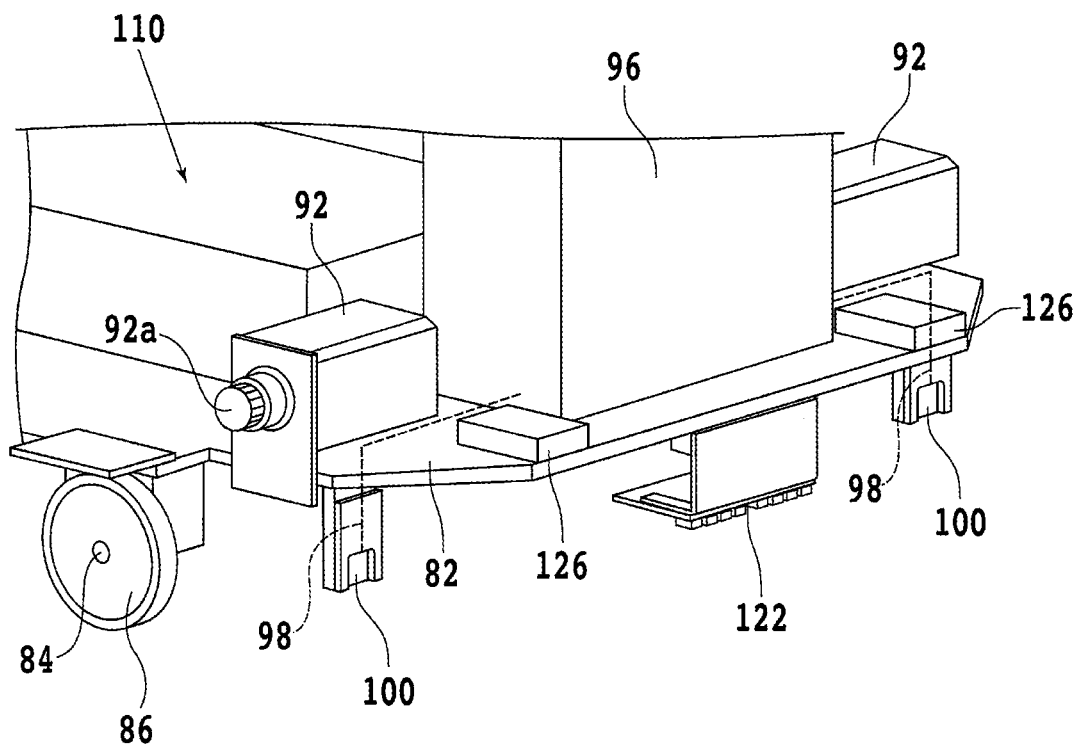
FIG. 16 is an enlarged fragmentary perspective view illustrating a front end portion of the transport carriage.

FIG. 16 illustrates, in enlarged fragmentary perspective, a front end portion of the transport carriage 10. A pair of terminals (power receiving terminals) 100 that are connected to the battery 96 through charging wires 98 are disposed on a lower surface of the front end portion of the carriage frame 82. The terminals 100 are electrically connected to feeder terminals installed outside of the transport carriage 10, for example, and are supplied with electric power for charging the battery 96. Details of a step of charging the battery 96 by using the terminals 100 will be described later.

As illustrated in FIGS. 15A and 15B, a storage area 104 used for storing a receptacle (cassette) 102 that houses a workpiece unit 17 or a tray 33 therein is defined below the carriage frame 82. The storage area 104 is surrounded by the wheels 86 and the wheels 88 and is positioned above the lower ends of the wheels 86 and the wheels 88. The receptacle 102 capable of housing one or more workpiece units 17, etc., is placed in the storage area 104.

Figure 17A:
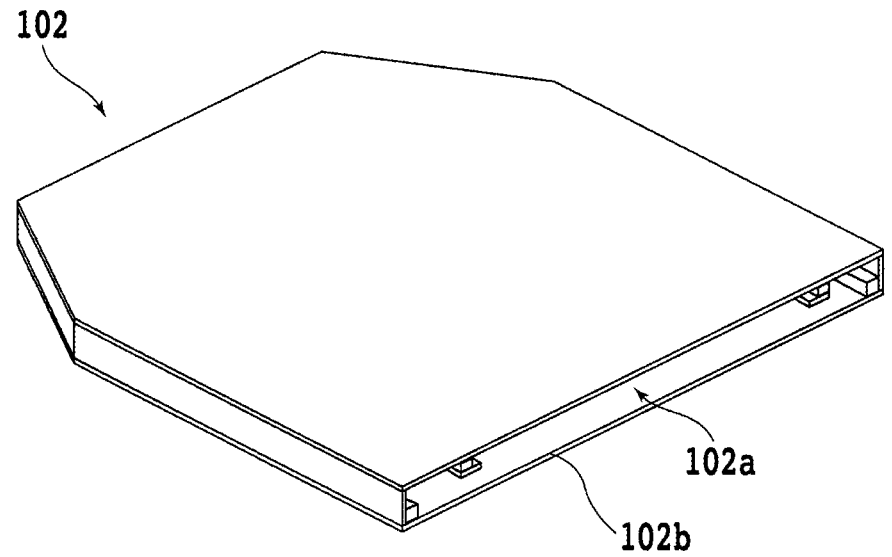
FIG. 17A is a perspective view of a receptacle.
Figure 17B:
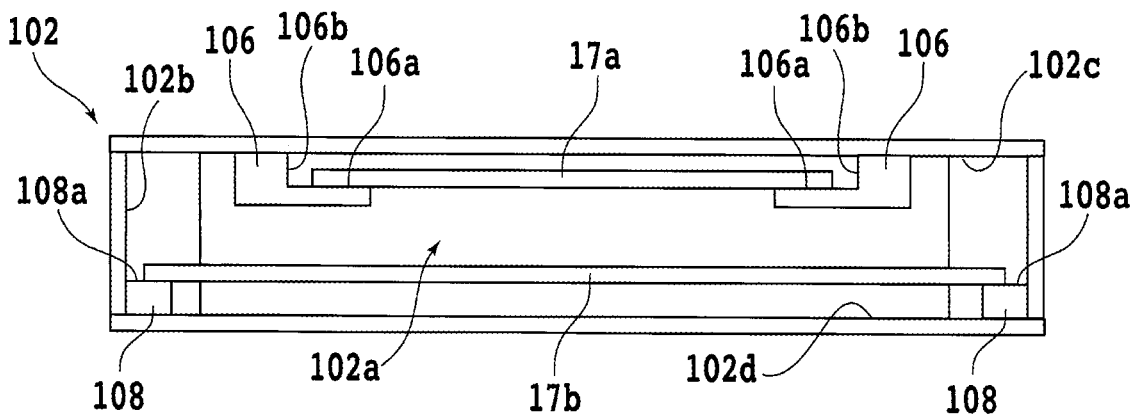
FIG. 17B is a front elevational view of the receptacle.

FIG. 17A illustrates the receptacle 102 in perspective and FIG. 17B illustrates the receptacle 102 in front elevation. The receptacle 102 is shaped as a hexagonal column as viewed in plan, for example, and has a housing region (housing space) 102a capable of housing therein a workpiece unit 17 or a tray 33. The housing region 102a is connected to a space outside of the receptacle 102 through a slit-like opening 102b that is open in a side surface of the receptacle 102. A workpiece unit 17 or a tray 33 is loaded through the opening 102b into the housing region 102a and unloaded through the opening 102b out of the housing region 102a.

As illustrated in FIG. 17B, the receptacle 102 is of a structure capable of housing two types of workpiece units 17a and 17b, etc., having different sizes, for example. In the housing region 102a in the receptacle 102, there are disposed a pair of first guide rails 106 that hold a workpiece unit 17a or the like thereon and a pair of second guide rails 108 that hold a workpiece unit 17b or the like thereon.

The first guide rails 106 are fixed to an upper wall 102c of the housing region 102a and spaced a predetermined distance from each other. Each of the first guide rails 106 has a holding surface 106a used for holding a lower surface of the workpiece unit 17a or the like from below and a side surface 106b defining the position of the workpiece unit 17a, etc., in horizontal directions. The second guide rails 108 are fixed to a bottom wall 102d of the housing region 102a and spaced a predetermined distance from each other. Each of the second guide rails 108 has a holding surface 108a used for holding a lower surface of the workpiece unit 17b or the like from below. The position of the workpiece unit 17b, etc., in the horizontal directions is defined by inner side surfaces of the receptacle 102.

The distance between the first guide rails 106 is smaller than the distance between the second guide rails 108. Therefore, the first guide rails 106 hold the workpiece unit 17a, etc., that is smaller than the workpiece unit 17b, etc., held by the second guide rails 108. For example, the first guide rails 106 hold a workpiece 11 having a diameter of approximately 200 mm (8 inches), whereas the second guide rails 108 hold a workpiece 11 having a diameter of approximately 300 mm (12 inches).

As described above, the receptacle 102 is not of such a structure as to house therein a plurality of workpiece units 17, etc., of the same type (i.e., of the same size). In this respect, the receptacle 102 is largely different in function and use from the cassette 30 that houses a plurality of workpiece units 17, etc., of the same type.

However, the receptacle 102 and the housing region 102a are not limited to any particular structures. For example, the housing region 102a may be of a structure capable of housing therein one or three or more workpiece units 17, etc. Further, the housing region 102a may be of a structure capable of housing therein a plurality of workpiece units 17, etc., of the same type.

When a workpiece unit 17 or a tray 33 is transported by the transport carriage 10, the receptacle 102 is stored in the storage area 104, as illustrated in FIG. 15A. At this time, the receptacle 102 has a lower surface positioned above the lower ends of the wheels 86 and the lower ends of the wheels 88. Therefore, while the transport carriage 10 is traveling, the receptacle 102 is kept out of contact with the transport path 6.

A lifting and lowering unit (lifting and lowering mechanism) 110 that lifts and lowers the receptacle 102 while suspending the receptacle 102 is disposed in an area on an upper surface of the carriage frame 82 that is positioned above the storage area 104. The lifting and lowering unit 110 lowers the receptacle 102 stored in the storage area 104 and places the receptacle 102 in a predetermined rest area. The lifting and lowering unit 110 also lifts the receptacle 102 placed in the predetermined rest area and stores the receptacle 102 into the storage area 104.

Figure 18:
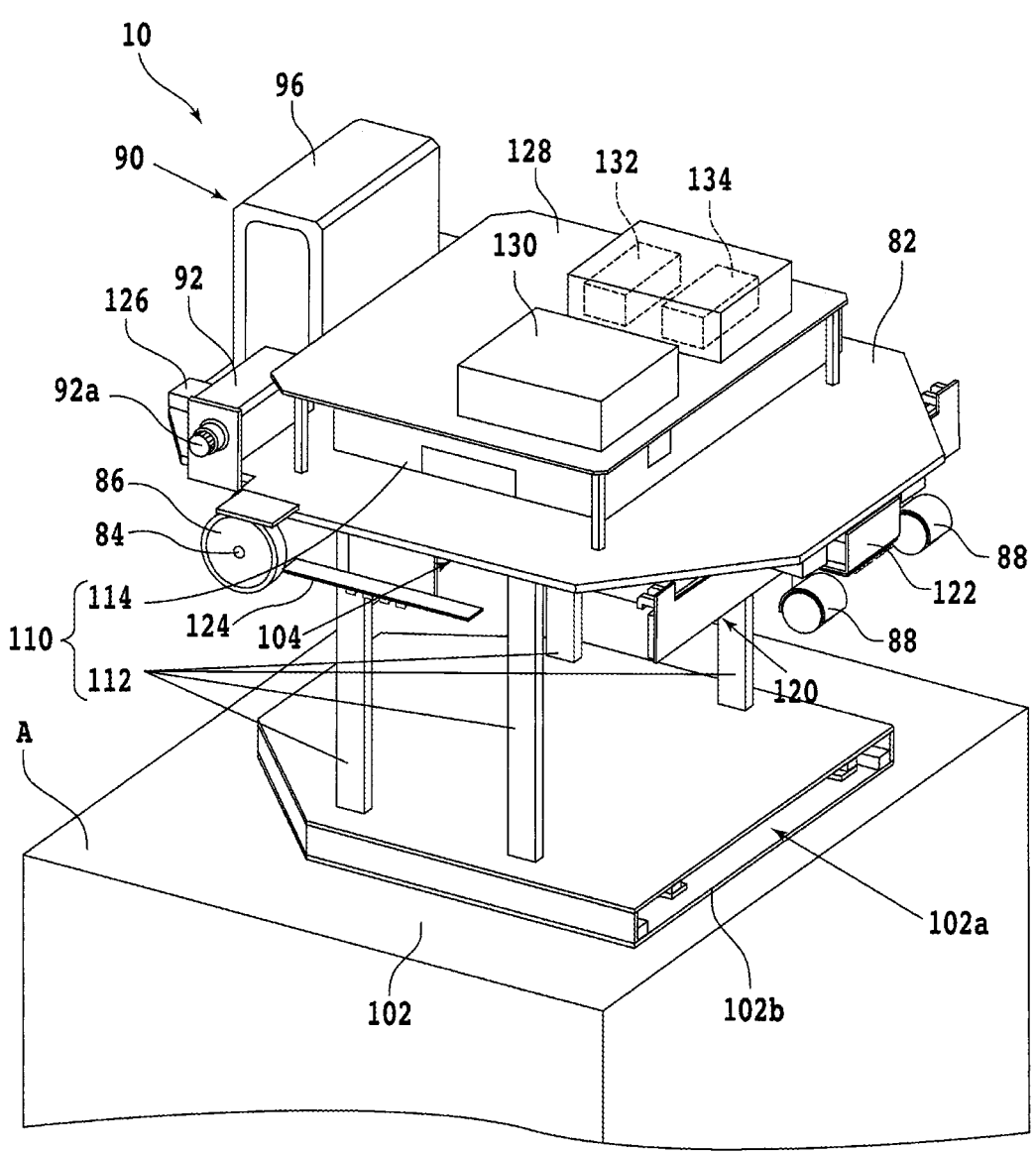
FIG. 18 is a perspective view illustrating the transport carriage with the receptacle placed in a rest area.

FIG. 18 illustrates, in perspective, the transport carriage 10 with the receptacle 102 placed in the rest area A. The lifting and lowering unit 110 includes a plurality of suspending members 112 that have ends (lower ends) connected to the receptacle 102 and a drive mechanism 114 that winds and reels out the suspending members 112. The rest area A is defined on the upper surface of the rest base 66 of the loader/unloader 8 (second rest area A₂, see FIG. 9), for example.

As illustrated in FIG. 18, the lifting and lowering unit 110 includes four suspending members 112. Each of the suspending members 112 may be in the form of a belt having a predetermined width, for example. The four suspending members 112 have distal ends (lower ends) connected to the upper surface of the receptacle 102 at respective four positions thereon.

When the drive mechanism 114 reels out the suspending members 112 with the receptacle 102 stored in the storage area 104, the receptacle 102 is lowered from the storage area 104 and placed onto the rest area A. When the drive mechanism 114 winds the suspending members 112 with the receptacle 102 placed in the rest area A, the receptacle 102 is lifted from the rest area A and stored into the storage area 104.

In a case where the suspending members 112 are in the form of belts, as illustrated in FIG. 18, it is preferable to adjust the orientation of the belts with respect to the receptacle 102 such that the belts have their widthwise directions extending along the direction in which a workpiece unit 17, etc., passes through the opening 102b in the receptacle 102 when the workpiece unit 17, etc., is unloaded from the housing region 102a in the receptacle 102. As the receptacle 102 is not likely to swing or sway in the widthwise directions of the belts, the possibility that the workpiece unit 17, etc., will jump out of the opening 102b while the receptacle 102 is lifted and lowered remains low.

The orientation of the belts with respect to the receptacle 102 may be adjusted such that the belts have their widthwise directions extending along the direction in which a workpiece unit 17, etc., passes through the opening 102b when the workpiece unit 17, etc., is loaded into the housing region 102a. According to the present embodiment, the belts and the receptacle 102 are connected to each other such that the belts have their widthwise directions extending along a direction perpendicular to a plane including the opening 102*b* in the receptacle 102. Each of the suspending members 112 may be a member other than a belt, such as a wire rope that can be wound and reeled out.

As illustrated in FIG. 15B, a plurality of contact members 116 that contact the upper surface of the receptacle 102 are disposed on the lower surface of the carriage frame 82. The contact members 116 are shaped as columns having generally the same heights and are fixed to the carriage frame 82 so as to protrude downwardly from the lower surface of the carriage frame 82. When the receptacle 102 is stored in the storage area 104, the upper surface of the receptacle 102 contacts the lower ends of the contact members 116, pushing the contact members 116 upwardly.

The contact members 116 are made of an elastic material that is elastically deformable when pressed by the receptacle 102, for example. Specifically, when the contact members 116 made of an elastic material are pressed by the receptacle 102 that is stored in the storage area 104, the contact members 116 are elastically deformed along the shape of the upper surface of the receptacle 102, producing restoring forces tending to push the receptacle 102 downwardly.

The contact members 116 made of an elastic material reduce shocks produced when the receptacle 102 contacts the contact members 116, for example, making the receptacle 102 and a workpiece unit 17, etc., in the receptacle 102 less liable to be damaged. In addition, when the transport carriage 10 travels on the transport path 6, the contact members 116 act as dampening members, making vibrations of the carriage frame 82 less liable to be transmitted to the receptacle 102 and the workpiece unit 17, etc.

Columnar members made of rubber (urethane rubber, silicone rubber, or the like), sponge, or the like, for example, may be used as the contact members 116. In particular, the contact members 116 that are made of rubber that produces large frictional forces acting on the receptacle 102 are effective to restrain the receptacle 102 from being positionally shifted while it is being transported. Each of the contact members 116 may not necessarily required to be made of an elastic material in its entirety, and may have at least a region (lower end) made of an elastic material for contacting the receptacle 102.

Further, the contact members 116 should preferably be brought into contact with the upper surface of the receptacle 102 at three or more positions. According to the present embodiment, as illustrated in FIG. 15B, three columnar contact members 116 are disposed on the carriage frame 82. In this case, since the upper surface of the receptacle 102 lies along a plane including the lower ends of the three contact members 116, the receptacle 102 is less likely to be tilted. However, conditions of the shape, number, layout, etc., of the contact members 116 can be changed as desired. For example, a pair of linear (ribbon-shaped) contact members 116 that extend generally parallel to each other may be disposed on the carriage frame 82.

Figure 19:
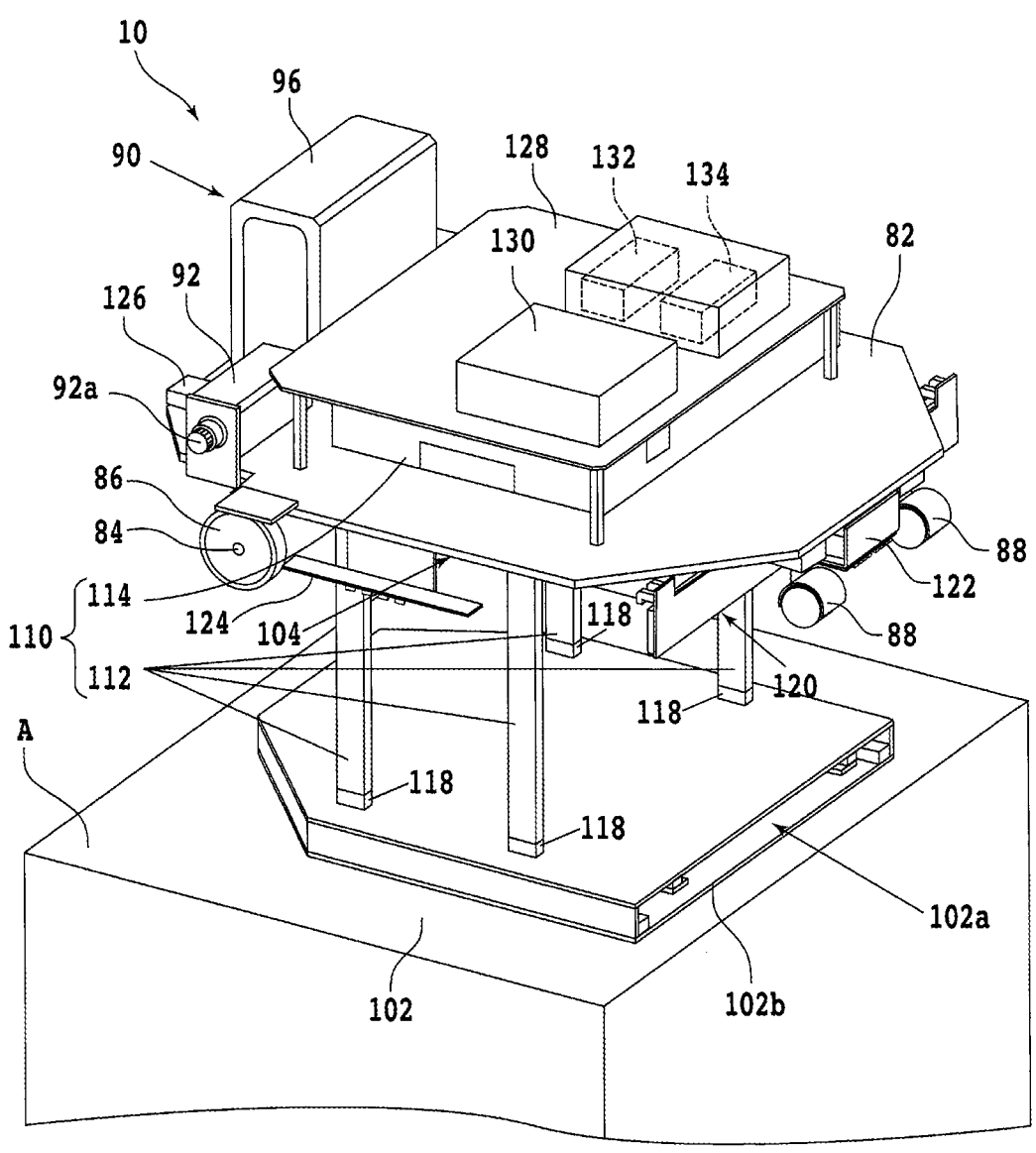
FIG. 19 is a perspective view illustrating the transport carriage with the receptacle connected to hanging members through elastic members (expansible and contractible members)

In order to make vibrations of the carriage frame 82 less liable to be transmitted to the receptacle 102, the receptacle 102 may be connected to the suspending members 112 by resilient members. FIG. 19 illustrates, in perspective, a transport carriage 10 in which a receptacle 102 is connected to suspending members 112 by elastic members (expansible and contractible members) 118. In this case, the contact members 116 may be omitted.

The elastic members 118 are disposed between the distal ends (lower ends) of the suspending members 112 and the receptacle 102. The elastic members 118 expand and contract in the lengthwise directions of the suspending members 112 when the suspending members 112 swing or sway, and may include expansible and contractible bodies such as rubber bodies or springs. Expansible and contractible members such as expansible and contractible joints may be used as the elastic members 118.

When the receptacle 102 is stored into the storage area 104, the length by which the suspending members 112 are wound is adjusted to keep the upper surface of the receptacle 102 out of contact with the carriage frame 82 and the contact members 116. Therefore, even if the carriage frame 82 is vibrated, for example, the vibrations are not directly transmitted to the receptacle 102. Further, since vibrations transmitted from the carriage frame 82 through the lifting and lowering unit 110 and the suspending members 112 are dampened by the elastic members 118 as they expand and contract, the vibrations are less likely to be transmitted to the receptacle 102. The elastic members 118 thus function as vibroisolating members.

In a case where the contact members 116 are disposed on the lower surface of the carriage frame 82, the length by which the suspending members 112 are wound may be adjusted such that the receptacle 102 is stored in the storage area 104 while being in contact with the contact members 116. In this case, vibrations transmitted from the carriage frame 82 to the receptacle 102 are dampened by the contact members 116, and vibrations transmitted from the suspending members 112 to the receptacle 102 are dampened by the elastic members 118.

A cover 120 is disposed beneath the rear end portion of the carriage frame 82. The cover 120 covers the opening 102*b* (see FIG. 17A) in the receptacle 102 when the receptacle 102 is stored in the storage area 104. When the opening 102*b* is covered by the cover 120, foreign matter is prevented from entering the housing region 102*a* in the receptacle 102 while the transport carriage 10 is traveling, and is prevented from being applied to the workpiece unit 17, etc.

Even if the receptacle 102 is tilted or vibrated while the transport carriage 10 is traveling, the workpiece unit 17, etc., is prevented from jumping out of the opening 102*b* by the cover 120. Structural and operational details of the cover 120 will be described later (see FIGS. 23, 24A, and 24B).

A pair of first sensors 122 are disposed on the front and rear end portions of the carriage frame 82. Specifically, the first sensors 122 are disposed at respective two positions that are spaced from each other along the longitudinal directions (lengthwise directions) of the carriage frame 82. In addition, a pair of second sensors 124 are disposed on side end portions of the carriage frame 82. Specifically, the second sensors 124 are disposed at respective two positions that are spaced from each other along the transverse directions (widthwise directions) of the carriage frame 82.

The first sensors 122 and the second sensors 124 are mounted on the carriage frame 82 in facing relation to the transport path 6 on which the transport carriage 10 travels, and detect marks on the transport path 6. The transport carriage 10 is controlled to travel, turn, stop, etc., on the basis of the marks detected by the first sensors 122 and the second sensors 124. Details of the step of controlling the transport carriage 10 by using the first sensors 122 and the second sensors 124 will be described later.

Specific positions where the first sensors 122 and the second sensors 124 are installed are adjusted depending on the specifications of the transport path 6 on which the transport carriage 10 travels. For example, the first sensors 122 are mounted on the front and rear end portions of the carriage frame 82 at positions near the center of the carriage frame 82 in the widthwise directions thereof. The second sensors 124 are mounted on the side end portions of the carriage frame 82 at positions near the center of the carriage frame 82 in the lengthwise directions thereof.

The second sensors 124 may be fixed to the carriage frame 82 in an array on a straight line extending through the wheels 86. For example, the second sensors 124 are disposed outside of the wheels 86 in such a manner as to sandwich the wheels 86 along the widthwise directions of the carriage frame 82. Alternatively, the second sensors 124 may be disposed inside of the wheels 86 in such a manner as to be sandwiched by the wheels 86 along the widthwise directions of the carriage frame 82.

The second sensors 124 that are disposed on the straight line extending through the wheels 86 are capable of detecting a mark at the same time that the wheels 86 pass over the mark. Consequently, by turning or stopping the transport carriage 10 at the time when the mark is detected, it is possible to appropriately control the travel of the transport carriage 10 without making any corrections.

On the other hand, if the second sensors 124 are spaced from the straight line passing through wheels 86, then the time to turn or stop the transport carriage 10 may be controlled on the basis of the time when the mark is detected, as well as the distances between the second sensors 124 and the wheels 86 (wheel shafts 84), the speed at which the transport carriage 10 travels, etc.

Further, as illustrated in FIG. 16, a pair of third sensors 126 that detect a collision of the transport carriage 10 with an obstacle are disposed on the front end portion of the carriage frame 82. For example, the third sensors 126 are mounted on the front end portion of the carriage frame 82 at both ends thereof. The third sensors 126 may be pushbutton-type switches, for example.

When the front end portion of the transport carriage 10 collides with an obstacle, the third sensors 126 are actuated to detect the collision of the transport carriage 10. When the third sensors 126 detect the collision of the transport carriage 10, the transport carriage 10 stops its operation. The third sensors 126 are not limited to any particular structures and types insofar as they can detect a collision of the transport carriage 10.

The transport carriage 10 may be covered with a soft outer cover capable of weakening shocks caused by collisions, etc. In a case where the transport carriage 10 is covered with such an outer cover, when the outer cover covering the front end portion of the transport carriage 10 collides with an obstacle, the outer cover is deformed and contacts the third sensors 126, which detect the collision of the transport carriage 10.

As illustrated in FIGS. 15A and 15B, a plate-shaped support base 128 fixed to the carriage frame 82 is disposed over the lifting and lowering unit 110. A controller (control unit) 130 that controls operation of the transport carriage 10 is fixedly mounted on an upper surface of the support base 128. The controller 130 is electrically connected to various components of the transport carriage 10 (drive unit 90, lifting and lowering unit 110, first sensors 122, second sensors 124, third sensors 126, etc.) and controls operation of the various components.

The controller 130 is configured as a computer including, for example, a processor such as a CPU, a main storage unit such as a DRAM, and an auxiliary storage unit such as a flash memory. The processor, etc., is operated according to software stored in the auxiliary storage unit to realize functions of the controller 130.

On the support base 128, there are fixedly mounted a receiver 132 that receives signals (information) from external devices and sends the received signals to the controller 130 and a transmitter 134 that receives signals (information) from the controller 130 and sends the received signals to the external devices. The receiver 132 and the transmitter 134 are each electrically connected to the controller 130.

The receiver 132 receives signals transmitted from the control unit 12 of the transport system 2 and sends the received signals to the controller 130, for example. The controller 130 controls operation of the transport carriage 10 on the basis of the signals received from the receiver 132, for example. Further, the controller 130 generates notification signals and sends the generated signals to the transmitter 134, for example. The transmitter 134 transmits the signals received from the controller 130, to the control unit 12 (see FIG. 8) of the transport system 2, for example.

The various components of the transport carriage 10 (lifting and lowering unit 110, first sensors 122, second sensors 124, third sensors 126, controller 130, receiver 132, transmitter 134, etc.,) are electrically connected to the battery 96 through feeder wires (not illustrated) and are operated by electric power supplied from the battery 96.

Figure 20A:
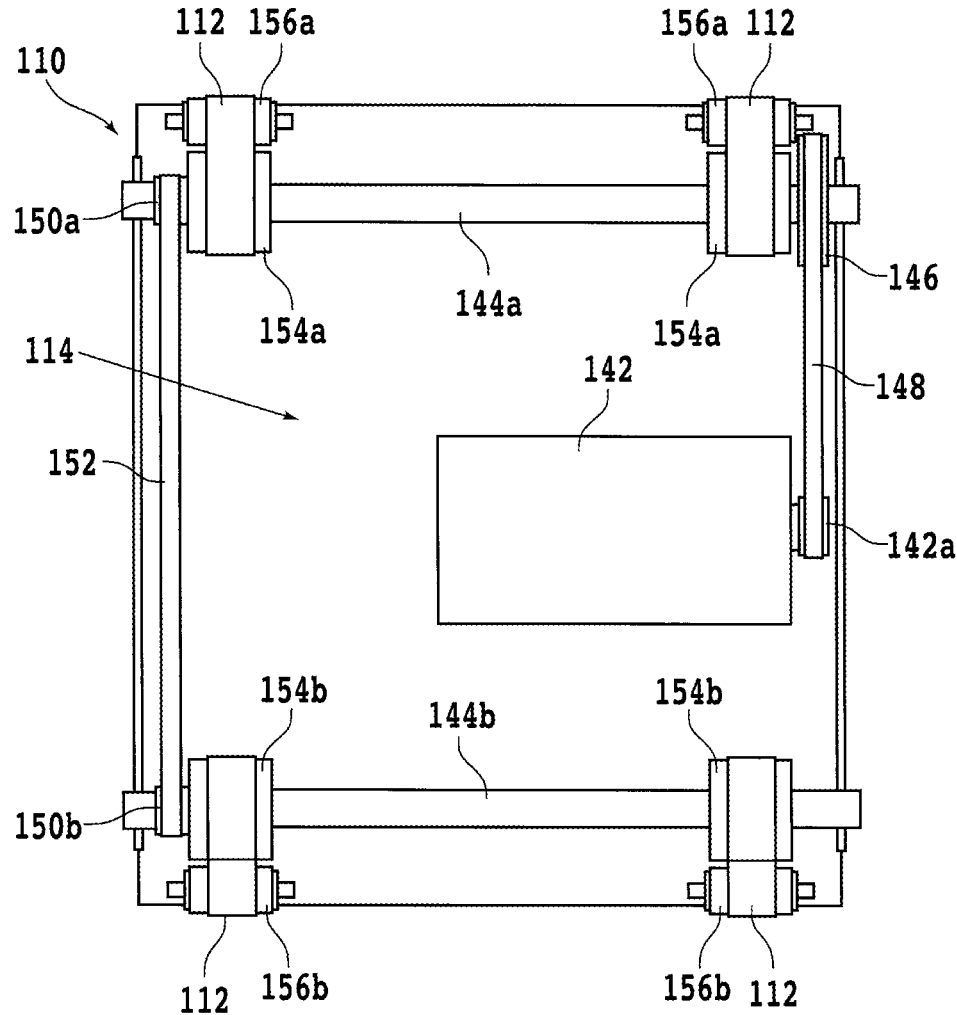
FIG. 20A is a plan view illustrating a structural example of a lifting and lowering unit.
Figure 20B:
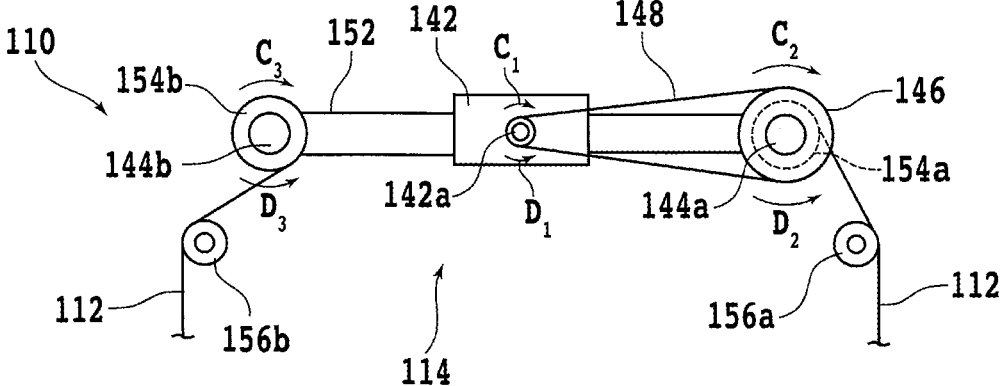
FIG. 20B is a side elevational view illustrating the structural example of the lifting and lowering unit.

FIG. 20A illustrates, in plan, a structural example of the lifting and lowering unit 110, and FIG. 20B illustrates, in side elevation, the structural example of the lifting and lowering unit 110. As described above, the lifting and lowering unit 110 includes the drive mechanism 114 that winds and reels out the plurality of suspending members 112. The drive mechanism 114 includes an electric motor 142 having a rotational shaft (output shaft) 142a.

The electric motor 142 generates power that is used to wind and reel out the suspending members 112, by rotating the rotational shaft 142a. A first rotational shaft (first shaft) 144a and a second rotational shaft (second shaft) 144b that extend generally parallel to each other are disposed in two respective positions so as to interpose the electric motor 142 therebetween.

A pulley 146 is mounted on an end portion of the first rotational shaft 144a. An endless connecting member 148 such as a belt or a chain is trained around the rotational shaft 142a of the electric motor 142 and the pulley 146. The rotational shaft 142a of the electric motor 142, the pulley 146, and the connecting member 148 are included in a power transmitting mechanism, operatively interconnecting the electric motor 142 and the first rotational shaft 144a. On the other hand, no pulley that operatively connects the second rotational shaft 144b to the electric motor 142 is mounted on an end portion of the second rotational shaft 144b.

A pulley 150a is mounted on the other end portion of the first rotational shaft 144a. A pulley 150b that is of the same diameter as the pulley 150a is mounted on the other end portion of the second rotational shaft 144b. An endless connecting member 152 such as a belt or a chain is trained around the pulley 150a and the pulley 150b. The pulley 150a, the pulley 150b, and the connecting member 152 are included in a power transmitting mechanism, operatively interconnecting the first rotational shaft 144a and the second rotational shaft 144b.

Two cylindrical reels 154a on which respective ones of the suspending members 112 are wound are fixedly mounted on the respective end portions of the first rotational shaft 144a. Two cylindrical rollers 156a that support the respective suspending members 112 are rotatably disposed at two respective positions outside of the respective reels 154a (remoter from the electric motor 142) and lower than the respective reels 154a. The rollers 156a have respective rotational shafts extending generally parallel to the first rotational shaft 144a.

Two cylindrical reels 154b on which respective ones of the suspending members 112 are wound are fixedly mounted on the respective end portions of the second rotational shaft 144b. Two cylindrical rollers 156b that support the respective suspending members 112 are rotatably disposed at two respective positions outside of the respective reels 154b (remoter from the electric motor 142) and lower than the respective reels 154b. The rollers 156b have respective rotational shafts extending generally parallel to the second rotational shaft 144b.

The suspending members 112 have proximal ends individually fixed to the reels 154a and the reels 154b. The suspending members 112 that are fixed to the reels 154a hang downwardly while being in contact with outside portions of the rollers 156a. The suspending members 112 that are fixed to the reels 154b hang downwardly while being in contact with outside portions of the rollers 156b.

As illustrated in FIG. 20B, the suspending members 112 fixed to the reels 154a extend over upper sides of the reels 154a and are supported by the rollers 156a. On the other hand, the suspending members 112 fixed to the reels 154b extend under lower sides of the reels 154b and are supported by the rollers 156b.

When the electric motor 142 is energized to rotate the rotational shaft 142a in a first direction (the direction indicated by the arrow $C_1$ in FIG. 20B), the reels 154a fixed to the first rotational shaft 144a are rotated in a direction (the direction indicated by the arrow $C_2$ in FIG. 20B) to reel out the suspending members 112. The suspending members 112 are thus reeled out of the reels 154a and over the rollers 156a.

The torque of the first rotational shaft 144a is transmitted by the connecting member 152 to the second rotational shaft 144b, rotating the reels 154b fixed to the second rotational shaft 144b, in a direction (the direction indicated by the arrow $C_3$ in FIG. 20B) to reel out the suspending members 112. The suspending members 112 are thus reeled out of the reels 154b and over the rollers 156b.

When the electric motor 142 is reversed to rotate the rotational shaft 142a in a second direction (the direction indicated by the arrow $D_1$ in FIG. 20B) that is opposite to the first direction, the reels 154a fixed to the first rotational shaft 144a are rotated in a direction (the direction indicated by the arrow $D_2$ in FIG. 20B) to wind the suspending members 112. The suspending members 112 are thus wound over the rollers 156a onto the reels 154a.

The torque of the first rotational shaft 144a is transmitted by the connecting member 152 to the second rotational shaft 144b, rotating the reels 154b fixed to the second rotational shaft 144b, in a direction (the direction indicated by the arrow $D_3$ in FIG. 20B) to wind the suspending members 112. The suspending members 112 are thus wound over the rollers 156b onto the reels 154b.

When the suspending members 112 are reeled out from the drive mechanism 114, the receptacle 102 connected to the distal ends of the suspending members 112 is lowered and placed in the rest area A (see FIG. 18). When the suspending members 112 are wound by the drive mechanism 114, the receptacle 102 connected to the distal ends of the suspending members 112 is lifted and stored in the storage area 104 of the transport carriage 10 (see FIG. 15A).

The transport carriage 10 may incorporate a lifting and lowering unit 110 that includes a drive mechanism structurally different from the above drive mechanism 114. FIG.

Figure 21A:
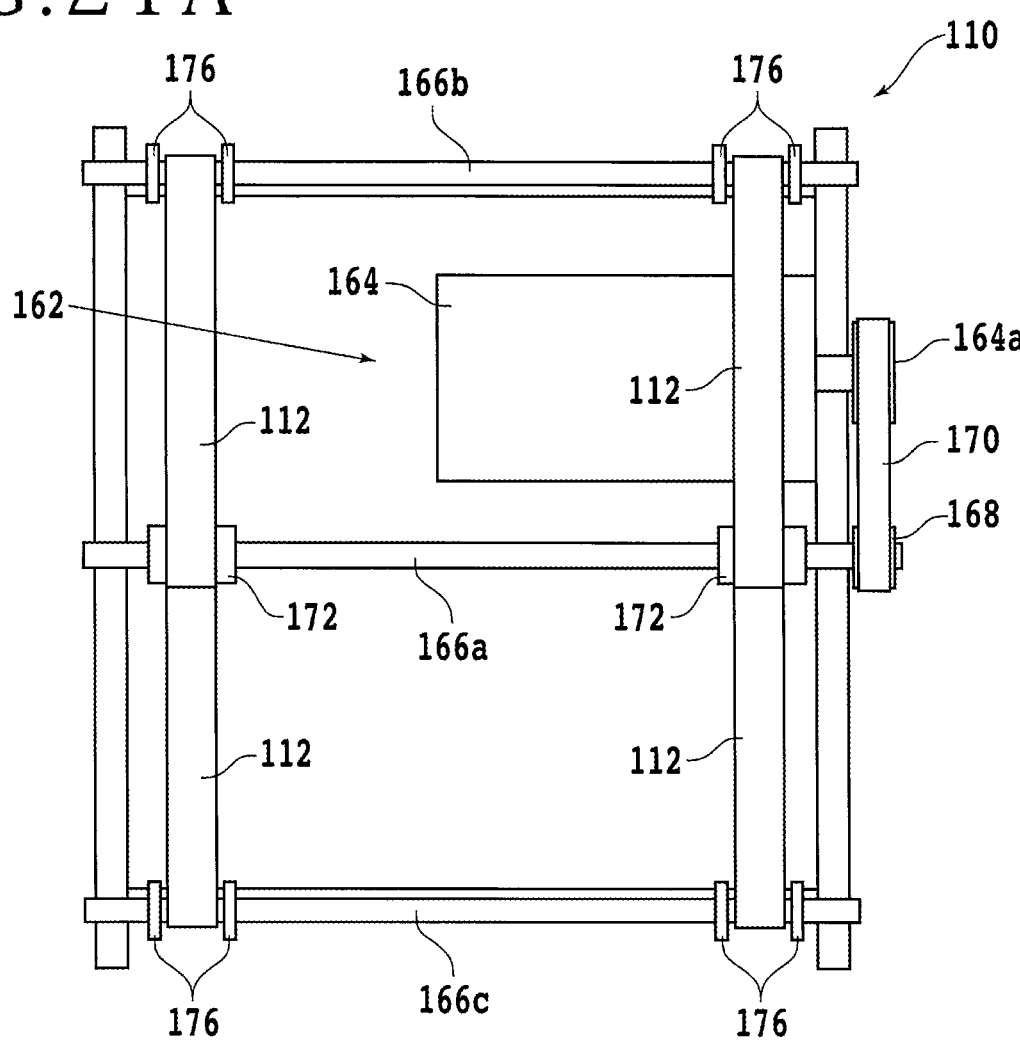
FIG. 21A is a plan view illustrating another structural example of a lifting and lowering unit.
Figure 21B:
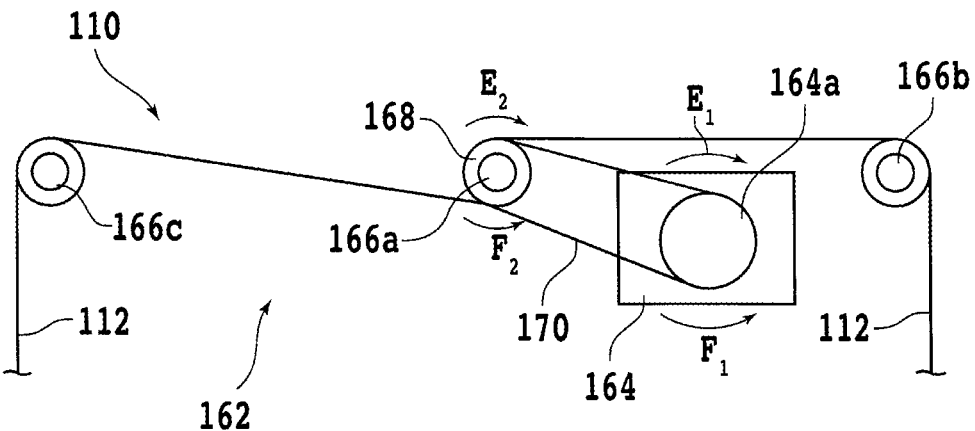
FIG. 21B is a side elevational view illustrating the other structural example of the lifting and lowering unit.

21A illustrates, in plan, another structural example of the lifting and lowering unit 110, and FIG. 21B illustrates, in side elevation, the other structural example of the lifting and lowering unit 110. The lifting and lowering unit 110 illustrated in FIGS. 21A and 21B includes a drive mechanism 162 instead of the abovementioned drive mechanism 114.

The drive mechanism 162 includes an electric motor 164 having a rotational shaft (output shaft) 164a, and a first rotational shaft (first shaft) 166a, a second rotational shaft (second shaft) 166b, and a third rotational shaft (third shaft) 166c that extend generally parallel to one another. The first rotational shaft 166a is disposed between the second rotational shaft 166b and the third rotational shaft 166c.

For example, the electric motor 164 is disposed between the first rotational shaft 166a and the second rotational shaft 166b and generates power that is used to wind and reel out the suspending members 112, by rotating the rotational shaft 164a. The electric motor 164 may be disposed between the first rotational shaft 166a and the third rotational shaft 166c.

A pulley 168 is mounted on an end portion of the first rotational shaft 166a. An endless connecting member 170 such as a belt or a chain is trained around the rotational shaft 164a of the electric motor 164 and the pulley 168. The rotational shaft 164a of the electric motor 164, the pulley 168, and the connecting member 170 are included in a power transmitting mechanism, operatively interconnecting the electric motor 164 and the first rotational shaft 166a.

A plurality of cylindrical reels 172 that wind suspending members 112 are fixedly mounted on the first rotational shaft 166a. Specifically, a pair of cylindrical reels 172 are fixedly mounted on respective both end portions of the first rotational shaft 166a. Two suspending members 112 are fixed to each of the reels 172 for being wound in the same direction around the reels 172.

Figure 22A:
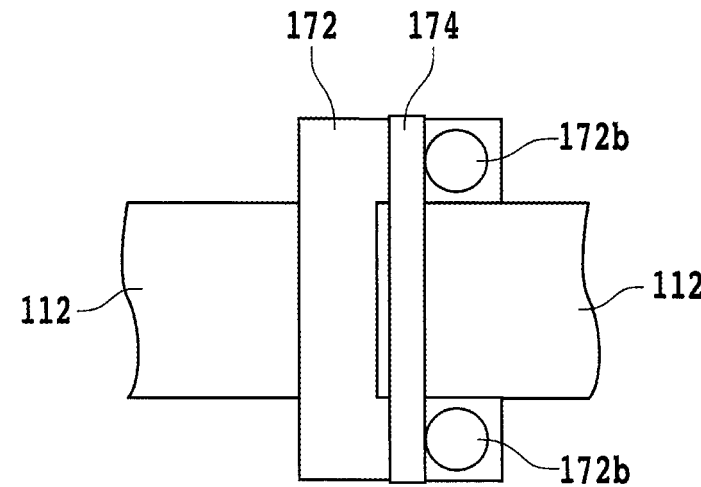
FIG. 22A is a plan view illustrating a reel.
Figure 22B:
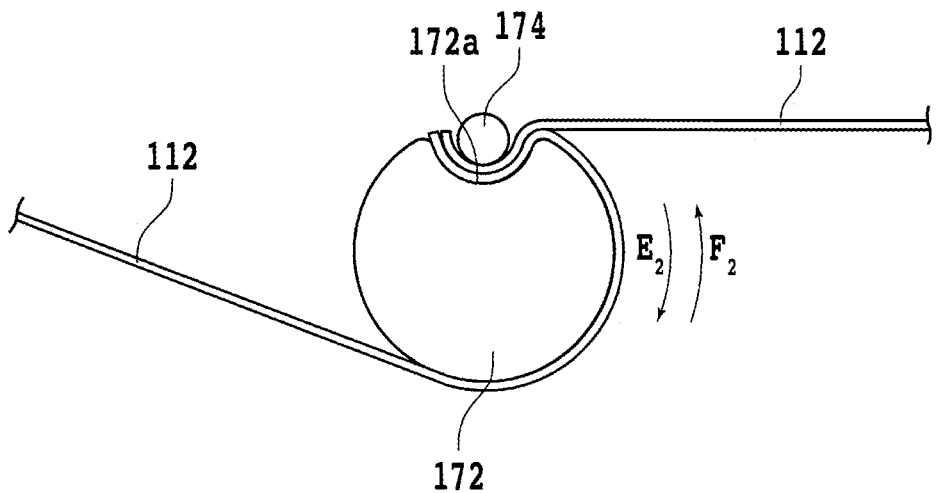
FIG. 22B is a side elevational view illustrating the reel.

FIG. 22A illustrates one of the reels 172 in plan, and FIG. 22B illustrates the reel 172 in side elevation. The lifting and lowering unit 110 includes a cylindrical fixing member 174 that fixes the suspending members 112 to the reel 172. The two suspending members 112 are fixed together to the reel 172 by the fixing member 174.

As illustrated in FIG. 22B, the reel 172 has a groove (recess) 172a defined in an outer circumferential surface thereof and extending along the rotational shaft of the reel 172 (first rotational shaft 166a). The groove 172a has a curved inner surface. The groove 172a has both ends reaching respective both ends of the reel 172 in its axial directions. The two suspending members 112 are oriented in the same direction on the reel 172 and placed such that their proximal end portions overlap each other in the groove 172a.

The fixing member 174 has a curved outer circumferential surface complementary in shape to the inner surface of the groove 172a. With the two suspending members 112 placed such that their proximal end portions overlap each other in the groove 172a, the fixing member 174 is fitted in the groove 172a, pressing the overlapping proximal end portions of the two suspending members 112 toward the inner surface of the groove 172a. The proximal end portions of the two suspending members 112 are thus pinched between the inner surface of the groove 172a and the outer circumferential surface of the fixing member 174 and are fixed to the reel 172.

As illustrated in FIG. 22A, a pair of protrusions (projections) 172b are disposed on an outer circumferential surface of the reel 172 in sandwiching relation to the two suspending members 112 fixed to the reel 172 in the widthwise directions thereof. The protrusions 172b function as guides that prevent the suspending members 112 from being positionally shifted in the widthwise directions. When the reel 172 thus constructed is rotated, the reel 172 can wind the two suspending members 112 or reel out the two suspending members 112.

As illustrated in FIGS. 21A and 21B, one of the two suspending members 112 fixed to each of the reels 172 hangs downwardly while being in contact with the second rotational shaft 166*b*. The other of the two suspending members 112 fixed to the reel 172 hangs downwardly while being in contact with the third rotational shaft 166*c*.

The second rotational shaft 166*b* and the third rotational shaft 166*c* are supported in such a manner as to be easily rotatable by forces applied from an outer source, and have outer circumferential surfaces held in contact with the suspending members 112. Pairs of guides 176 that prevent the suspending member 112 from being positionally shifted in the widthwise directions are disposed on both sides of regions of the second rotational shaft 166*b* and the third rotational shaft 166*c* that are contacted by the suspending members 112.

When the electric motor 164 is energized to rotate the rotational shaft 164*a* in a first direction (the direction indicated by the arrow $E_1$ in FIG. 21B), the reels 172 are rotated in a direction (the direction indicated by the arrow $E_2$ in FIGS. 21B and 22B) to reel out the suspending members 112. The two suspending members 112 are thus reeled out of the reels 172 and over the second rotational shaft 166*b* and the third rotational shaft 166*c*. As a result, the receptacle 102 connected to the suspending members 112 is lowered.

When the electric motor 164 is reversed to rotate the rotational shaft 164*a* in a second direction (the direction indicated by the arrow $F_1$ in FIG. 21B) that is opposite to the first direction, the reels 172 are rotated in a direction (the direction indicated by the arrow $F_2$ in FIGS. 21B and 22B) to wind the suspending members 112. The two suspending members 112 are thus wound over the second rotational shaft 166*b* and the third rotational shaft 166*c* onto the reels 172. As a result, the receptacle 102 connected to the suspending members 112 is lifted.

As described above, the drive mechanism 162 illustrated in FIG. 21A has the two reels 172 fixed to the first rotational shaft 166*a* and the two suspending members 112 fixed to each of the two reels 172. Therefore, the way in which the four suspending members 112 are wound and reeled out is controlled by the rotation of the first rotational shaft 166*a*. The drive mechanism 114 thus includes a reduced number of parts, thereby reducing the weight, the possibility of failures, and the cost of the transport carriage 10.

By using the lifting and lowering unit 110 as described above, it is possible to lift and lower the receptacle 102 that stores a workpiece unit 17 or a tray 33, between the storage area 104 and the rest area A below the storage area 104. Details of the lifting and lowering unit 110 may be changed or modified insofar as they are able to lift and lower the receptacle 102 appropriately.

The second rotational shaft 166*b* and the third rotational shaft 166*c* may be nonrotatably fixed. According to the modification, the suspending members 112 move slidingly over an outer circumferential surface of the second rotational shaft 166*b* or the third rotational shaft 166*c* and are reeled out of or wound around the reels 172.

Figure 23:
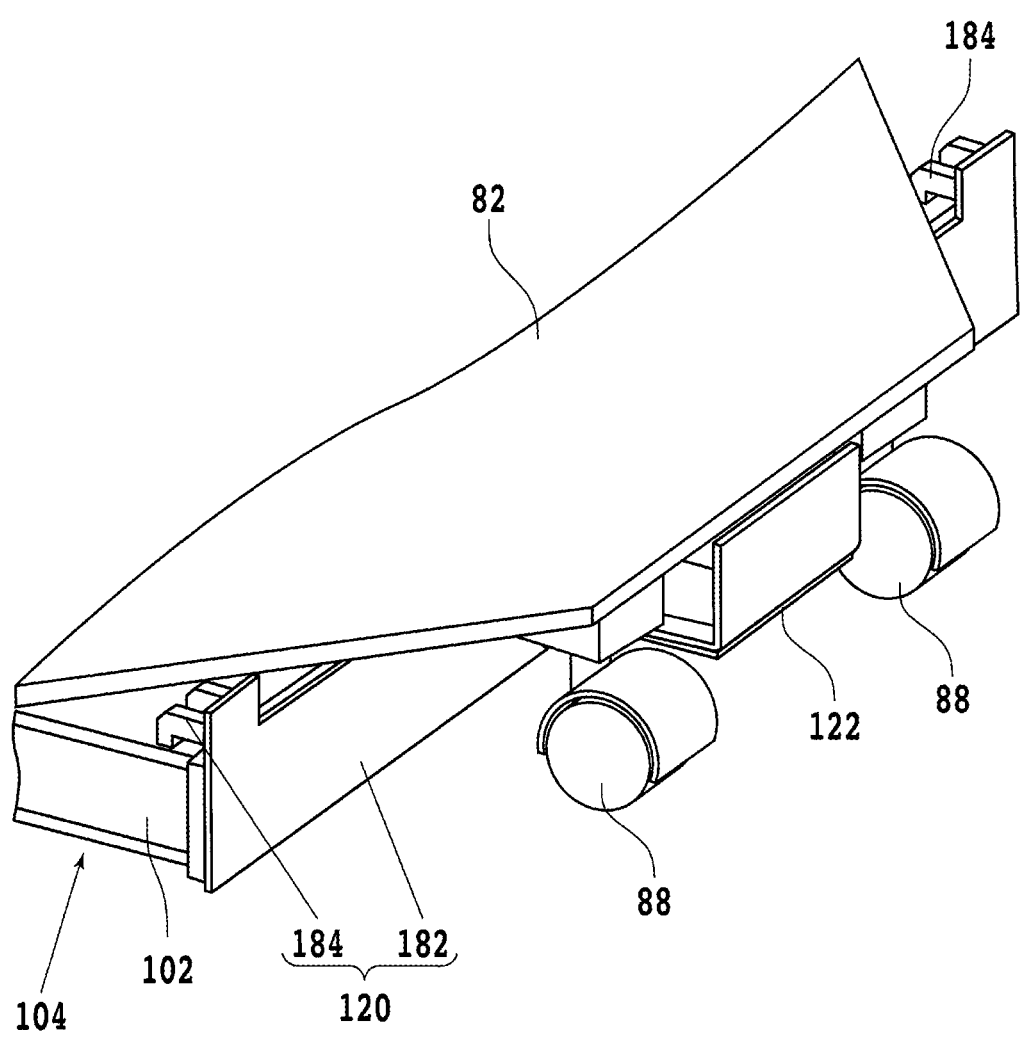
FIG. 23 is an enlarged perspective view of a cover.

FIG. 23 illustrates the cover 120 in enlarged perspective. The cover 120 is disposed beneath the rear end portion of the lower surface of the carriage frame 82 in facing relation to a side surface (rear portion) of the receptacle 102 stored in the storage area 104. The cover 120 includes a lid 182 pivotally coupled to the carriage frame 82 for angular movement with respect to the carriage frame 82. The lid 182 is of such a shape and size as to be able to cover the opening 102*b* (see FIG. 24B) in the receptacle 102. A plurality of contact members 184 that contact the upper surface of the receptacle 102 are fixed to an upper portion of the lid 182.

When the receptacle 102 ascends toward the storage area 104, the upper surface of the receptacle 102 contacts the lower ends of the contact members 184 and pushes the contact members 184 upwardly. The lid 182 is then moved (turned) toward the receptacle 102 and covers the opening 102*b* in the receptacle 102.

Figure 24A:
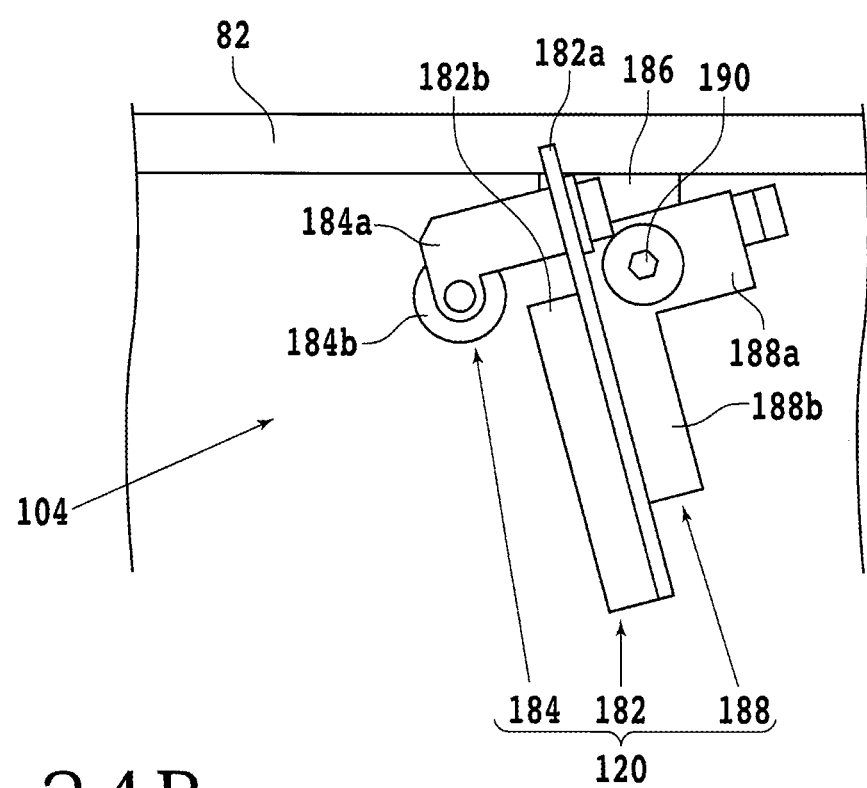
FIG. 24A is a side elevational view illustrating the cover with the receptacle not stored in a storage area.
Figure 24B:
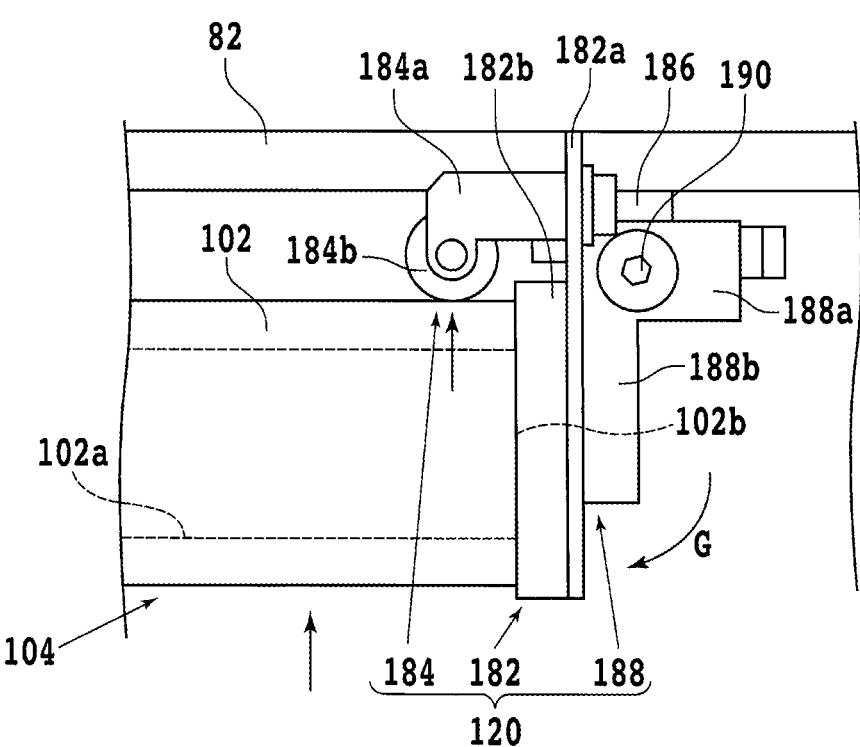
FIG. 24B is a side elevational view illustrating the cover with the receptacle stored in the storage area.

FIG. 24A illustrates, in side elevation, the cover 120 with the receptacle 102 not stored in the storage area 104, and FIG. 24B illustrates, in side elevation, the cover 120 with the receptacle 102 stored in the storage area 104. A fixed block 186 is fixed to the lower surface of the carriage frame 82. A joint block (block) 188 that is of an L shape as viewed from the transverse directions (widthwise directions) of the carriage frame 82 is angularly movably coupled to the fixed block 186.

The joint block 188 includes an upper joint portion 188*a* (closer to the carriage frame 82) and a fixed portion 188*b* beneath the upper joint portion 188*a*. The upper joint portion 188*a* has a through hole that is defined therein and that extends in the widthwise directions of the carriage frame 82. A joint shaft 190 that is fixed to the fixed block 186 is inserted in the through hole. The joint block 188 is thus joined to the fixed block 186 so as to be angularly movable about the axis of the joint shaft 190.

The lid 182 is fixed to a side of the fixed portion 188*b* that faces the storage area 104 (front side). Since the joint shaft 190 inserted in the through hole in the upper joint portion 188*a* extends generally parallel to the widthwise directions of the carriage frame 82, the lid 182 as well as the joint block 188 are angularly movable along a plane generally perpendicular to the widthwise directions of the carriage frame 82.

The lid 182 includes a plate-shaped member 182*a* secured to the fixed portion 188*b* of the joint block 188. A pliable member 182*b* is disposed on a surface of the plate-shaped member 182*a* that faces the storage area 104 (front side). The pliable member 182*b* is of a shape and size large enough to entirely cover the opening 102*b* in the receptacle 102.

Further, a contact member 184 is also disposed on the surface of the plate-shaped member 182*a* that faces the storage area 104 (front side). The contact member 184 includes, for example, a fixed portion 184*a* disposed above the pliable member 182*b* and fixed to the plate-shaped member 182*a* and a roller 184*b* rotatably supported on a region of the fixed portion 184*a* that faces the storage area 104 (front side).

The roller 184*b* is made of an elastic material such as rubber. The roller 184*b* is supported on the fixed portion 184*a* so as to be angularly movable about a rotational axis generally parallel to the widthwise directions of the carriage frame 82. The roller 184*b* has a lower end positioned below the lower end of the fixed portion 184*a*. Therefore, when the upper surface of the receptacle 102 contacts the roller 184*b*, the roller 184*b* rotates as the lid 182 is turned.

For example, when the receptacle 102 is lifted toward the storage area 104, the upper surface of the receptacle 102 contacts the roller 184*b*, pushing the contact member 184 upwardly. The cover 120 is angularly moved about the axis of the joint shaft 190 in such a direction as to bring its lower end toward the receptacle 102 (in the direction indicated by the arrow G in FIG. 24B) until the surface of the plate-shaped member 182*a* that faces the storage area 104 (front side) lies generally perpendicularly to the lower surface of the carriage frame 82. Then, the pliable member 182*b* of the lid 182 contacts the side surface (rear surface) of the receptacle 102, closing the opening 102*b* defined therein.

If the opening 102*b* in the receptacle 102 stored in the storage area 104 remains exposed, foreign matter such as dust can possibly enter the housing region 102*a* in the receptacle 102. Particularly, while the transport carriage 10 is traveling, it is highly likely for a trace of foreign matter in a clean room where the transport path 6 is installed, for example, to be attracted to the transport carriage 10 and to enter the housing region 102*a* due to static electric charges generated by friction between the transport path 6 and the wheels 88.

According to the present embodiment, when the receptacle 102 is stored in the storage area 104, the opening 102*b* in the receptacle 102 is covered by the cover 120, so that no foreign matter will enter the housing region 102*a* of the receptacle 102 while the transport carriage 10 is traveling. In addition, even when the receptacle 102 is tilted or vibrated while the transport carriage 10 is traveling, the cover 120 that covers the opening 102*b* prevents a workpiece unit 17 or a tray 33 from jumping out of the receptacle 102.

On the other hand, while the receptacle 102 is being lifted or lowered by the lifting and lowering unit 110, no static electric charges are generated by friction between the transport path 6 and the wheels 88, and foreign matter is not stirred up by the transport carriage 10 as it does not move on the transport path 6. Consequently, even though the opening 102*b* in the receptacle 102 is not covered by the cover 120 while the receptacle 102 is being lifted or lowered, any possibility that foreign matter will enter the housing region 102*a* is low.

The pliable member 182*b* is disposed on a region of the cover 120 that corresponds to the opening 102*b*. When a workpiece unit 17, etc., housed in the receptacle 102 impinges upon the pliable member 182*b*, the pliable member 182*b* is elastically deformed, reducing shocks applied to the workpiece unit 17, etc. The pliable member 182*b* thus functions as a dampening member. Therefore, the pliable member 182*b* minimizes damage that may be caused to the workpiece 11, etc., included in the workpiece unit 17.

The pliable member 182*b* is not limited to any particular materials, structures, and so on. For example, the pliable member 182*b* may be made of a material capable of dampening shocks to the extent that the workpiece 11, etc., included in the workpiece unit 17 is not damaged, for example. Specifically, the pliable member 182*b* may be made of sponge, rubber, cotton, cloth, foamed styrene, foamed dampening material, etc.

In particular, since sponge is soft and easily deformable, the pliable member 182*b* made of sponge is effective to dampen shocks applied to the workpiece unit 17, etc. In addition, the pliable member 182*b* made of sponge is elastically deformable appropriately along the shape of the side surface of the receptacle 102, reliably closing the opening 102*b*.

As illustrated in FIG. 24A, the weights of the components of the cover 120 are adjusted such that, when the receptacle 102 is lowered from the storage area 104, the cover 120 is turned under its own weight in such a direction as to move the lower end thereof away from the storage area 104 (in the direction opposite to the direction indicated by the arrow G in FIG. 24B). Therefore, when the receptacle 102 is not stored in the storage area 104, the surface of the plate-shaped member 182*a* that faces the storage area 104 (front side) is tilted with respect to the lower surface of the carriage frame 82.

There is no limitation on the number and layout of covers 120. Covers 120 that contact side surfaces of the receptacle 102 may be disposed on the rear end of the carriage frame 82 and the front end of the carriage frame 82. According to the modification, when the receptacle 102 is stored in the storage area 104, two side surfaces (front and rear side surfaces) of the receptacle 102 are sandwiched by a pair of covers 120. The receptacle 102 is thus restrained from swinging (vibrating). Particularly, the receptacle 102 can easily be restrained from swinging (vibrating) in the lengthwise directions (forward and rearward directions) of the carriage frame 82.

Further, covers 120 may be disposed individually on the front end, rear end, and both side ends of the carriage frame 82. According to the modification, the receptacle 102 stored in the storage area 104 has four side surfaces (front surface, rear surface, and both side surfaces) held in contact with the respective covers 120. The receptacle 102 is thus restrained from swinging (vibrating). Particularly, the receptacle 102 can easily be restrained from swinging (vibrating) in the lengthwise directions (forward and rearward directions) and the widthwise directions of the carriage frame 82.

Figure 25A:
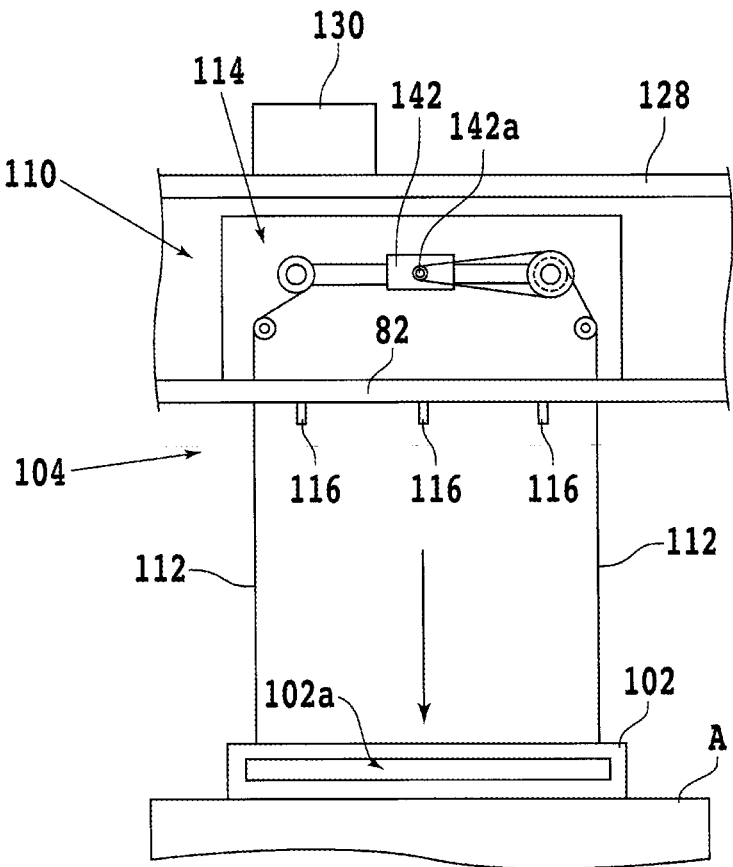
FIG. 25A is a side elevational view of the transport carriage at the time when the receptacle stored in the storage area is placed in the rest area.

When the receptacle 102 is lifted and lowered, rotation of the electric motor 142, etc., of the lifting and lowering unit 110 is controlled by the controller 130. FIG. 25A illustrates, in side elevation, the transport carriage 10 at the time when the receptacle 102 stored in the storage area 104 is placed in the rest area A. For placing the receptacle 102 in the rest area A, the direction in which the electric motor 142 rotates its rotational shaft 142*a* and the rotational speed at which the electric motor 142 rotates its rotational shaft 142*a* are controlled to reel out the suspending members 112 from the drive mechanism 114 at a desired speed. For example, the controller 130 controls the current value of the electric motor 142 to keep a rotational speed of the electric motor 142.

Figure 25B:
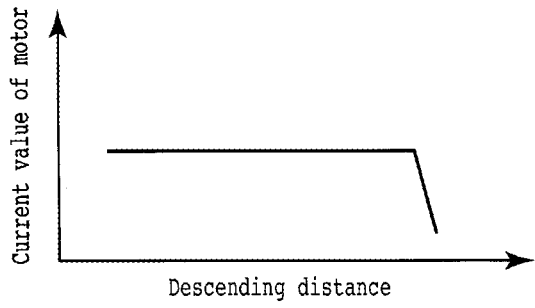
FIG. 25B is a graph illustrating electric current values of an electric motor at the time when the receptacle is lowered.

FIG. 25B is a graph illustrating electric current values of the electric motor 142 at the time when the receptacle 102 is lowered. When the receptacle 102 is lowered and reaches the rest area A, the receptacle 102 is supported from below in the rest area A. As a result, the load acting on the rotational shaft 142*a* of the electric motor 142 is weakened, reducing the current value of the electric motor 142.

The controller 130 stops rotating the electric motor 142 on the basis of a change in the electric current value of the electric motor 142 at the time when the receptacle 102 is placed in the rest area A. For example, the controller 130 stores a predetermined threshold value in advance, and compares the threshold value and the current value of the electric motor 142. If the current value of the electric motor 142 is equal to or smaller than the threshold value (or is smaller than the threshold value), then the controller 130 stops rotating the electric motor 142. The step of placing the receptacle 102 in the rest area A is then completed.

Figure 26A:
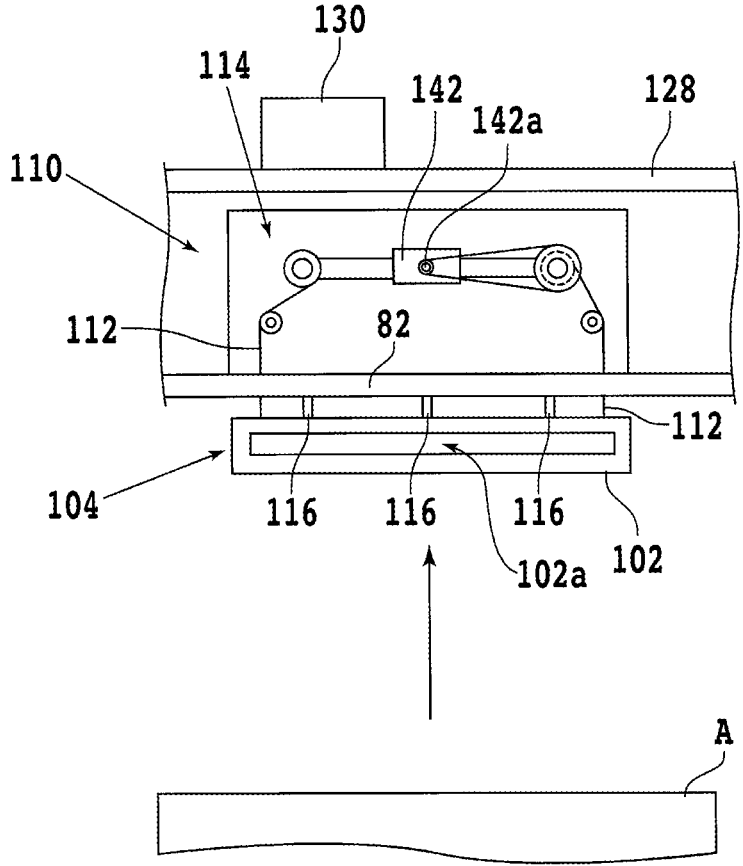
FIG. 26A is a side elevational view of the transport carriage at the time when the receptacle placed in the rest area is stored into the storage area.

FIG. 26A illustrates, in side elevation, the transport carriage 10 at the time when the receptacle 102 placed in the rest area A is stored in the storage area 104. For storing the receptacle 102 in the storage area 104, the direction in which the electric motor 142 rotates its rotational shaft 142*a* and the rotational speed at which the electric motor 142 rotates its rotational shaft 142*a* are controlled to wind the suspending members 112 into the drive mechanism 114 at a desired speed. For example, the controller 130 controls the current value of the electric motor 142 to keep a rotational speed of the electric motor 142.

Figure 26B:
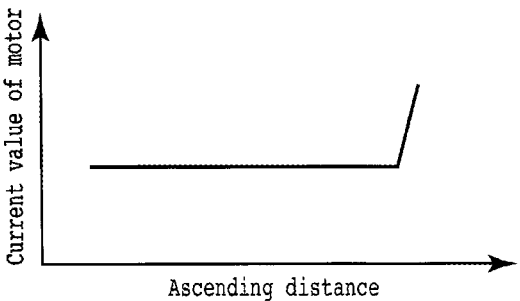
FIG. 26B is a graph illustrating electric current values of the electric motor at the time when the receptacle is lifted.

FIG. 26B is a graph illustrating electric current values of the electric motor 142 at the time when the receptacle 102 is lifted. When the receptacle 102 is lifted and reaches the storage area 104, the receptacle 102 is pressed against the contact the plurality of members 116 provided on the lower surface of the carriage frame 82. As a result, the load acting on the rotational shaft 142a of the electric motor 142 is increased, increasing the current value of the electric motor 142.

The controller 130 stops rotating the electric motor 142 on the basis of a change in the electric current value of the electric motor 142 at the time when the receptacle 102 is pressed against the contact members 116. For example, the controller 130 stores a predetermined threshold value in advance, and compares the threshold value and the current value of the electric motor 142. If the current value of the electric motor 142 is equal to or larger than the threshold value (or is larger than the threshold value), then the controller 130 stops rotating the electric motor 142. The step of storing the receptacle 102 in the storage area 104 is then completed.

In a case where the electric motor 142 that lifts and lowers the receptacle 102 is controlled in operation on the basis of the current value of the electric motor 142, it is not necessary to provide sensors that detect the receptacle 102, in the storage area 104 and the rest area A. Therefore, the transport carriage 10, the rest area A, etc., are simplified in structure. The weight of the transport carriage 10 is also reduced.

However, there is no limitation on how the electric motor 142 is controlled. For example, sensors (pushbutton-type switches or the like) configured to detect that the receptacle 102 is placed in position may be disposed on the lower surface of the carriage frame 82 and the upper surface of the rest area A. According to the modification, when the receptacle 102 is detected by one of the sensors, the controller 130 stops rotating the electric motor 142. Detection by the sensors and detection based on the current value of the electric motor 142 may be used in combination.

In a case where the rest area A side (loader/unloader 8 side) alone detects that the receptacle 102 is placed in the rest area A, the control unit 12 (see FIG. 8) of the transport system 2 instructs the transport carriage 10 to stop rotating the electric motor 142 after the control unit 12 has been notified by the rest area A side that the receptacle 102 is placed in the rest area A. Then, the controller 130 of the transport carriage 10 stops rotating the electric motor 142.

On the other hand, in a case where the transport carriage 10 side detects that the receptacle 102 is placed in the rest area A, the controller 130 of the transport carriage 10 stops rotating the electric motor 142 on its own without waiting for a command from the control unit 12 of the transport system 2. The time lag that occurs after the receptacle 102 has been placed in the rest area A until the electric motor 142 stops rotating is thus reduced.

The speed at which the receptacle 102 is lifted and lowered may not necessarily be constant. For example, immediately before the receptacle 102 is placed in the rest area A or stored in the storage area 104, the rotational speed of the electric motor 142 may be lowered to decelerate the receptacle 102, thereby dampening shocks produced when the receptacle 102 contacts the rest area A or the contact members 116. In this case, the controller 130 may monitor the height of the receptacle 102 on the basis of how much the electric motor 142 has rotated, for example.

When the receptacle 102 is placed in the rest area A, the controller 130 generates a signal indicating that the placing of the receptacle 102 has been completed, and sends the generated signal from the transmitter 134 to the control unit 12 (see FIG. 8) of the transport system 2. Further, when the receptacle 102 is stored in the storage area 104, the controller 130 generates a signal indicating that the storage of the receptacle 102 has been completed, and sends the generated signal from the transmitter 134 to the control unit 12 of the transport system 2. These signals may be sent to the processing apparatus 4.

The transport system 2 according to the present embodiment operates in ganged relation to the processing apparatus 4. For example, the transport carriage 10 stops in a stop zone on the transport path 6, and places the receptacle 102 housing a workpiece unit 17, etc., therein, on the upper surface of the lifting and lowering table 204 (rest area A). When the receptacle 102 is placed on the lifting and lowering table 204, the controller 130 of the transport carriage 10 generates a signal indicating the placing of the receptacle 102 and controls the transmitter 134 to send the signal. The signal is transmitted from the transmitter 134 to the control unit 12 of the transport system 2.

On the basis of the signal transmitted from the transmitter 134 of the transport carriage 10, the control unit 12 generates a signal for instructing the processing apparatus 4 to unload a workpiece unit 17, etc., to be processed, from the receptacle 102, and to load a processed workpiece unit 17, etc., into the receptacle 102. When the receiver 248 of the processing apparatus 4 has received the signal from the control unit 12 and the control device 246 has then received a command based on the signal, the control device 246 unloads the workpiece unit 17, etc., to be processed, from the receptacle 102 placed on the upper surface of the lifting and lowering table 204 (rest area A) to the first holding unit 220. The workpiece unit 17, etc., is then pulled out onto the guide rails 212.

For example, when a workpiece 11 starts being processed, the control device 246 adjusts the height of the lifting and lowering table 204 and pulls out a processed workpiece unit 17, etc., from the storage area provided below the rest area A, onto the guide rails 212. Then, the control device 246 houses the processed workpiece unit 17, etc., on the guide rails 212, into the receptacle 102 on the lifting and lowering table 204.

When the processed workpiece unit 17, etc., has been housed in the receptacle 102, the control device 246 of the processing apparatus 4 generates a signal indicating the housing of the processed workpiece unit 17, etc., and sends the signal from the transmitter 250 of the processing apparatus 4 to the control unit 12 of the transport system 2. In response to the signal transmitted from the transmitter 250, the control unit 12 generates a signal for instructing the transport carriage 10 to travel toward the next destination.

When the receiver 132 of the transport carriage 10 has received the signal from the control unit 12 and the controller 130 has then received a command based on the signal, the controller 130 controls the transport carriage 10 to travel toward the next destination. By using the transport system 2 in this way, the processing apparatus 4 can receive a workpiece unit 17, etc., to be processed at an appropriate time and retrieve a processed workpiece unit 17, etc., at an appropriate time.

As illustrated in FIGS. 2, 7, etc., the transport path 6 of the transport system 2 is installed on the upper surface of the ceiling 244a of the cover 244 of each of the processing apparatuses 4 and the upper surface of the ceiling 22a of the housing 22 of the loader/unloader 8. Specifically, the transport path 6 is disposed immediately over the plurality of processing apparatuses 4, the loader/unloader 8, etc., in order to interconnect the processing apparatuses 4, the loader/unloader 8, etc.

Consequently, the transport path 6 is kept out of physical interference with structures including the pipe connection panels 202c, the doors 244b, etc., on the side surfaces of the processing apparatuses 4. In other words, it is not necessary to take into account the structure of the side surfaces of the processing apparatuses 4 in designing the transport path 6. The transport system 2 can thus be constructed with ease. In addition, since the transport path 6 is disposed in a location lower than the ceiling of the factory or the like, it is easy to install the transport path 6.

In addition, for constructing the transport path 6 in an environment where a plurality of processing apparatuses 4, etc., have already been installed, it is not necessary to move over the processing apparatuses 4, etc., to secure a work space that will be required if a transport path 6 is to be installed on the ceiling of the factory, etc. Further, as the processing apparatuses 4, etc., that have already been installed provide a foundation for the transport path 6, the man-hours of a work step of constructing the transport path 6 are smaller than a case where a new foundation is to be laid out.

Figure 27:
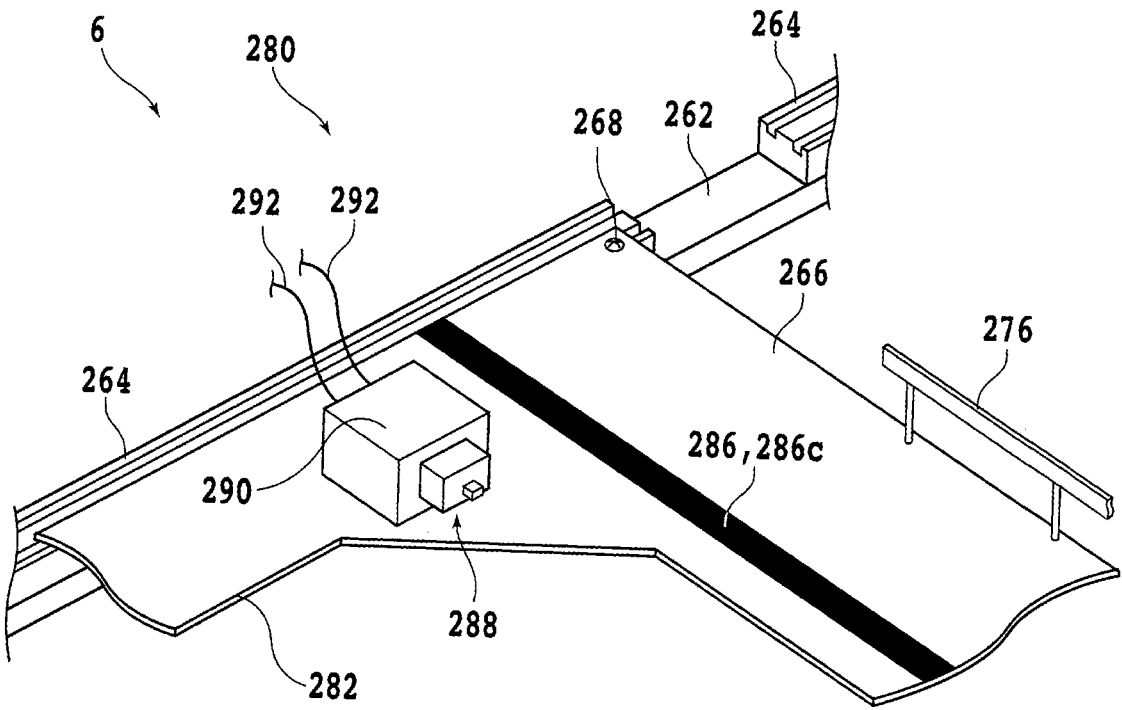
FIG. 27 is a perspective view illustrating part of a transport path installed on the processing apparatus (cutting apparatus)

FIG. 27 illustrates, in perspective, part of the transport path 6 installed on the processing apparatus 4. The transport path 6 installed on the loader/unloader 8 is structurally generally similar to the transport path 6 installed on the processing apparatus 4. A lower frame 262 is fixed by screws, bolts, or the like to the ceilings 244a of the plurality of processing apparatuses 4 and the ceiling 22a of the loader/unloader 8.

The lower frame 262 includes a composite assembly of bar-shaped frame members made of a material including metal such as aluminum, for example, and is assembled into a shape that interconnects the adjacent processing apparatuses 4 and the loader/unloader 8. The lower frame 262 is fixed to the ceilings 244a of the processing apparatuses 4, the ceiling 22a of the loader/unloader 8, etc., providing a foundation for the transport path 6.

For fixing the lower frame 262 to the processing apparatuses 4 and the loader/unloader 8, the height of the lower frame 262 with respect to the processing apparatuses 4, the loader/unloader 8, etc., is adjusted such that the lower frame 262 has a generally horizontal upper surface and that the height of the upper surface of the lower frame 262 is generally constant.

The transport path 6 thus lies horizontally at the same height even if the heights of the ceilings 244a of the processing apparatuses 4, the ceiling 22a of the loader/ unloader 8, etc., are not completely equal to each other. Though there is no limitation on how to adjust the height of the lower frame 262 with respect to the processing apparatuses 4, the loader/unloader 8, etc., one adjusting step uses members for height adjustment to be disposed between the ceilings 244a of the processing apparatuses 4, the ceiling 22a of the loader/unloader 8, etc., and the lower surface of the lower frame 262.

Needless to say, the heights of the processing apparatuses 4 and the loader/unloader 8 may be adjusted. For example, the processing apparatus 4 and the loader/unloader 8 include height adjustment mechanisms at their lower ends (legs). These height adjustment mechanisms may be used to equalize the heights of the ceilings 244a of the processing apparatuses 4, the ceiling 22a of the loader/unloader 8, etc., and to make the lower frame 262 suitable as a foundation for the transport path 6.

An upper frame 264 is fixed by screws, bolts, or the like to the upper surface of the lower frame 262. The upper frame 264 includes a composite assembly of bar-shaped frame members made of a material including metal such as aluminum, for example, and is assembled into a shape that matches the layout of the transport path 6 such that the transport path 6 can suitably be secured thereto.

The transport path 6 is disposed on the upper frame 264. The transport path 6 includes a horizontal array of a plurality of floor panels 266 each shaped as a flat plate, for example. Since the floor panels 266 are combined into the transport path 6, various transport paths 6 can easily be realized depending on various possible layouts of a plurality of processing apparatuses 4 and a loader/unloader 8.

Each of the floor panels 266 is made of a lightweight and highly strong material such as polyamide, polycarbonate, or carbon-fiber-reinforced plastic (CFRP), and is of a rectangular shape as viewed in plan. The floor panel 266 has a flat upper surface suitable for the transport carriage 10 to travel thereon. The floor panel 266 has through holes defined vertically therethrough in an end portion thereof.

The upper frame 264 has threaded holes (not illustrated) defined in an upper surface thereof and having a diameter corresponding to the diameter of screws 268. The threaded holes are open at positions aligned with the through holes in the floor panel 266 placed on the upper frame 264. The floor panel 266 that is placed on the upper surface of the upper frame 264 is fixed to the upper frame 264 by the screws 268 that are threaded through the through holes into the threaded holes in the upper frame 264.

The lower frame 262 is constructed of a combination of a plurality of lower frame units 270 (see FIGS. 28A and 28B) each including a plurality of bar-shaped frame members, for example. Similarly, the upper frame 264 is constructed of a combination of a plurality of upper frame units 272 (see FIGS. 30A and 30B) each including a plurality of bar-shaped frame members, for example.

Inasmuch as the lower frame 262 is constructed of the plurality of lower frame units 270 each including the bar-shaped frame members and the upper frame 264 is constructed of the plurality of upper frame units 272 each including the bar-shaped frame members, when the lower frame 262 and the upper frame 264 are to be assembled, the bar-shaped frame members are delivered in the form of the lower frame units 270 and the upper frame units 272, into a factory where the processing apparatuses 4 are installed.

In the factory, the lower frame 262 and the upper frame 264 can be combined into a high-quality assembly by using the lower frame units 270 and the upper frame units 272 that can be manufactured to a high quality in a stable environment. The lower frame 262 and the upper frame 264 can be assembled without a tedious and time-consuming step of joining the bar-shaped frame members over the processing apparatus 4. Accordingly, the transport path 6 can be produced to a high quality within a short period of time.

Figure 28A:
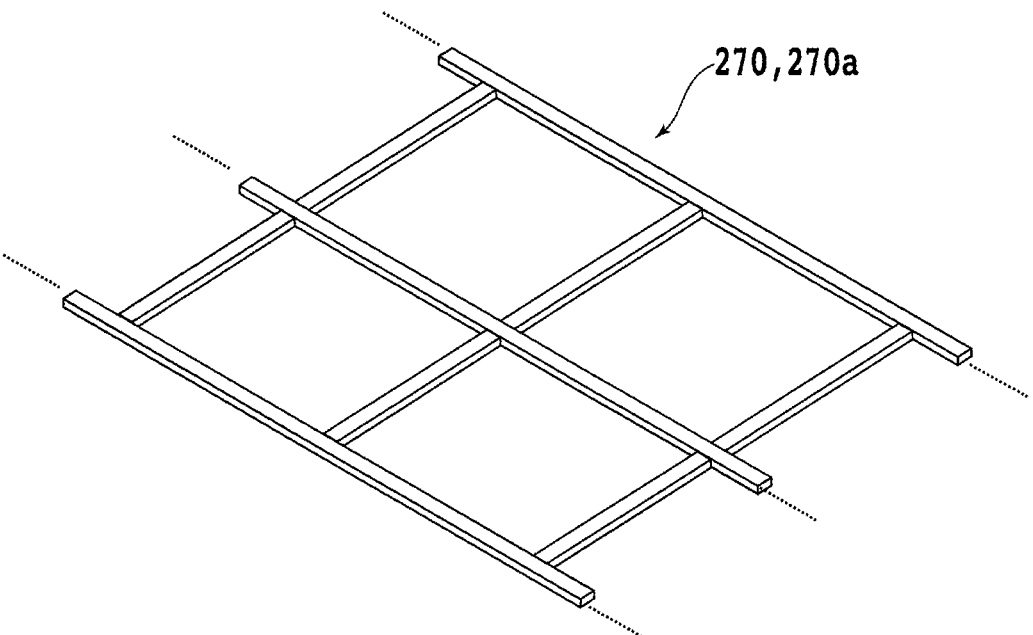
FIGS. 28A and 28B are perspective views illustrating lower frame units included in a lower frame.
Figure 28B:
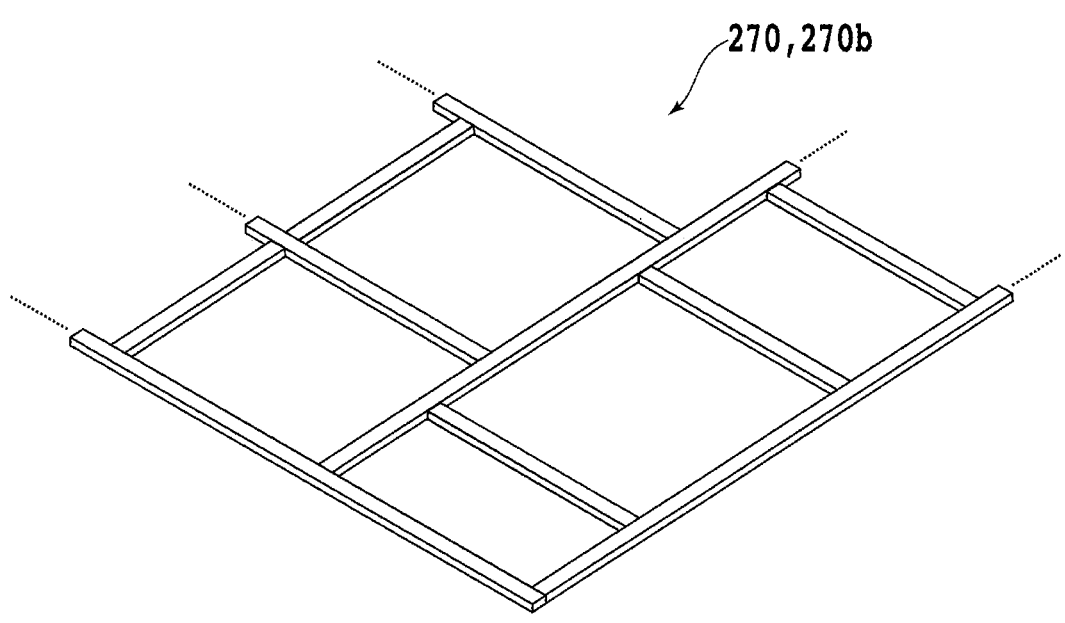

FIG. 28A illustrates, in perspective, a lower frame unit 270a as a component of the lower frame 262, and FIG. 28B illustrates, in perspective, a lower frame unit 270b as a component of the lower frame 262. The lower frame unit 270a and the lower frame unit 270b are selectively used to match portions of the transport path 6.

Figure 29:
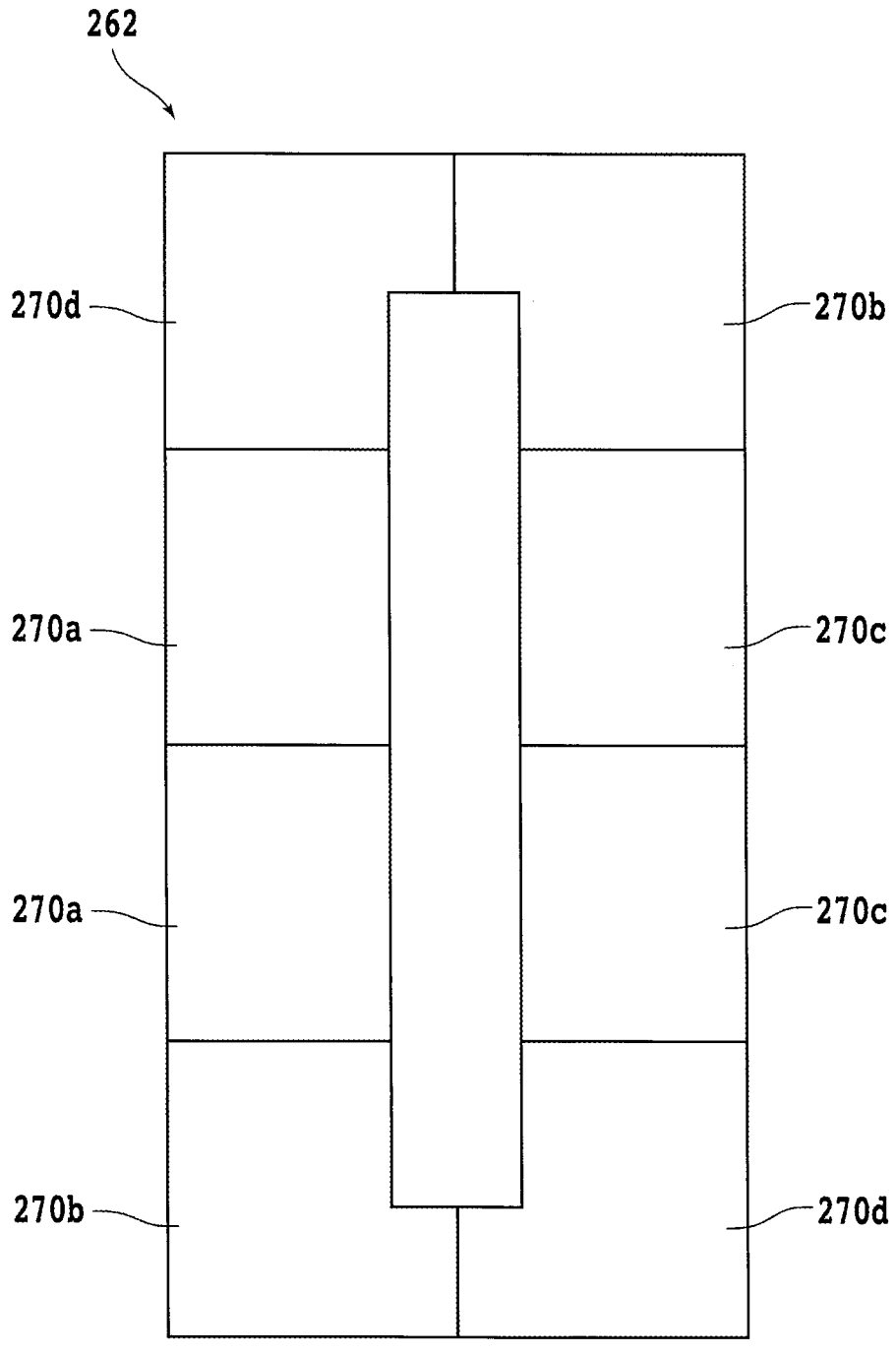
FIG. 29 is a plan view illustrating a layout of the lower frame units included in the lower frame.

FIG. 29 illustrates, in plan, a layout of lower frame units 270 included in the lower frame 262. In FIG. 29, the lower frame 262 is configured to support a transport path 6 that transports workpiece units 17 and trays 33 between a total of eight apparatuses (processing apparatus 4, a loader/unloader 8, etc.,). For example, the lower frame units 270a are used below areas of the transport path 6 except corners thereof (straight areas of the transport path 6), and the lower frame units 270b are used below the corners of the transport path 6.

The lower frame 262 illustrated in FIG. 29 further includes lower frame units 270c that are of a structure inverted from the lower frame units 270a and lower frame units 270d that are of a structure inverted from the lower frame units 270b. In other words, the lower frame 262 illustrated in FIG. 29 is constructed of eight lower frame units 270 of four different types each including two lower frame units 270. The lower frame units 270 are arranged such that their bar-shaped frame members do no overlap openings 282 (see FIG. 32, corresponding to the opening 6a in FIG. 9) defined in the transport path 6.

For assembling the lower frame 262, for example, the lower frame units 270 may first be fixed to the processing apparatus 4, the loader/unloader 8, etc., and then, adjacent ones of the lower frames 270 may be joined together. The adjacent ones of the lower frames 270 may be joined together by joints, for example. Alternatively, the lower frame units 270 may first be joined together and then may be fixed to the processing apparatus 4, the loader/unloader 8, etc.

Figure 30A:
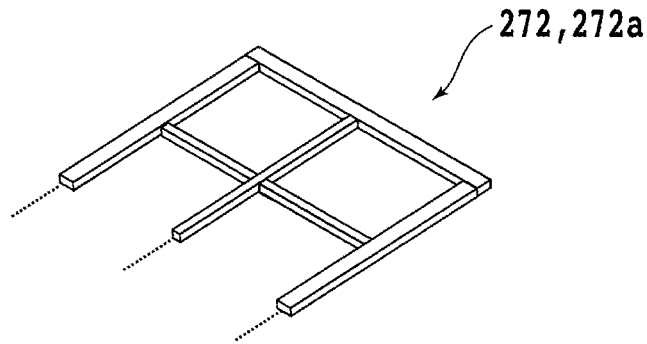
FIGS. 30A and 30B are perspective views illustrating upper frame units included in an upper frame.
Figure 30B:
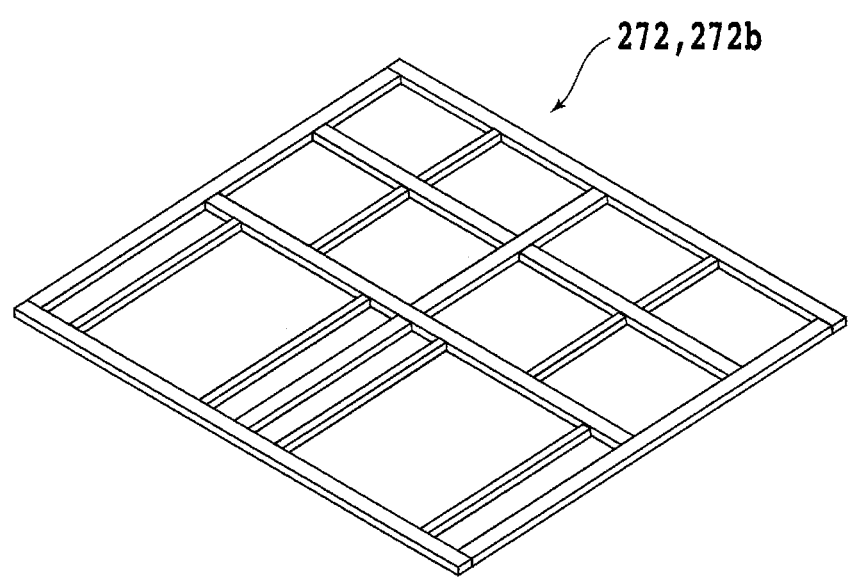

FIG. 30A illustrates, in perspective, an upper frame unit 272a as a component of the upper frame 264, and FIG. 30B illustrates, in perspective, an upper frame unit 272b as a component of the upper frame 264. The upper frame unit 272a and the upper frame unit 272b are selectively used to match portions of the transport path 6.

Figure 31:
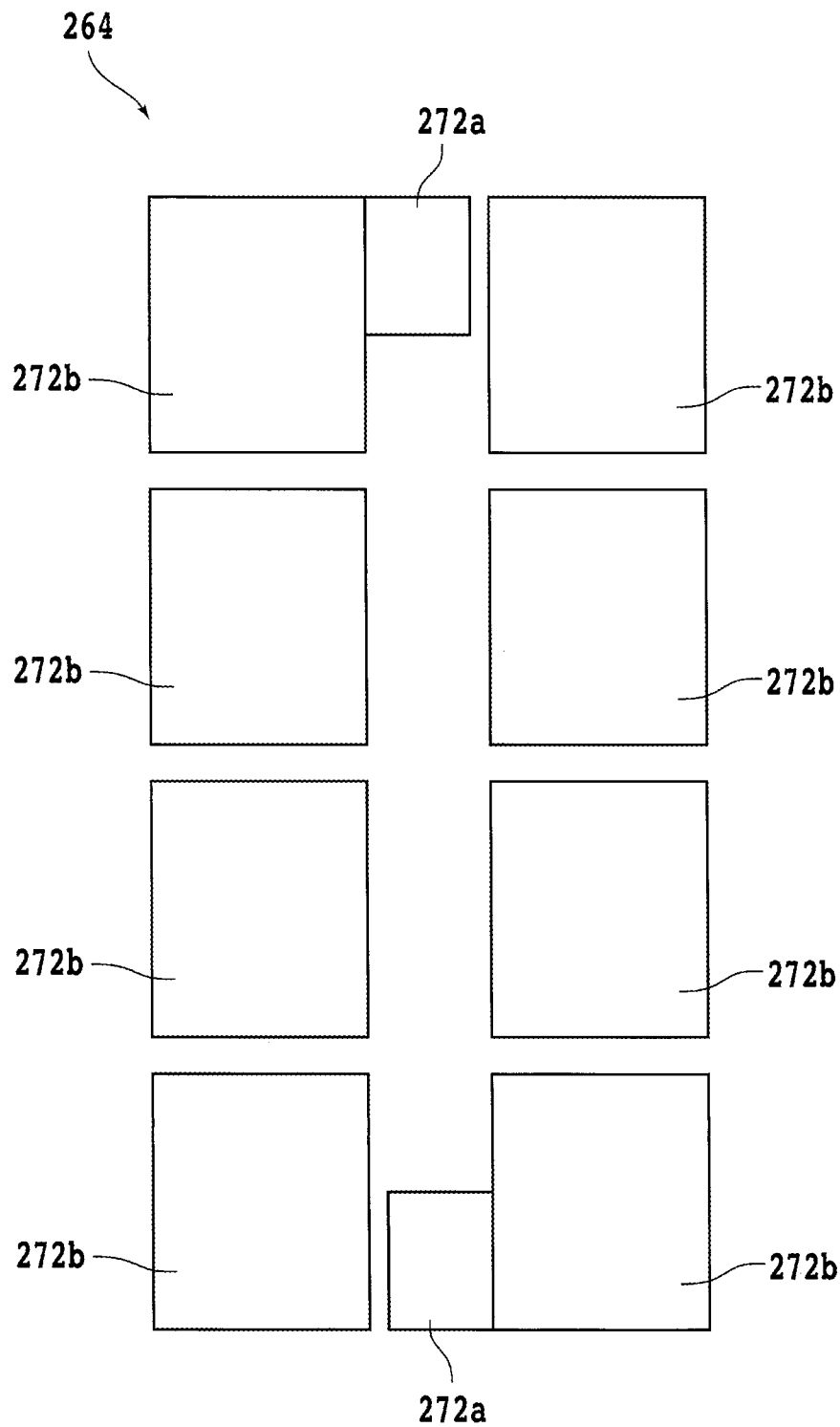
FIG. 31 is a plan view illustrating a layout of the upper frame units included in the upper frame.

FIG. 31 illustrates, in plan, a layout of upper frame units 272 included in the upper frame 264. In FIG. 31, the upper frame 264 is configured to support the transport path 6, by using the lower frame 262 illustrated in FIG. 29. For example, the upper frame units 272a are used below areas of the transport path 6 that interconnect the adjacent processing apparatuses 4, the loader/unloader 8, etc., and the upper frame units 272b are used below areas of the transport path 6 directly above the processing apparatuses 4, the loader/unloader 8, etc.

The upper frame 264 illustrated in FIG. 31 is constructed of two upper frame units 272a and eight upper frame units 272b. The upper frame units 272 are arranged such that their bar-shaped frame members do not overlap the openings 282 (see FIG. 32) defined in the transport path 6.

For assembling the upper frame 264, the upper frame units 272 are fixed to the lower frame 262, for example. Adjacent two of the upper frame units 272 are not coupled to each other and may be spaced from each other. If necessary, upper frame units 272 that are of a structure inverted from the upper frame units 272a and upper frame units 272 that are of a structure inverted from the upper frame units 272b may be used.

Figure 32:
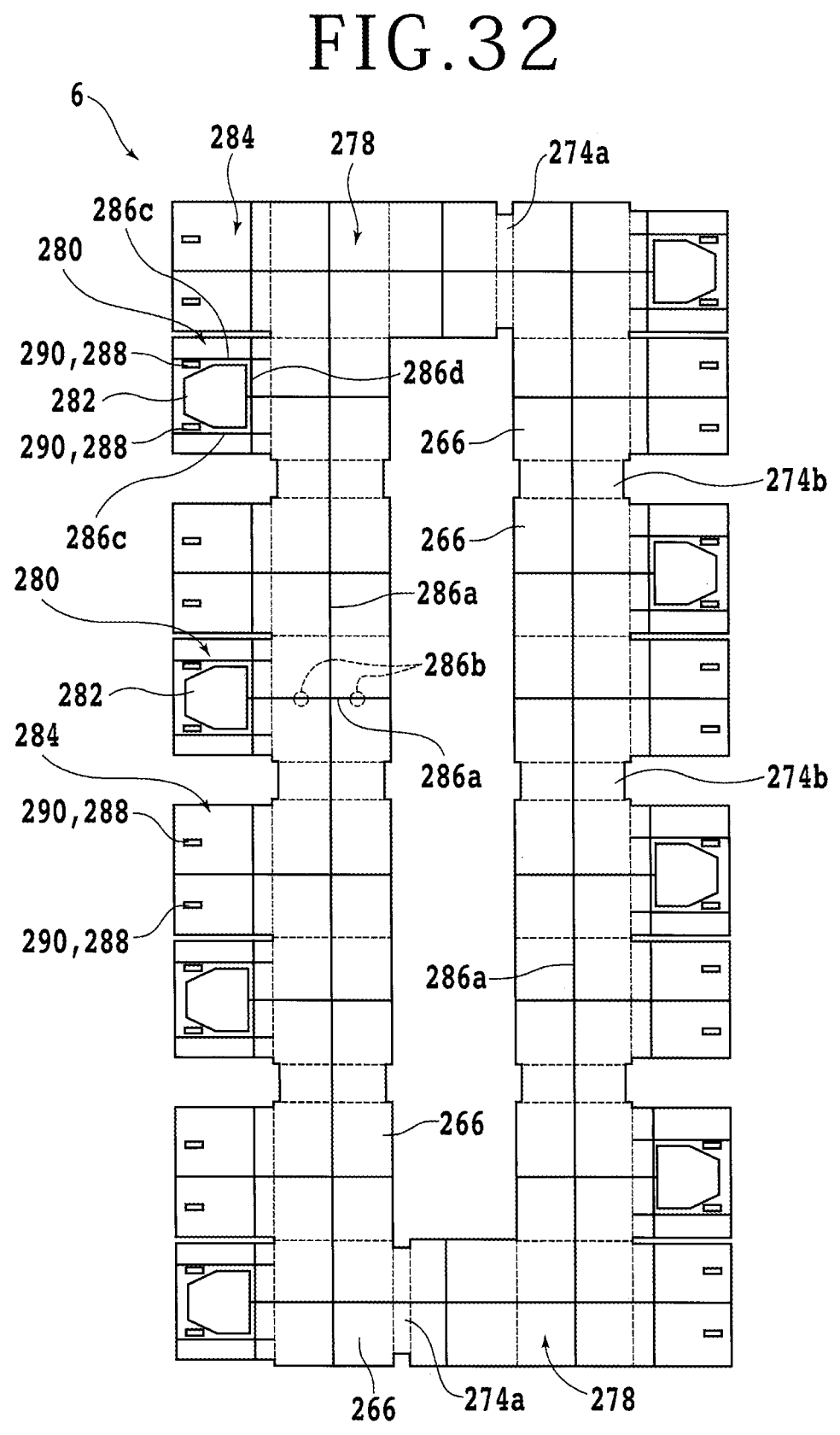

FIG. 32 schematically illustrates, in plan, the transport path 6 that includes a plurality of floor panels 266. In FIG. 32, the transport path 6 is constructed of the lower frame 262 illustrated in FIG. 29 and the upper frame 264 illustrated in FIG. 31. Further, in FIG. 32, the boundary between the adjacent floor panels 266 is indicated by a broken line.

For assembling the transport path 6, the floor panels 266 are fixed to the upper frame 264, for example. In the upper frame 264 illustrated in FIG. 31, a small gap is defined between the upper frame unit 272a and the upper frame unit 272b that are adjacent to each other, and a large gap is defined between the adjacent upper frame units 272b. By using only the floor panels 266 that are rectangular in shape as viewed in plan, the transport path 6 fails to extend across the gaps, i.e., has corresponding gaps defined in itself.

Small bridge panels 274a each in the shape of a flat plate and large bridge panels 274b each in the shape of a flat plate are used to fill the gaps. The small bridge panel 274a is disposed in the small gap defined between the upper frame unit 272a and the upper frame unit 272b that are adjacent to each other, and the large bridge panel 274b is disposed in the large gap defined between the adjacent upper frame units 272b.

The bridge panels 274a and the bridge panels 274b are fixed to the upper frame 264 in order to sufficiently reduce gaps and steps defined in the transport path 6, for example. The bridge panels 274a and the bridge panels 274b are effective to reduce shocks applied to the transport carriage 10 and prevent damage to the workpiece 11, etc., while the transport carriage 10 is traveling on the transport path 6. In a case where small gaps still remain in the transport path 6, they may be closed by using a tape or the like that includes a core extending along the direction in which the transport carriage 10 travels.

The bridge panels 274a and the bridge panels 274b may be replaced with bridge panels each having slopes on respective both ends thereof along the direction in which the transport carriage 10 travels. Since such bridge panels can be used in overlapping relation to the floor panels 266, requirements for the size of the bridge panels are made less strict, thereby rendering the bridge panels more versatile. The adjacent floor panels 266 may be interconnected by using a bridge panel in the form of a flexible thin sheet.

When the transport carriage 10 travels on the transport path 6 thus constructed, a workpiece 11, etc., housed in the receptacle 102 of the transport carriage 10 may be adversely affected by static electric charges generated by friction between the transport path 6 and the wheels 86, etc., of the transport carriage 10. If semiconductor devices are formed on the workpiece 11, for example, then the semiconductor devices may possibly be broken by the static electric charges.

It is therefore preferable to have electrically conductive members exposed on portions, to be contacted by the wheels 86, etc., of the upper surfaces of the floor panels 266 of the transport path 6. The electrically conductive members may be made of metal such as aluminum or copper, or made of CFRP or the like. If the floor panels 266 are made of CFRP, then CFRP is exposed on the upper surfaces thereof. In other words, electrically conductive members are exposed on the upper surfaces of the floor panels 266.

The electrically conductive members that are exposed on the upper surfaces of the floor panels 266 are effective to restrain static electric charges from being generated by friction and from being accumulated, thereby preventing the workpiece 11, etc., from being adversely affected. The electrically conductive members that are exposed on the upper surfaces of the floor panels 266 may be connected to ground by electrically conductive wires (not illustrated). If the electrically conductive members are connected to ground, since the static electric charges generated by contact between the wheels 86, etc., and the floor panels 266 are discharged through the electrically conductive wires, the static electric charges are not accumulated in the floor panels 266. Therefore, the workpiece 11, etc., is transported more safely by the transport carriage 10.

In the transport system 2 according to the present embodiment, the transport carriage 10 is controlled in operation basically not to reach the end of the transport path 6. However, in the event that the transport carriage 10 or the control unit 12, etc., suffers some trouble, the transport carriage 10 may reach the end of the transport path 6 and may possibly drop off the transport path 6 from the end.

Therefore, as illustrated in FIG. 27, it is desirable to provide the end of the transport path 6 with a guard 276 acting as a barrier that prevents the transport carriage 10 from dropping off the transport path 6. The guard 276 is made of a material including metal such as aluminum, for example, and is fixed to the upper frame 264 or the floor panel 266. The height from the upper surface of the floor panel 266 to the upper end of the guard 276 is larger than the radius of the wheels 86 of the transport carriage 10 and preferably larger than the diameter of the wheels 86, for example.

The guard 276 may be of such a height that it can contact the third sensors 126 and the outer cover of the transport carriage 10. In this case, when the guard 276 contacts the third sensors 126 or the outer cover of the transport carriage 10, the transport carriage 10 detects a collision with the obstacle and stops moving. Therefore, the transport carriage 10 can travel more safely on the transport path 6.

As illustrated in FIG. 32, the transport path 6 includes a travel zone 278 that is mainly used for the transport carriage 10 to travel on, stop zones 280 that are mainly used for the transport carriage 10 to stop on, and wait zones 284 that are mainly used for the transport carriage 10 to wait on. A workpiece unit 17 or a tray 33 is transported between the transport carriage 10 stopped in one of the stop zones 280 and the processing apparatus 4 or the loader/unloader 8, etc., positioned below the stop zone 280.

The travel zone 278 is of an annular shape along the layout of the processing apparatus 4, the loader/unloader 8, etc. The transport carriage 10 travels in one direction along the annular travel zone 278, but not in the other direction (that is, the annular travel zone 278 is a one-way travel zone). The transport carriage 10 can thus travel safely under simple control.

However, the travel zone 278 is not limited to any particular configurations, and the transport carriage 10 is not limited to any particular modes of travel. For example, the travel zone 278 may be arranged to allow the transport carriage 10 to travel bidirectionally. Further, the travel zone 278 may not necessarily be of an endless annular shape and may be of a straight shape with terminal ends.

Each of the stop zones 280 has an opening 282 defined vertically through the floor panel 266. The opening 282 is slightly larger than the upper and lower surfaces of the receptacle 102, for example, and allows the receptacle 102 to pass vertically therethrough. The width of the opening 282 in a direction perpendicular to the direction in which transport carriage 10 enters the stop zone 280 is smaller than the distance between the wheels 86 of the transport carriage 10. Therefore, providing the transport carriage 10 enters the stop zone 280 in an appropriate direction, the wheels 86 do not drop into the opening 282.

Each of the wait zones 284 is disposed in an area where it is highly possible for transport carriages 10 to wait, for example. With a transport carriage 10 waiting in the wait zone 284, another transport carriage 10 can pass the transport carriage 10 in the wait zone 284. In a case where transport carriages 10 are allowed to travel bidirectionally, two transport carriages 10 can cross on the transport path 6 by having one of them temporarily waiting in the wait zone 284. The transport path 6 may not necessarily include the wait zones 284.

The upper surfaces of the floor panel 266, bridge panel 274*a*, bridge panel 274*b*, etc., that are included in the transport path 6 have a plurality of types of marks 286 (see FIG. 27) for guidance that can be detected by a sensor on the transport carriage 10. The transport carriage 10 is controlled to travel, turn, stop, etc., on the basis of various types of marks 286 detected by the sensor.

As illustrated in FIG. 27, each of the marks 286 is of a straight shape colored in a hue different from other regions of the upper surfaces of the floor panels 266, etc., for example. According to the present embodiment, as illustrated in FIG. 32, the marks 286 include first marks 286*a*, second marks 286*b*, third marks 286*c*, and fourth marks 286*d*.

The marks 286 are not limited to any particular patterns. The marks 286 may include curved lines and may include broken lines. Further, letters, numbers, symbols, etc., may be used as the marks 286. In addition, the marks 286 are not limited to any particular hues. For example, the marks 286 may be colored in different hues, and the transport carriage 10 may be arranged to be controlled in various ways on the basis of the hues of the marks 286.

The travel zone 278 has first marks 286*a* extending along the direction in which the transport carriage 10 moves ahead. The first marks 286*a* are formed in a region where the transport carriage 10 traveling in the travel zone 278 is to pass. Specifically, the first marks 286*a* are disposed immediately beneath the pair of first sensors 122 of the transport carriage 10 traveling in the travel zone 278.

Figure 33:
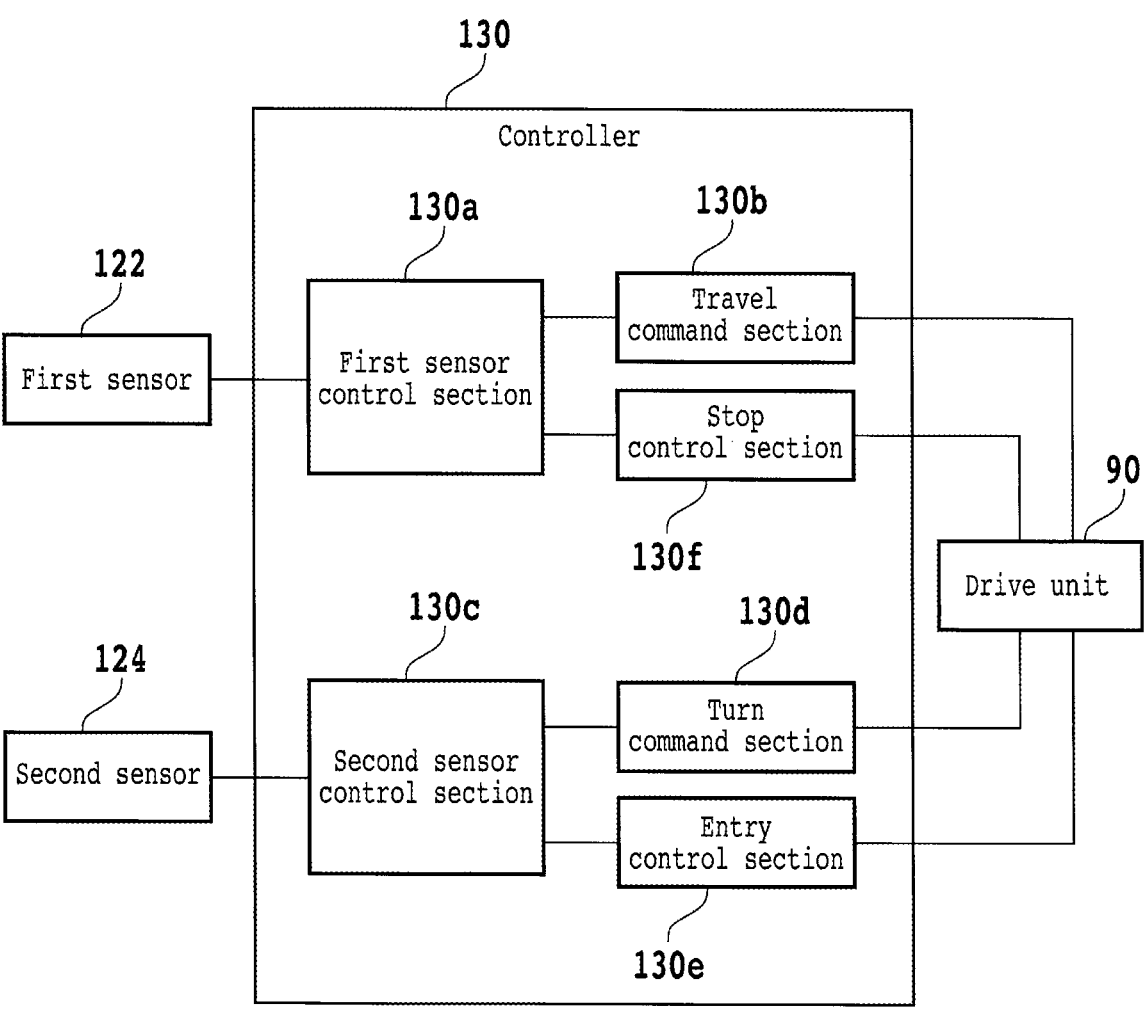
FIG. 33 is a functional block diagram of a controller of the transport carriage.

FIG. 33 illustrates the controller 130 of the transport carriage 10 in functional block form. As illustrated in FIG. 33, the controller 130 of the transport carriage 10 includes a first sensor control section 130*a* that controls each of the pair of first sensors 122 to monitor the upper surface of the travel zone 278, etc., (transport path 6) and to detect the first marks 286*a*, and a travel command section 130*b* that specifies the orientation of the first marks 286*a* detected by the first sensors 122 and that controls the transport carriage 10 to travel along the specified orientation.

Each of the pair of first sensors 122 detects some of the first marks 286*a* according to a control signal input from the first sensor control section 130*a*. Information regarding the first marks 286*a* detected by the first sensors 122 is sent via the first sensor control section 130*a* to a travel command section 130*b*.

The travel command section 130*b* specifies the direction represented by the first marks 286*a*, on the basis of the information regarding the first marks 286*a* sent from the first sensor control section 130*a*. Then, the travel command section 130*b* controls the drive unit 90 to cause the transport carriage 10 to travel along the specified orientation. Accordingly, the transport carriage 10 detects some of the first marks 286*a* with the pair of first sensors 122 and travels on the transport path 6 along the first marks 286*a*.

As illustrated in FIG. 32, two straight first marks 286*a* cross each other in predetermined portions of the travel zone 278. While the transport carriage 10 is moving ahead along one of the first marks 286*a*, the transport carriage 10 detects, with the second sensors 124, the other of the first marks 286*a* that crosses the one of the first marks 286*a*. When the second sensors 124 detect the other first mark 286*a*, the transport carriage 10 is turned if necessary.

In other words, the direction in which the transport carriage 10 moves ahead is changed at any intersection where the two straight first marks 286*a* cross each other. Part of the other first mark 286*a* detected by the second sensors 124 functions as a second mark 286*b* indicating a position to which the transport carriage 10 is to be turned. On the transport path 6, there exist as many second marks 286*b* as the number of intersections where two first marks 286*a* cross each other. In other words, a plurality of second marks 286*b* exist on the transport path 6 illustrated in FIG. 32.

As illustrated in FIG. 33, the controller 130 of the transport carriage 10 includes a second sensor control section 130*c* that controls the second sensors 124 to monitor the upper surface of the travel zone 278, etc., (transport path 6) and to detect the second marks 286*b*, and a turn command section 130*d* that counts the number of second marks 286*b* detected by the second sensors 124 and that turns the transport carriage 10 on the basis of the counted number of second marks 286*b*.

The second sensors 124 detect the second marks 286*b* according to a control signal input from the second sensor control section 130*c*. Each time the second sensors 124 detects a second mark 286*b*, for example, the second sensor control section 130*c* notifies the turn command section 130*d* of the detection of the second mark 286*b*.

On the basis of the notification from the second sensor control section 130*c*, the turn command section 130*d* counts the number of second marks 286*b* detected by the second sensors 124, and compares the counted number with the number (a predetermined number) of second marks 286*b* according to an instruction from the control unit 12 of the transport system 2, for example. Then, when the number of second marks 286*b* detected by the second sensors 124 reaches the number of second marks 286*b* according to the instruction from the control unit 12, the turn command section 130*d* controls the drive unit 90 to turn the transport carriage 10.

In other words, the turn command section 130*d* changes the orientation of the transport carriage 10 depending on the number of detected second marks 286*b*. The transport carriage 10 can thus detect the second marks 286*b* with the second sensors 124 and can change its orientation if necessary. The second marks 286*b* are disposed, for example, at the corners of the travel zone 278 (corners of the transport path 6), portions of the travel zone 278 that are positioned adjacently to the stop zones 280, portions of the travel zone 278 that are positioned adjacently to the wait zones 284, etc.

If the pair of second sensors 124 are disposed on a straight line passing through the pair of wheels 86, then the second sensors 124 can detect a second mark 286*b* at the same time that the wheels 86 pass over the second mark 286*b*. Consequently, by causing the transport carriage 10 to turn at the time when the second mark 286*b* is detected, the pair of first sensors 122 are prevented from being shifted largely from a first mark 286*a* to be detected after the transport carriage 10 has turned. In other words, the transport carriage 10 can appropriately be turned without making any corrections.

As illustrated in FIG. 32, the stop zones 280 have third marks 286*c* extending along the direction in which the transport carriage 10 enters the stop zones 280. In other words, the third marks 286*c* represent the directions along which the transport carriage 10 enters the stop zones 280. In each of the stop zones 280, for example, the third marks 286*c* are formed at respective two positions one on each side of the opening 282 in a direction perpendicular to the direction along which the transport carriage 10 enters the stop zone 280. The third marks 286*c* are detected by the second sensors 124 of the transport carriage 10.

As illustrated in FIG. 33, the controller 130 of the transport carriage 10 includes an entry control section 130*e* that controls the transport carriage 10 to enter the stop zones 280 along the direction indicated by the third marks 286*c* detected by the second sensors 124. The entry control section 130*e* is electrically connected to the second sensor control section 130*c*.

The second sensor control section 130*c* controls the second sensors 124 to monitor the upper surface of the stop zones 280, etc., (transport path 6) and to detect the third marks 286*c*. Information regarding the third marks 286*c* detected by the second sensors 124 is sent via the second sensor control section 130*c* to the entry control section 130*e*.

The entry control section 130*e* specifies the orientation represented by the third marks 286*c*, on the basis of the information regarding the third marks 286*c* input from the second sensor control section 130*c*. Then, the entry control section 130*e* controls the drive unit 90 to cause the transport carriage 10 to enter the stop zone 280 along the specified orientation. The third marks 286*c* are typically disposed in a region where the wheels 86 of the transport carriage 10 are to pass. However, there is no limitation on the layout of the third marks 286*c*.

As illustrated in FIG. 32, fourth marks 286*d* that extend transversely to the first marks 286*a* and the third marks 286*c* are disposed behind (on the near side of) the stop zones 280 (or the wait zones 284) in the direction along which the transport carriage 10 enters the stop zones 280 (or the wait zones 284). The fourth marks 286*d* represent the positions of the stop zones 280 (or the wait zones 284).

As illustrated in FIG. 33, the controller 130 of the transport carriage 10 includes a stop control section 130*f* that stops the transport carriage 10 when one of the fourth marks 286*d* is detected by the first sensor 122 (one of the pair of first sensors 122) positioned behind in the direction along which the transport carriage 10 moves ahead. The stop control section 130*f* is electrically connected to the first sensor control section 130*a*.

The first sensor control section 130*a* controls the first sensors 122 to monitor the upper surface of the travel zone 278, the stop zones 280, etc., (transport path 6) and to detect the fourth marks 286*d*. When the fourth marks 286*d* are detected by the first sensors 122, information regarding the detection of the fourth marks 286*d* is sent via the first sensor control section 130*a* to the stop control section 130*f*.

In response to the information regarding the detection of the fourth marks 286*d* from the first sensor control section 130*a*, the stop control section 130*f* controls the drive unit 90 to stop the transport carriage 10 quickly. In other words, when the rear first sensor 122 detects one of the fourth marks 286*d*, the transport carriage 10 stops immediately, for example.

Each of the fourth marks 286*d* may be disposed forwardly of (on the far side of) the stop zones 280 (or the wait zones 284) in the direction along which the transport carriage 10 enters the stop zones 280 (or the wait zones 284). According to the modification, when the front first sensor 122 detects one of the fourth marks 286*d*, the transport carriage 10 stops immediately.

The fourth marks 286*d* may be disposed at positions where the fourth marks 286*d* can be detected by the second sensors 124. According to the modification, the stop control section 130*f* illustrated in FIG. 33 is electrically connected to the second sensor control section 130*c*. When the second sensors 124 controlled by the second sensor control section 130*c* detect one of the fourth marks 286*d*, the stop control section 130*f* controls the drive unit 90 to stop the transport carriage 10.

Further alternatively, the stop control section 130*f* may stop the transport carriage 10 after the elapse of a predetermined period of time from the detection of a fourth mark 286$d$ by the first sensors 122 or the second sensors 124. The time to be consumed from the detection of the fourth mark 286$d$ until the transport carriage 10 is to be stopped is adjusted on the basis of the distance between the fourth mark 286$d$ and the stop zone 280, the speed at which the transport carriage 10 travels, etc.

As illustrated in FIG. 32, terminals (feeder terminals) 288 that supply electric power and that are electrically connected to a power supply (not illustrated) are disposed forwardly of (on the far side of) the stop zones 280 and the wait zones 284 in the direction along which the transport carriage 10 enters the stop zones 280 and the wait zones 284. For example, when a transport carriage 10 is stopped in a stop zone 280 or a wait zone 284 and the terminals (power receiving terminals) 100 of the transport carriage 10 are then brought into contact with the terminals 288, the battery (secondary battery) 96 is supplied with charging electric power through the terminals 100 and the charging wires 98. In other words, the battery 96 is charged.

As illustrated in FIG. 27, each of the terminals 288 is supported by a terminal support 290 fixed to the floor panel 266 or the upper frame 264, and is electrically connected to wires (feeder wires) 292 that supply electric power. In other words, the terminal 288 is electrically connected to the power supply through the wires 292 that supply electric power.

The terminal support 290 has, for example, a biasing member (not illustrated) that biases the terminal 288 toward the stop zone 280 or the wait zone 284. The terminal 288 that is biased by the biasing member is appropriately electrically connected to one of the terminals 100. The terminal 288 and the terminal support 290 are not limited to any particular structures, etc.

For example, after the transport carriage 10 has stopped in the stop zone 280, the receptacle 102 is lifted and lowered by the lifting and lowering unit 110. According to the present embodiment, since the terminals 288 that supply electric power are disposed in each of the stop zones 280, the battery 96 is charged even when the receptacle 102 is lifted and lowered. Therefore, a large amount of electric power consumed by the lifting and lowering unit 110 when the receptacle 102 is lifted and lowered can sufficiently be secured.

According to the present embodiment, the terminal 288 is also disposed in each wait zone 284. Consequently, even when the transport carriage 10 is positioned to wait in the wait zone 284, the battery 96 is charged. Therefore, the period of time during which the transport carriage 10 can operate is extended to increase the efficiency with which the transport carriage 10 transports a workpiece 11 or a board 31.

For moving a transport carriage 10 from a certain position (departure place) to another position (destination place) on the transport path 6, the transport system 2 operates, for example, as follows. First, the control unit 12 of the transport system 2 sends the transport carriage 10 that is to be moved, a signal representing a command for moving from the departure place to the destination place.

In response to the command from the control unit 12, the controller 130 of the transport carriage 10 determines a route from the departure place, which indicates its present position, to the destination place, and determines the number of second marks 286$b$ existing along the route from the departure place to each position where the transport carriage 10 is to turn, and the direction of the turn at each position where the transport carriage 10 is to turn. Then, the controller 130 of the transport carriage 10 controls the drive unit 90, etc., on the basis of the number of second marks 286$b$ and the direction of the turn that have been determined by itself.

For example, the controller 130 of the transport carriage 10 controls the transport carriage 10 to travel while monitoring the upper surface of the transport path 6 with the first sensors 122 and the second sensors 124. Specifically, the controller 130 controls the second sensors 124 to detect the second marks 286$b$ over which the second sensors 124 pass while controlling the transport carriage 10 to travel along the direction indicated by the first mark 286$a$ detected by the first sensors 122.

When the number of second marks 286$b$ detected by the second sensors 124 reaches the number of second marks 286$b$ determined by the controller 130, the controller 130 controls the transport carriage 10 to turn in the direction of the turn determined by the controller 130. Thereafter, the controller 130 controls the transport carriage 10 to travel again along the direction indicated by the first mark 286$a$. When the transport carriage 10 reaches the destination place, the controller 130 sends a signal indicating the arrival at the destination place, to the control unit 12.

For causing the transport carriage 10 to enter a stop zone 280, the controller 130 controls the second sensors 124 to detect the third marks 286$c$ and finely adjusts the direction in which the transport carriage 10 is to move ahead. The wheels 86 of the transport carriage 10 are thus prevented from dropping into the opening 282. At this time, the speed at which the transport carriage 10 travels should be lower than a speed at which the transport carriage 10 travels along the direction indicated by the first mark 286$a$. Thereafter, the controller 130 controls the first sensors 122 to detect the fourth mark 286$d$ and stops the transport carriage 10 in the stop zone 280.

The transport carriage 10 basically travels such that the wheels 86 are positioned forwardly in the direction in which the transport carriage 10 moves ahead, and that the wheels 88 are positioned rearwardly in the direction in which the transport carriage 10 moves ahead. However, when the transport carriage 10 moves from the stop zone 280 or the wait zone 284 into the travel zone 278, the transport carriage 10 travels such that the wheels 86 are positioned rearwardly in the direction in which the transport carriage 10 moves ahead, and that the wheels 88 are positioned forwardly in the direction in which the transport carriage 10 moves ahead.

When the transport carriage 10 stops in the stop zone 280, the receptacle 102 is positioned directly above the opening 282. In addition, the terminals 100 of the transport carriage 10 contact the terminals 288 on the transport path 6. The transport carriage 10 can thus lower the receptacle 102 and place the receptacle 102 in the rest area A positioned below the opening 282 while charging the battery 96.

In the above mode of operation, the controller 130 determines the number of second marks 286$b$ and the direction of the turn. However, the decisions made by the controller 130 may be held to a minimum. According to such a modification, for example, a signal including information regarding the number of second marks 286$b$ present from the departure place to each position where the transport carriage 10 is to turn and information regarding the direction of the turn at each position where the transport carriage 10 is to turn is sent from the control unit 12. In this operation, since the controller 130 is not required to determine the number of second marks 286$b$ and the direction of the turn, the controller 130 may be simplified.

Figure 34:
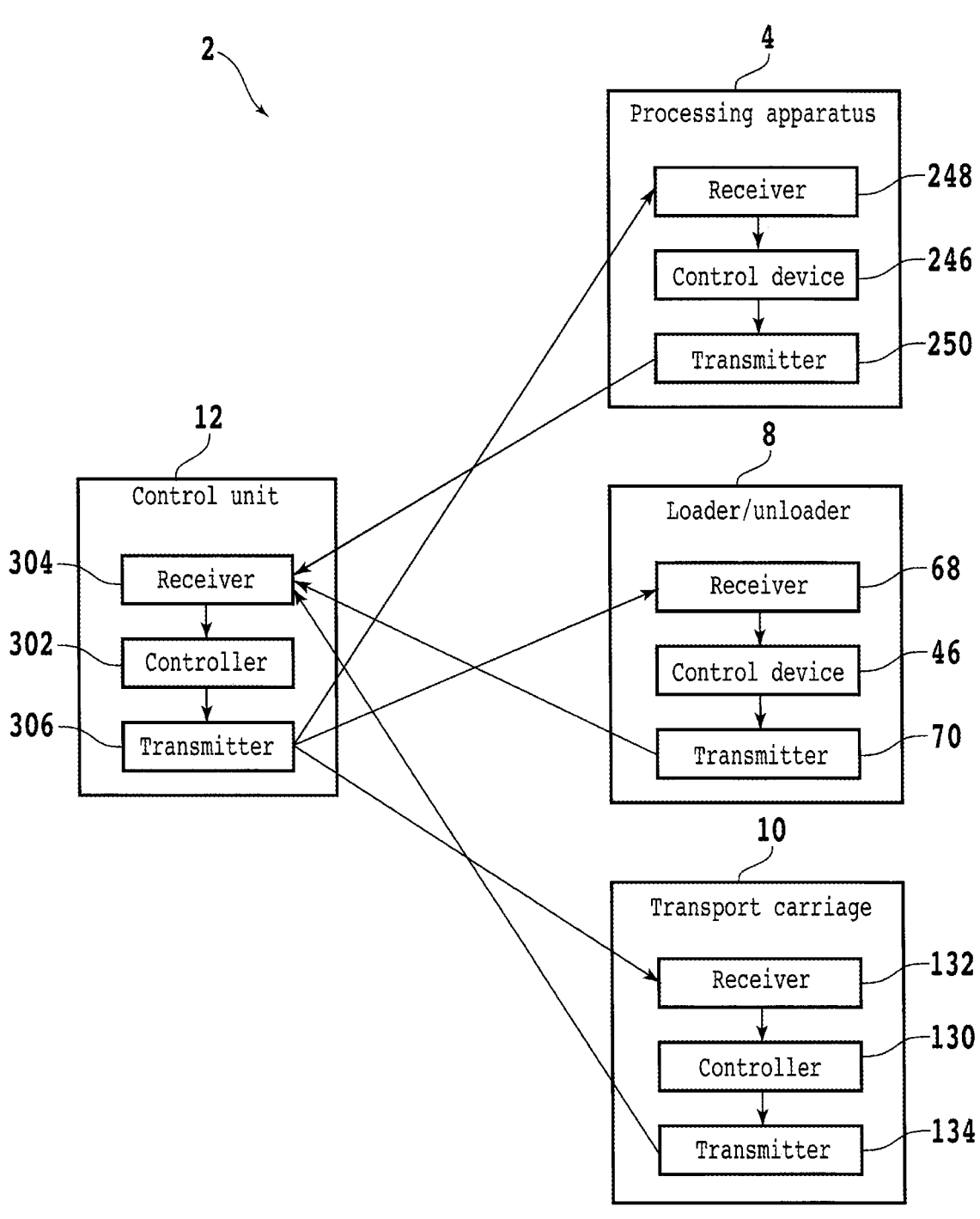
FIG. 34 is a diagram illustrating an example of a control step of controlling the transport system.

An example of a control step of controlling the transport system 2 according to the present embodiment will be described below. FIG. 34 illustrates a control step of controlling the transport system 2. In a situation where a workpiece 11 to be processed, etc., is newly required, the control device 246 of the processing apparatus 4 generates a signal for indicating the situation, (workpiece, etc., request signal). The signal (workpiece, etc., request signal) generated by the control device 246 is transmitted from the transmitter 250 to the control unit 12.

As illustrated in FIG. 34, the control unit 12 includes a controller (signal generator) 302 that generates signals to perform various control steps. The controller 302 is configured as a computer including, for example, a processor such as a CPU, a main storage unit such as a DRAM, and an auxiliary storage unit such as a flash memory. The processor, etc., is operated according to software stored in the auxiliary storage unit to realize functions of the controller 302.

To the controller 302, there are electrically connected a receiver 304 that receives signals from the processing apparatus 4, the loader/unloader 8, the transport carriage 10, etc., and a transmitter 306 that transmits signals to the processing apparatus 4, the loader/unloader 8, the transport carriage 10, etc.

When the receiver 304 of the control unit 12 receives a notification signal (workpiece, etc., request signal) transmitted from the transmitter 250 of the processing apparatus 4, the receiver 304 sends the received notification signal to the controller 302. When the controller 302 has confirmed the notification signal (workpiece, etc., request signal) from the processing apparatus 4, the controller 302 issues a command to any transport carriage 10 to move to the stop zone 280 directly above the loader/unloader 8 and place the receptacle 102 onto the upper surface of the rest base 66 of the loader/unloader 8 (second rest area A₂). Specifically, the controller 302 generates a control signal representing the command (first rest command signal) and transmits the generated control signal from the transmitter 306 to the transport carriage 10.

When the receiver 132 of the transport carriage 10 has received the control signal (first rest command signal) from the control unit 12, the receiver 132 sends the received control signal to the controller 130. The controller 130 controls the drive unit 90, etc., on the basis of the control signal (first rest command signal), to cause the transport carriage 10 to travel along the transport path 6. When the transport carriage 10 stops in the stop zone 280 directly above the loader/unloader 8, the receptacle 102 is positioned directly above the opening 282.

With the transport carriage 10 stopping in the stop zone 280, the controller 130 controls the lifting and lowering unit 110 to reel out the suspending members 112. The receptacle 102 is thus lowered to pass through the opening 282, etc., and is placed on the upper surface of the rest base 66.

After the receptacle 102 has been placed on the rest base 66, the controller 130 generates a notification signal (first rest completion signal) indicating that the placing of the receptacle 102 on the upper surface of the rest base 66 has been completed. The notification signal (first rest completion signal) generated by the controller 130 is transmitted from the transmitter 134 to the control unit 12.

When the receiver 304 of the control unit 12 has received the notification signal (first rest completion signal) transmitted from the transmitter 134 of the transport carriage 10, the receiver 304 sends the received notification signal to the controller 302. When the controller 302 has confirmed the notification signal (first rest completion signal) from the transport carriage 10, the controller 302 notifies the loader/unloader 8 of the completion of the placing of the receptacle 102 on the upper surface of the rest base 66. Specifically, the controller 302 generates a notification signal (second rest completion signal) indicating the completion of the placing of the receptacle 102 on the upper surface of the rest base 66, and transmits the generated notification signal from the transmitter 306 to the loader/unloader 8.

When the receiver 68 of the loader/unloader 8 has received the notification signal (second rest completion signal) from the control unit 12, the receiver 68 sends the received notification signal to the control device 46. When the control device 46 has received the notification signal (second rest completion signal), the control device 46 controls the various components to operate to load a workpiece 11 to be processed, etc., into the receptacle 102. If a processed workpiece 11, etc., has been stored in the receptacle 102, then the processed workpiece 11, etc., is unloaded from the receptacle 102, and thereafter, a workpiece 11 to be processed, etc., is loaded into the receptacle 102.

When a workpiece 11 to be processed, etc., has been loaded into the receptacle 102, the control device 46 generates a notification signal (first transport completion signal) indicating the completion of the loading of the workpiece 11, etc., into the receptacle 102. The notification signal (first transport completion signal) generated by the control device 46 is transmitted from the transmitter 70 to the control unit 12.

When the receiver 304 of the control unit 12 has received the notification signal (first transport completion signal) transmitted from the transmitter 70 of the loader/unloader 8, the receiver 304 sends the received notification signal to the controller 302. When the controller 302 has confirmed the notification signal (first transport completion signal) from the loader/unloader 8, the controller 302 sends a command to the transport carriage 10 to move to the stop zone 280 directly above the processing apparatus 4 and place the receptacle 102 onto the upper surface of the lifting and lowering table 204 of the processing apparatus 4 (second rest area A). Specifically, the controller 302 generates a control signal representing the command (second rest command signal) and transmits the generated control signal from the transmitter 306 to the transport carriage 10.

When the receiver 132 of the transport carriage 10 has received the control signal (second rest command signal) from the control unit 12, the receiver 132 sends the received control signal to the controller 130. In response to the control signal (second rest command signal), the controller 130 controls the lifting and lowering unit 110 to wind the suspending members 112. The receptacle 102 is thus lifted through the opening 282, etc., and stored in the storage area 104. Thereafter, the controller 130 controls the drive unit 90, etc., to cause the transport carriage 10 to travel along the transport path 6.

When the transport carriage 10 stops in the stop zone 280 directly above the processing apparatus 4, the receptacle 102 is positioned directly above the opening 282. With the transport carriage 10 stopping in the stop zone 280, the controller 130 controls the lifting and lowering unit 110 to reel out the suspending members 112. The receptacle 102 is thus lowered to pass through the opening 282, etc., and placed on the upper surface of the lifting and lowering table 204 of the processing apparatus 4.

After the receptacle 102 has been placed on the upper surface of the lifting and lowering table 204, the controller 130 generates a notification signal (third rest completion signal) indicating the completion of the placing of the receptacle 102 on the upper surface of the lifting and lowering table 204. The notification signal (third rest completion signal) generated by the controller 130 is transmitted from the transmitter 134 to the control unit 12.

When the receiver 304 of the control unit 12 has received the notification signal (third rest completion signal) transmitted from the transmitter 134 of the transport carriage 10, the receiver 304 sends the received notification signal to the controller 302. When the controller 302 has confirmed the notification signal (third rest completion signal) from the transport carriage 10, the controller 302 notifies the processing apparatus 4 of the completion of the placing of the receptacle 102 on the upper surface of the lifting and lowering table 204. Specifically, the controller 302 generates a notification signal (fourth rest completion signal) indicating the completion of the placing of the receptacle 102 on the upper surface of the lifting and lowering table 204, and transmits the generated notification signal from the transmitter 306 to the processing apparatus 4.

When the receiver 248 of the processing apparatus 4 has received the notification signal (fourth rest completion signal) from the control unit 12, the receiver 248 sends the received notification signal to the control device 246. When the control device 246 has received the notification signal (fourth rest completion signal), the control device 246 controls the various components to operate to unload a workpiece 11 to be processed, etc., from the receptacle 102. If a processed workpiece 11, etc., is present in the processing apparatus 4, then the workpiece 11 to be processed, etc., is unloaded from the receptacle 102, and thereafter, the processed workpiece 11, etc., is loaded into the receptacle 102.

When the workpiece 11 to be processed, etc., has been unloaded from the receptacle 102, for example, the control device 246 generates a notification signal (second transport completion signal) indicating the completion of the unloading of the workpiece 11, etc., from the receptacle 102. The notification signal (second transport completion signal) generated by the control device 246 is transmitted from the transmitter 250 to the control unit 12.

According to the processing sequence described above, a workpiece 11 to be processed, etc., that is housed in the loader/unloader 8 can be transported to any processing apparatus 4. The processing sequence for transporting a workpiece 11, etc., from the loader/unloader 8 to the processing apparatus 4 has mainly been described above. However, a workpiece 11, etc., may be transported from the processing apparatus 4 to the loader/unloader 8 according to a similar processing sequence.

The above processing sequence may be changed or modified in any way as long as workpieces 11, etc., can appropriately be transported. For example, a plurality of steps included in the above processing sequence may be carried out simultaneously, and may be switched around as long as the transportation of workpieces 11, etc., will not be impaired. Similarly, any step may be added, changed, or omitted as long as the transportation of workpieces 11, etc., will not be impaired.

As described above, the transport path 6, the loader/unloader (transport apparatus) 8, the transport carriage 10, the cassette storing mechanisms 24, and the lifting and lowering unit (lifting and lowering mechanism) 110 are each constructed for transporting workpieces 11 and boards 31 efficiently and safely. Therefore, workpieces 11 and boards 31 can be transported efficiently and safely by using the transport system 2 that incorporates those components.

Second Embodiment

Figure 35:
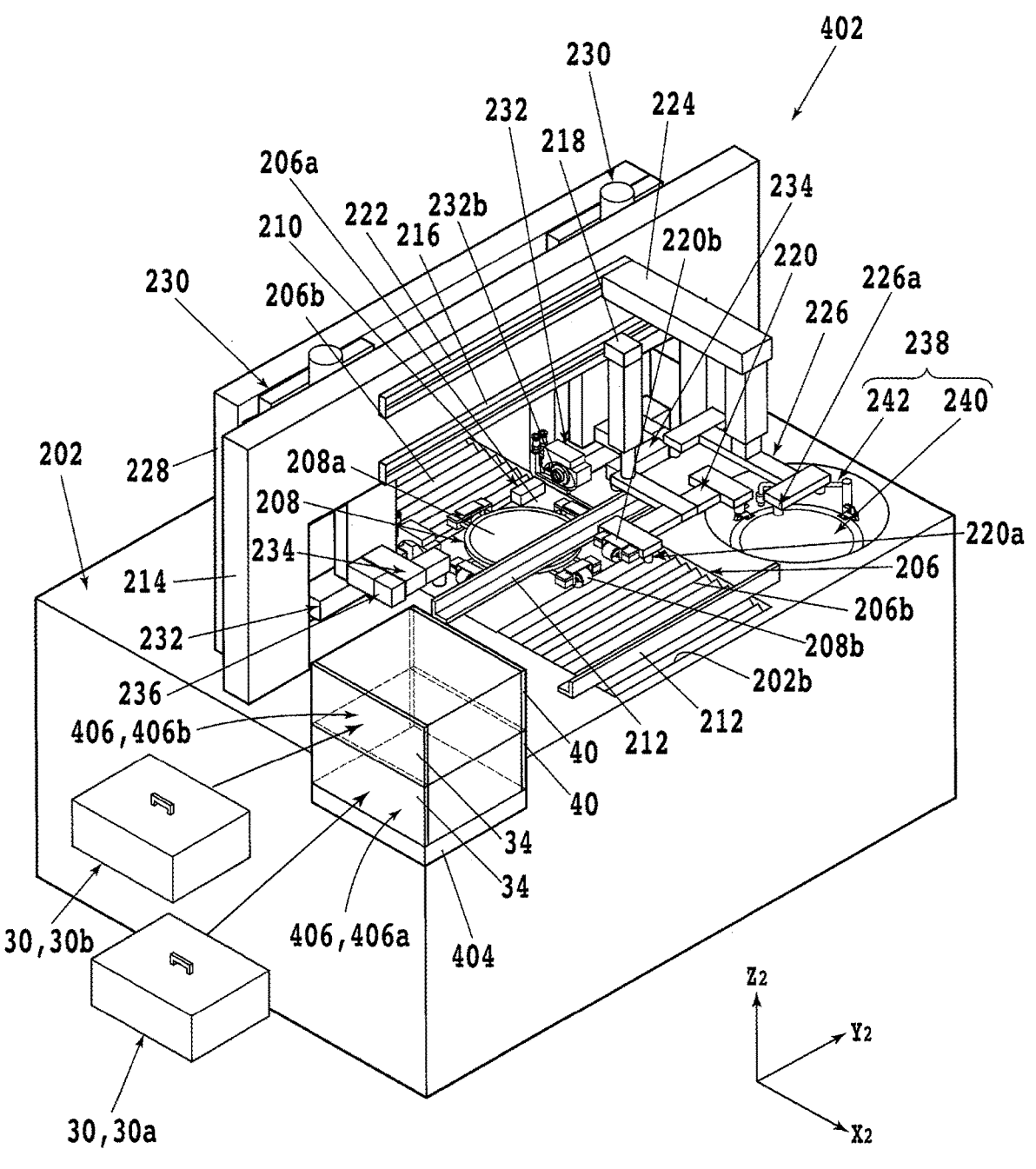
FIG. 35 is a perspective view of the internal structure of a processing apparatus (cutting apparatus) according to a second embodiment of the present invention.

According to a second embodiment, a processing apparatus (cutting apparatus) that is of a structure different from the first embodiment will described below. FIG. 35 illustrates, in perspective, the internal structure of a processing apparatus (cutting apparatus) 402 according to the second embodiment of the present invention. Those parts of the processing apparatus 402 that are identical to those according to the first embodiment are denoted by identical reference characters, and their description will be omitted below.

The processing apparatus 402 includes a lifting and lowering base 404 on which the receptacle 102 of a transport carriage 10 will not be placed. The lifting and lowering base 404 supports thereon two cassette storing mechanisms 406 (first cassette storing mechanism 406a and second cassette storing mechanism 406b) that are similar to the two cassette storing mechanisms 24 (i.e., the first cassette storing mechanism 24a and the second cassette storing mechanism 24b) of the loader/unloader 8 according to the first embodiment.

Cassettes 30 are loaded into the processing apparatus 402 according to the present embodiment. The processing apparatus 402 incorporates a movement limiting mechanism including a stopper 50 and a shaft mechanism 52. The movement limiting mechanism makes it easy to load and unload cassettes 30 that are relatively heavy, thereby reducing the risk of damage to the workpieces 11, etc., stored in the cassettes 30, as the cassettes 30 are loaded and unloaded. The cassette storing mechanisms 406 are easily made compact in the widthwise directions.

The processing apparatus 402 according to the present embodiment also incorporates a first safety mechanism and a second safety mechanism that limit access into the processing apparatus 4 from outside thereof. The first and second safety mechanisms are effective to prevent the operator from erroneously accessing movable components positioned in the processing apparatus 4 while those movable components are in operation.

The processing apparatus 402 according to the present embodiment may be independent of the transport system 2 described above. In other words, the processing apparatus 402 according to the present embodiment may not necessarily be connected to the transport system 2 described above.

Similarly to the cassette storing mechanisms 24 according to the first embodiment, the cassette storing mechanisms 406 according to the present embodiment are constructed for transporting workpieces 11, etc., efficiently and safely. Therefore, workpieces 11, etc., can be transported efficiently and safely by using the processing apparatus 402 that incorporates those components.

The structures and steps according to the above embodiments and modifications thereof can be changed and modified appropriately without departing from the scope of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus comprising:
a cutting unit having a spindle with a cutting blade mounted on the spindle;
a chuck table having a holding surface used for holding either a workpiece unit that includes a plate-shaped workpiece supported on an annular frame by a tape or a tray shaped similarly to the annular frame, wherein the holding surface is connected to a suction source such that the suction source is configured and arranged to apply a negative pressure to the holding surface to hold either the workpiece unit or the tray thereon;

a processing feed unit that has a drive source and moves the chuck table along a processing feed direction;

an indexing feed unit that has a drive source and moves the cutting unit along an indexing feed direction perpendicular to the processing feed direction;

a rest area used for placing a receptacle that houses the workpiece unit or the tray;

a transport unit configured to transport the workpiece unit or the tray between the rest area and the chuck table, the transport unit having a first holding pad that holds the workpiece unit or the tray;

a sub-chuck table that is disposed sideways of the chuck table and that includes a holding surface that is at a height different than the holding surface of the chuck table, and wherein the holding surface of the sub-chuck table is used for holding a board for use in adjusting the cutting unit; and a board transport unit configured to transport the board between the tray held on the chuck table and the sub-chuck table, wherein the board transport unit includes:

a second holding pad that holds the board, and an air-driven actuator that is supported, together with the cutting unit, on the indexing feed unit and moves the second holding pad, between a position where the second holding pad contacts the board held by the sub-chuck table and a position above the holding surface of the chuck table and the holding surface of the sub-chuck table, along a direction perpendicular to the processing feed direction and the indexing feed direction.

2. The cutting apparatus according to claim 1, further comprising:

a tray storage area disposed below the rest area and used for storing the tray, wherein the transport unit transports the tray between the tray storage area and the chuck table.

3. The cutting apparatus according to claim 1, wherein the board comprises a dressing board.

4. The cutting apparatus according to claim 3, wherein the dressing board is made of abrasive grains bound together by a binding agent.

5. The cutting apparatus according to claim 4, wherein the abrasive grains comprise white alundum.

6. The cutting apparatus according to claim 4, wherein the abrasive grains comprise green carborundum.

7. The cutting apparatus according to claim 4, wherein the binding agent comprises resin.

8. The cutting apparatus according to claim 4, wherein the binding agent comprises ceramic.

9. The cutting apparatus according to claim 1, wherein the rest area comprises an upper surface of a lifting table, and wherein the cutting apparatus further comprises:

the lifting table is configured and arranged to be raised and lowered; and a tray storage area disposed below the rest area defined by the upper surface of the lifting table, and wherein the tray storage area is configured and arranged for storing the tray, and further wherein the transport unit transports the tray between the tray storage area and the chuck table.

* * * * *